(12) United States Patent
Gotoh et al.

(10) Patent No.: US 9,268,451 B2
(45) Date of Patent: Feb. 23, 2016

(54) TRANSFER FILM, MANUFACTURING METHOD OF CAPACITIVE INPUT DEVICE, CAPACITIVE INPUT DEVICE, AND IMAGE DISPLAY DEVICE INCLUDING THE SAME

(71) Applicant: FUJIFILM Corporation, Tokyo (JP)

(72) Inventors: Hidenori Gotoh, Fujinomiya (JP); Takashi Aridomi, Fujinomiya (JP)

(73) Assignee: FUJIFILM Corporation, Tokyo (JP)

( * ) Notice: Subject to any disclaimer, the term of this patent is extended or adjusted under 35 U.S.C. 154(b) by 0 days.

(21) Appl. No.: 14/564,421

(22) Filed: Dec. 9, 2014

(65) Prior Publication Data

US 2015/0092123 A1    Apr. 2, 2015

Related U.S. Application Data

(63) Continuation of application No. PCT/JP2013/066248, filed on Jun. 12, 2013.

(30) Foreign Application Priority Data

Jun. 20, 2012  (JP) .................................. 2012-138879
Jan. 11, 2013  (JP) .................................. 2013-003826

(51) Int. Cl.
*G06F 3/041* (2006.01)
*G06F 3/044* (2006.01)
(Continued)

(52) U.S. Cl.
CPC ............... *G06F 3/044* (2013.01); *B32B 3/266* (2013.01); *B32B 27/08* (2013.01); *B32B 27/18* (2013.01); *B32B 27/20* (2013.01); *B32B 27/36* (2013.01); *C08K 9/02* (2013.01); *C09D 7/1225* (2013.01); *C09D 183/04* (2013.01); *H03K 17/9622* (2013.01); *B32B 2255/10* (2013.01);

(Continued)

(58) Field of Classification Search
CPC ..... G06F 3/041; G06F 3/044; H03K 17/9622; H03K 17/9629; H03K 2217/960755; H03K 2217/960765; H03K 2017/9613; C09D 183/04; C09D 183/06; C09D 183/08; C08K 9/02; Y10T 429/49155; Y10T 428/31663; Y10T 428/10; Y10T 428/1036; Y10T 428/1041; Y10T 29/49155
USPC .................... 428/1.1, 1, 3, 1.31, 447; 349/12; 29/622; 345/173; 524/430, 588
See application file for complete search history.

(56) References Cited

U.S. PATENT DOCUMENTS

2005/0234167 A1   10/2005   Bae et al.
2007/0165006 A1    7/2007   Sato et al.
(Continued)

FOREIGN PATENT DOCUMENTS

CN      1680207 A     10/2005
JP     10158594 A      6/1998
(Continued)

OTHER PUBLICATIONS

International Search Report for PCT/JP2013/066248 dated Jul. 9, 2013.
(Continued)

*Primary Examiner* — Ruiyun Zhang
(74) *Attorney, Agent, or Firm* — Sughrue Mion, PLLC

(57) ABSTRACT

The transfer film of the present invention has a temporary support and a colored layer, and the colored layer contains at least (A) a white inorganic pigment and (B) a silicone-based resin.

27 Claims, 13 Drawing Sheets

(51) Int. Cl.
*B32B 27/20* (2006.01)
*C08K 9/02* (2006.01)
*C09D 7/12* (2006.01)
*C09D 183/04* (2006.01)
*H03K 17/96* (2006.01)
*B32B 27/08* (2006.01)
*B32B 27/18* (2006.01)
*B32B 27/36* (2006.01)
*B32B 3/26* (2006.01)

(52) U.S. Cl.
CPC ....... *B32B2255/26* (2013.01); *B32B 2264/105* (2013.01); *B32B 2307/202* (2013.01); *B32B 2307/402* (2013.01); *B32B 2307/4026* (2013.01); *B32B 2307/412* (2013.01); *B32B 2457/00* (2013.01); *G06F 2203/04103* (2013.01); *H03K 2017/9613* (2013.01); *H03K 2217/960755* (2013.01); *H03K 2217/960765* (2013.01); *Y10T 29/49105* (2015.01); *Y10T 428/1036* (2015.01); *Y10T 428/264* (2015.01); *Y10T 428/31663* (2015.04)

(56) References Cited

U.S. PATENT DOCUMENTS

2008/0309635 A1 12/2008 Matsuo
2013/0141386 A1 6/2013 Liu et al.
2013/0209816 A1 8/2013 Kobayashi et al.

FOREIGN PATENT DOCUMENTS

| JP | 2003220672 A | 8/2003 |
| JP | 2005-271229 A | 10/2005 |
| JP | 2006-259138 A | 9/2006 |
| JP | 2007-122326 A | 5/2007 |
| JP | 2008-169237 A | 7/2008 |
| JP | 2009-193587 A | 8/2009 |
| JP | 4506785 B2 | 7/2010 |
| JP | 2011-218561 A | 11/2011 |
| WO | 2011/089975 A1 | 7/2011 |
| WO | 2011145599 A1 | 11/2011 |

OTHER PUBLICATIONS

Written Opinion for PCT/JP2013/066248 dated Jul. 9, 2013.
International Preliminary Report on Patentability and Written Opinion, dated Dec. 23, 2014, issued in corresponding International Application No. PCT/JP2013/066248, 5 pages in English.
First Notice of Opinion on Examination, dated Jul. 30, 2015, issued in corresponding CN Application No. 201380026481.7, 22 pages in English and Chinese.
Notice of Reasons for Rejection, mailed Jul. 7, 2015, issued in corresponding JP Application No. 2013-003826, 22 pages in English and Japanese.

TRANSFER FILM, MANUFACTURING METHOD OF CAPACITIVE INPUT DEVICE, CAPACITIVE INPUT DEVICE, AND IMAGE DISPLAY DEVICE INCLUDING THE SAME

CROSS-REFERENCE TO RELATED APPLICATIONS

This application is a Continuation of PCT International Application No. PCT/JP2013/066248 filed on Jun. 12, 2013, which claims priority under 35 U.S.C §119(a) to Japanese Patent Application No. 2012-138879 filed on Jun. 20, 2012 and Japanese Patent Application No. 2013-003826 filed on Jan. 11, 2013. Each of the above application(s) is hereby expressly incorporated by reference, in its entirety, into the present application.

BACKGROUND OF THE INVENTION

1. Field of the Invention

The present invention relates to a decorative transfer film for manufacturing a capacitive input device that can detect the contact position of a finger by detecting the change in capacitance, a manufacturing method of a capacitive input device, a capacitive input device obtained by the manufacturing method, and an image display device including the capacitive input device as a constituent.

2. Description of the Related Art

In recent years, in some electronic instruments such as cellular phones, car navigations, personal computers, ticket vending machines, and banking terminals, a tablet-type input device has been mounted on the surface of a liquid crystal device or the like. When an instruction image is displayed on an image display area of the liquid crystal device, a user touches the site displaying the instruction image with a finger, a stylus, or the like with reference to the instruction image, and in this manner, information corresponding to the instruction image can be input.

Such an input device (touch panel) includes a resistive film-type input device, a capacitive input device, and the like. However, having a double-sheet structure consisting of a film and glass in which a short circuit is caused by pushing down the film, the resistive input device has defects such as a narrow range of operation temperature and vulnerability to temporal change.

In contrast, the capacitive input device has an advantage that it can be prepared simply by forming a translucent conductive film on a sheet of substrate. Such a capacitive input device includes, for example, a type of input device which has electrode patterns extending in directions crossing each other, and detects an input position by detecting the change in capacitance between the electrodes when a finger or the like comes into contact with the device (for examples, see JP2007-122326A).

The capacitive input device also includes a type of input device in which alternating currents of the same phase and same potential are applied to both ends of a translucent conductive film so as to make the device detect an input position by detecting the flow of weak currents caused by a capacitor formed when a finger comes into contact with or approaches the device. Regarding this type of capacitive input device, there is a disclosure of a capacitive input device including a plurality of first transparent electrode patterns, in which a plurality of pad portions connected to one another through connection portions extends in a first direction, and a plurality of second transparent electrode patterns which is electrically insulated from the first transparent electrode patterns by an interlayer insulating layer and is composed of a plurality of pad portions extending in a direction crossing the first direction (for examples, see JP4506785B). However, since a front panel is laminated on the prepared capacitive input device described above, the capacitive input device has problems in that it is thick and heavy.

Furthermore, there is a disclosure regarding a capacitive touch panel in which a mask layer, a sense circuit, and an interlayer insulating layer are integrally formed on the surface of a non-contact side of a front panel (for example, see JP2009-193587A). In the capacitive touch panel disclosed in JP2009-193587A, the front panel is integrated with the capacitive input device. Consequentially, a thin-layer/light-weight capacitive touch panel can be obtained, and since the sense circuit is covered up with the mask layer, the external appearance of the device is improved.

SUMMARY OF THE INVENTION

Although JP2009-193587A merely describes that the mask layer may be formed of a black resin or other opaque coating materials, decorative layers of various shades (black, white, pastel colors, metallic colors, and the like) can be disposed as necessary between the mask layer and the front panel. In recent years, among those decorative layers, particularly, a white decorative layer has been required to be improved in terms of brightness and whiteness.

Conventionally, as methods for disposing the decorative layers, liquid resist coating, screen printing, and the like are mainly used.

Meanwhile, regarding smartphones or tablet PCs having a capacitive touch panel on a liquid crystal or organic EL display, those using toughened glass represented by Gorilla Glass of Corning Incorporated. as the front panel (surface that comes into direct contact with a finger) are being developed and released.

As a result of examination, the present inventors found that when an attempt is made to form a white decorative layer on the toughened glass substrate by using a liquid resist for forming a decorative layer or a screen printing ink, in order to form a white decorative layer by using a liquid resist or a screen printing ink with small hiding power, coating of the liquid resist and screen printing need to be performed several times in divided steps, and this leads to problems such as formation of bubbles and unevenness, decrease in yield resulting from the large number of steps, and difficulty in reducing cost. The inventors also found that after the decorative layer is formed on the toughened glass, if the resultant is heated in a step for preparing a circuit such as a transparent conductive layer, this leads to a problem such as decrease in whiteness.

As a solution to these problems, a multilayer film, in which as a white film having strong heat resistance, a layer composed of a white thermosetting resin composition containing at least (A) a thermosetting resin that substantially does not contain silicon in a molecule and (B) a white colorant is disposed on at least one surface of a polyimide film, has been suggested (for examples, see JP2011-218561A). However, this film also has a problem in that the whiteness thereof is reduced when it is heated at a high temperature in the step for preparing a circuit such as a transparent conductive layer.

Moreover, as a film having strong heat resistance, a white polyimide film, which is obtained by imidizing a polyimide precursor film prepared by mixing a white pigment with a polyamic acid obtained by reacting a diamine with an aromatic tetracarboxylic acid, has been suggested (for example, see JP2008-169237A). However, this film also has a problem in that the whiteness thereof is reduced when it is heated at a high temperature in the step for preparing a circuit such as a transparent conductive layer.

As described above, as a result of examination, the present inventors found that when a white decorative layer is formed by the methods described in the above documents, a white decorative layer, which has performance satisfying all of the characteristics including brightness, whiteness, reticulation, and adhesiveness after transfer, cannot be obtained. Moreover, they found that it is difficult to obtain a white decorative layer satisfying the above characteristics with a high yield.

An object of the present invention is to provide a transfer film which makes it possible to obtain a white decorative layer, which is excellent in brightness, whiteness, reticulation, and adhesiveness after transfer with a high yield.

Other objects of the present invention are to provide a manufacturing method of a capacitive input device that makes it possible to manufacture a high-quality capacitive input device, which uses a transfer film satisfying the aforementioned characteristics and can be made into a thin-layer/light-weight capacitive input device, by simple steps, to provide a capacitive input device that is obtained by the manufacturing method, and to provide an image display device that uses the capacitive input device.

As a result of further repeating the examination regarding the whiteness of a white decorative layer, the present inventors found that after a white decorative layer is formed, in order to form transparent electrode patterns formed of ITO or the like, the layer needs to be heated at a high temperature, and at this time, the whiteness of the white decorative layer is markedly reduced. The present inventors also found that if a transfer film in which a silicone-based resin is used for a colored layer is used, a white decorative layer excellent in brightness, whiteness, reticulation, and adhesiveness after transfer can be obtained with a high yield. Based on the finding, the present inventors completed the present invention.

As specific means for achieving the aforementioned objects, the present invention includes the following.

[1] A transfer film including a temporary support and a colored layer, in which the colored layer contains at least (A) a white inorganic pigment and (B) a silicone-based resin.

[2] In the transfer film described in [1], the colored layer preferably further contains (C) an antioxidant.

[3] In the transfer film described in [1] or [2], the silicone-based resin preferably includes either a modified silicone resin or a straight silicone resin which contains at least a siloxane structure represented by the following Formula (1) in a molecule, Formula (1)

[Chem. 1]

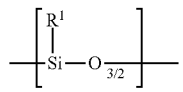

(wherein $R^1$ independently represents a hydrogen atom, a halogen atom, a linear, branched, or cyclic alkoxy group having 1 to 20 carbon atoms, a linear, branched, or cyclic alkyl group having 1 to 20 carbon atoms, a linear, branched, or cyclic substituted alkyl group having 1 to 20 carbon atoms, a linear, branched, or cyclic alkenyl group having 2 to 20 carbon atoms, an aryl group having 6 to 20 carbon atoms, or an aralkyl group having 7 to 20 carbon atoms).

[4] In the transfer film described in [3], it is preferable that $R^1$ in the Formula (1) independently represent a hydrogen atom, a linear, branched, or cyclic alkyl group having 1 to 20 carbon atoms, a linear, branched, or cyclic substituted alkyl group having 1 to 6 carbon atoms, or an aryl group having 6 to 9 carbon atoms.

[5] In the transfer film described in [3], it is preferable that $R^1$ in the Formula (1) independently represent a hydrogen atom, a methyl group, or a tolyl group.

[6] In the transfer film described in any one of [1] to [5], the thickness of the colored layer is preferably 1 μm to 40 μm.

[7] In the transfer film described in any one of [1] to [6], the content of the white inorganic pigment with respect to the total solid content of the colored layer is preferably 20% by mass to 75% by mass.

[8] In the transfer film described in any one of [1] to [7], the white inorganic pigment is preferably a rutile-type titanium oxide of which the surface has been treated with an inorganic substance.

[9] In the transfer film described in [8], the rutile-type titanium oxide is preferably a rutile-type titanium oxide of which the surface has been treated with at least either alumina or zirconia.

[10] The transfer film described in any one of [1] to [9] preferably further includes a thermoplastic resin layer between the temporary support and the colored layer.

[11] A manufacturing method of a capacitive input device which includes a front panel and at least the following elements (1) and (3) to (5) at one side (a non-contact side) of the front panel, the method including a step of forming at least the (1) decorative layer by transferring the colored layer of the transfer film described in any one of [1] to [10] to the one side of the front panel, (1) a decorative layer, (3) a plurality of first transparent electrode patterns composed of a plurality of pad portions being so connected to one another through connection portions as to extend in a first direction, (4) a plurality of second electrode patterns electrically insulated from the first transparent electrode patterns and composed of a plurality of pad portions being so connected to one another as to extend in a direction crossing the first direction, and (5) an insulating layer that electrically insulates the first transparent electrode patterns from the second electrode patterns.

[12] In the manufacturing method of a capacitive input device described in [11], the capacitive input device preferably further includes (6) a conductive element which is electrically connected to at least either the first transparent electrode patterns or the second electrode patterns and is different from the first transparent electrode patterns and the second electrode patterns.

[13] In the manufacturing method of a capacitive input device described in [11] or [12], the second electrode patterns are preferably transparent electrode patterns.

[14] In the manufacturing method of a capacitive input device described in any one of [11] to [13], the (1) decorative layer is preferably formed by heating the colored layer of the transfer film described in any one of [1] to [10] at 180° C. to 300° C. in an environment of 0.08 atm to 1.2 atm.

[15] In the manufacturing method of a capacitive input device described in [14], the colored layer is preferably heated in an air environment.

[16] The manufacturing method of a capacitive input device described in any one of [11] to [15] preferably includes a step of making cuts, which penetrate the colored layer but do not penetrate the temporary support, in a portion of the transfer film, a step of removing the colored layer in at least a portion of the area surrounded by the cuts, and a step of forming the (1) decorative layer by using the transfer film from which the colored layer in a portion of the area has been removed.

[17] In the manufacturing method of a capacitive input device described in any one of [11] to [16], (2) a mask layer is preferably further disposed on the surface of the (1) decorative layer opposite to the front panel side.

[18] In the manufacturing method of a capacitive input device described in [17], at least either the first transparent electrode patterns or the second electrode patterns are preferably disposed over the areas of both the one side surface of the front panel and the surface of the mask layer opposite to the front panel side.

[19] In the manufacturing method of a capacitive input device described in [17] or [18], the capacitive input device further includes (6) a conductive element which is electrically connected to at least either the first transparent electrode patterns or the second electrode patterns and is different from the first transparent electrode patterns and the second electrode patterns, and the (6) conductive element is preferably disposed on at least the surface of the mask layer opposite to the front panel side.

[20] In the manufacturing method of a capacitive input device described in any one of [11] to [19], a transparent protective layer is preferably further disposed so as to cover all or a portion of the elements (1) and (3) to (5).

[21] In the manufacturing method of a capacitive input device described in [20], the transparent protective layer is preferably formed by using a transfer film having a temporary support and a curable resin layer in this order.

[22] In the manufacturing method of a capacitive input device described in any one of [11] to [21], the capacitive input device preferably further includes (6) a conductive element which is electrically connected to at least either the first transparent electrode patterns or the second electrode patterns and is different from the first transparent electrode patterns and the second electrode patterns, the second electrode patterns are preferably transparent electrode patterns, and at least one of the (3) first transparent electrode patterns, the (4) second electrode patterns, and the (6) conductive element is preferably formed by performing etching treatment on a transparent conductive material by using an etching pattern formed by using a transfer film having a temporary support and a curable resin layer in this order.

[23] In the manufacturing method of a capacitive input device described in any one of [11] to [22], the capacitive input device further includes (6) a conductive element which is electrically connected to at least either the first transparent electrode patterns or the second electrode patterns and is different from the first transparent electrode patterns and the second electrode patterns, the second electrode patterns are preferably transparent electrode patterns, and at least one of the (3) first transparent electrode patterns, the (4) second electrode patterns, and the (6) conductive element is preferably formed by transferring a conductive curable resin layer of a transfer film having a temporary support and the conductive curable resin layer in this order.

[24] In the manufacturing method of a capacitive input device described in any one of [11] to [23], the one side (non-contact) surface of the front panel is preferably subjected to surface treatment, and the transfer film is preferably disposed on the one side (non-contact) surface of the front panel having undergone the surface treatment.

[25] In the manufacturing method of a capacitive input device described in [24], a silane compound is preferably used for the surface treatment of the front panel.

[26] In the manufacturing method of a capacitive input device described in any one of [11] to [25], the front panel preferably has an opening portion in at least a portion thereof.

[27] A capacitive input device manufactured by the manufacturing method of a capacitive input device described in any one of [11] to [26].

[28] An image display device including the capacitive input device described in [27] as a constituent.

The present invention can provide a transfer film, which makes it possible to obtain a white decorative layer excellent in brightness, whiteness, reticulation, and adhesiveness after transfer with a high yield.

The present invention can also provide a manufacturing method of a capacitive input device that makes it possible to manufacture a high-quality capacitive input device, which uses the transfer film satisfying the aforementioned characteristics and can be made into a thin-layer/lightweight capacitive input device, by simple steps; a capacitive input device that is obtained by the manufacturing method; and an image display device that uses the capacitive input device.

DESCRIPTION OF THE PREFERRED EMBODIMENTS

Figure 1:
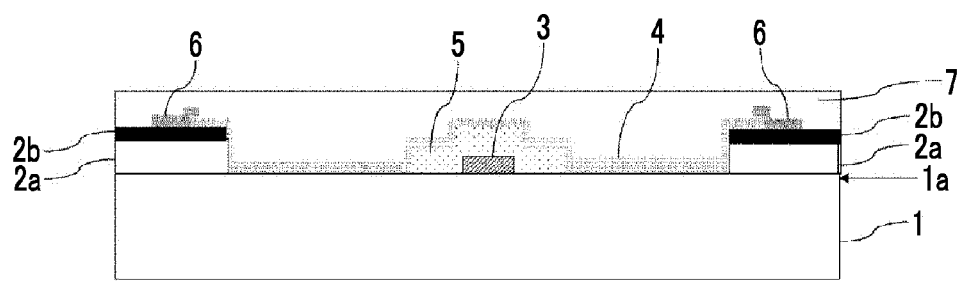
FIG. 1 is a cross-sectional view showing the constitution of a capacitive input device of the present invention.

Hereinafter, a transfer film, a manufacturing method of a capacitive input device, a capacitive input device, and an image display device of the present invention will be described.

The following constituents will be described based on representative embodiments of the present invention, but the present invention is not limited to the embodiments. Moreover, in the specification of the present application, "to" is used to describe a range which includes numerical values listed before and after "to" as the lower limit and upper limit respectively.

[Transfer Film]

The transfer film of the present invention has a temporary support and a colored layer, and the colored layer contains at least (A) a white inorganic pigment and (B) a silicone-based resin.

Having such a constitution, the transfer film of the present invention makes it possible to obtain a white decorative layer, which is excellent in brightness, whiteness, reticulation, and adhesiveness after transfer, with a high yield.

The transfer film of the present invention has a temporary support and a colored layer. Moreover, the transfer film may further have a thermoplastic resin layer between the temporary support and the colored layer.

<Temporary Support>

As the temporary support, it is possible to use materials that have flexibility and do not undergo serious deformation, shrinkage, and stretching even being under pressure or being heated under pressure. Examples of such supports include polyethylene terephthalate films, cellulose triacetate films, polystyrene films, polycarbonate films, and the like. Among these, a biaxially oriented polyethylene terephthalate film is particularly preferable.

The thickness of the temporary support is not particularly limited and is generally within a range of 5 μm to 200 μm. In terms of ease of handleability, versatility, and the like, the thickness is particularly preferably within a range of 10 μm to 150 μm.

Furthermore, the temporary support may be transparent or may contain silicon in the dye form, an alumina sol, chrome salts, zirconium salts, and the like.

In addition, conductivity can be added to the temporary support by the method described in JP2005-221762A and the like.

<Colored Layer>

(Composition)

In the transfer film of the present invention, the colored layer contains at least (A) a white inorganic pigment and (B) a silicone-based resin.

—(A) White Inorganic Pigment—

As the white inorganic pigment used in the colored layer, it is possible to use the white pigments described in paragraph <0019> of JP2009-191118A or in paragraph <0109> of JP2000-175718A Specifically, in the present invention, as the white inorganic pigment, a titanium oxide (rutile type), a titanium oxide (anatase type), a zinc oxide, lithopone, precipitated calcium carbonate, white carbon, aluminum oxide, aluminum hydroxide, and barium sulfate are preferable; a titanium oxide (rutile type), a titanium oxide (anatase type), and a zinc oxide are more preferable; a titanium oxide (rutile type) and a titanium oxide (anatase type) are even more preferable; and a rutile-type titanium oxide is still more preferable.

Specific examples of titanium dioxides include JR, JRNC, JR-301, 403, 405, 600A, 605, 600E, 603, 701, 800, 805, and 806, JA-1, C, 3, 4, and 5, MT-01, 02, 03, 04, 05, 100AQ, 100SA, 100SAK, 100SAS, 100TV, 100Z, 100ZR, 150W, 500B, 500H, 500SA, 500SAK, 500SAS, and 500T, and SMT-100SAM, 100SAS, 500SAM, and 500SAS (manufactured by TAYCA); CR-50, 50-2, 57, 58, 58-2, 60, 60-2, 63, 67, 80, 85, 90, 90-2, 93, 95, 97, and 953, Super 70, PC-3, PF-690, 691, 711, 736, 737, 739, 740, and 742, R-550, 580, 630, 670, 680, 780, 780-2, 820, 830, 850, 855, 930, and 980, S-305, UT771, TTO-51(A), 51(C), 55(A), 55(B), 55(C), and 55(D), S-1, S-2, S-3, S-4, V-3, V-4, MPT-136, and FTL-100, 110, 200, and 300 (manufactured by ISHIHARA SANGYO KAISHA, LTD.); KA-10, 15, 20, and 30, KR-310 and 380, KV-200, STT-30EHJ, 65C-S, 455, 485SA15, 495M, and 495MC (manufactured by Titan Kogyo, Ltd.); TA-100, 200, 300, 400, and 500, and TR-600, 700, 750, 840, and 900 (manufactured by FUJI TITANIUM INDUSTRY CO., LTD.); and the like. One kind of these pigments may be used singly, or a plurality of these may be used by being mixed with each other.

In the present invention, the surface of the white inorganic pigment (particularly, titanium oxide) can be treated with silica, alumina, titania, zirconia, or an organic substance or can be treated with a combination of these.

If the surface is treated as above, catalytic activity of the white inorganic pigment (particularly, a titanium oxide) can be inhibited, and heat resistance, fading properties, and the like can be improved.

From the viewpoint of the whiteness of the decorative layer having undergone heating, the white pigment in the present invention is preferably a rutile-type titanium oxide of which the surface has been treated with an inorganic substance, more preferably a rutile-type titanium oxide of which the surface has been treated with at least one of the alumina and zirconia, and particularly preferably a rutile-type titanium oxide of which the surface has been treated with a combination of alumina and zirconia.

From the viewpoint of forming a decorative layer which is excellent in brightness and whiteness and also satisfies other required characteristics, the content of the white inorganic pigment with respect to the total solid content of the colored layer is preferably 20% by mass to 75% by mass. Furthermore, from the viewpoint of sufficiently shortening the time taken for development when the transfer film of the present invention is used in the manufacturing method of a capacitive input device of the present invention that will be described later, the content of the white inorganic pigment with respect to the total solid content of the decorative layer is preferably 20% by mass to 75% by mass.

The content of the white inorganic pigment with respect to the total solid content of the colored layer is more preferably 25% by mass to 60% by mass, and even more preferably 30% by mass to 50% by mass.

In the present specification, the "total solid content" refers to the total mass of nonvolatile components of the colored layer excluding a solvent and the like.

The white inorganic pigment is desirably used in the form of dispersion (other colorants used in the mask layer, which will be described later, are also desirably used in the form of dispersion). The dispersion can be prepared by adding a composition, which is obtained by premixing the white inorganic pigment with a pigment dispersant, to an organic solvent (or vehicle), which will be described later, and dispersing the resultant. The "vehicle" refers to the fraction of medium, in which a pigment has dispersed, in a coating material staying in liquid form. The vehicle includes a component (binder)

which is in liquid form and forms a coating film by binding the pigment and a component (organic solvent) which dissolves and dilutes the binder.

A disperser used for dispersing the white inorganic pigment is not particularly limited, and examples thereof include known dispersers such as a kneader, a roll mill, an attritor, a super mill, a dissolver, a homomixer, and a sand mill described on page 438 of "Dictionary of Pigments", Kunizo Asakura, 1st edition, Asakura Publishing Co., Ltd., 2000. Furthermore, the white inorganic pigment may be finely pulverized by means of mechanical grinding described on page 310 of the same document by using frictional force.

From the viewpoint of dispersion stability and hiding power, the average particle size of primary particles of a white inorganic pigment as the white inorganic pigment (colorant for forming a decorative layer) used in the present invention is preferably 0.16 μm to 0.3 μm, more preferably 0.18 μm to 0.27 μm, and particularly preferably 0.19 μm to 0.25 μm. If the average particle size of primary particles is 0.16 μm, the hiding power sharply decreases, and consequentially, the base of the mask layer is easily seen, or the viscosity increases in some cases. In contrast, if it exceeds 0.3 μm, the whiteness decreases, the hiding power sharply decreases, and the shape of surface formed by coating of the pigment deteriorates.

Herein, the "average particle size of primary particles" refers to the diameter obtained when electron microscope images of the particles are converted into circles having the same area. Furthermore, the "number average particle size" refers to a value determined by measuring the particle size of a large number of particles and calculating the average of 100 particles.

Meanwhile, in order to measure the average particle size of particles in a dispersion or a coating solution, the laser-scattering HORIBA H (manufactured by Horiba Advanced Techno Co., Ltd.) can be used.

—(B) Silicone-Based Resin—

As the silicone-based resin, known silicone-based resins can be used.

The silicone-based resins can be classified into a modified silicone resin, which is obtained by partially modifying a resin by using the following silane compound so as to add various characteristics to the resin, and straight silicone, which is obtained by dehydrating and condensing a silane compound having an alkoxy group or a silanol group so as to utilize the properties unique to silicone. The silicone-based resin in the transfer film of the present invention preferably contains the modified silicone resin and/or the straight silicone resin which includes at least a siloxane structure represented by the following Formula (1) in a molecule.

As the modified silicone resin, it is possible to use an acrylic resin-modified silicone resin (KR9706 manufactured by Shin-Etsu Chemical Co., Ltd.) that is obtained by polymerizing a monomer generated by reacting an acryl monomer such as acrylic acid with a silane compound or obtained by copolymerizing the monomer with other acryl monomers; a polyester resin-modified silicone resin that is obtained by reacting a hydroxyl group and the like of polyester with a silane compound; an epoxy resin-modified silicone resin that is obtained by reacting an amino group residue and the like of a resin with an epoxy-containing silane compound; an alkyd resin-modified silicone resin that is obtained by modifying an alkyd resin with a reactive silane compound in the same manner as above; a rubber-based silicone resin that is to be caused to directly form a covalent bond with a resin by using an oxime-based initiator; and the like.

As the straight silicone, it is possible to use silicone which contains at least a siloxane structure represented by the following Formula (1) in a molecule.

Formula (1)

[Chem. 2]

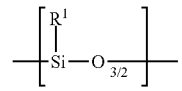

In Formula (1), $R^1$ independently represents a hydrogen atom, a halogen atom, a halogen atom, a linear, branched, or cyclic alkoxy group having 1 to 20 carbon atoms, a linear, branched, or cyclic alkyl group having 1 to 20 carbon atoms, a linear, branched, or cyclic substituted alkyl group having 1 to 20 carbon atoms, a linear, branched, or cyclic alkenyl group having 2 to 20 carbon atoms, an aryl group having 6 to 20 carbon atoms, or an aralkyl group having 7 to 20 carbon atoms. $R^1$s may be the same as or different from each other. That is, the straight silicone having the siloxane structure represented by the Formula (1) may be formed of condensed siloxane structures of the same type or formed of co-condensed siloxane structures as combinations of different types.

Examples of the halogen atom represented by $R^1$ include a fluorine atom, a chlorine atom, and the like.

Examples of the linear, branched, or cyclic alkoxy group having 1 to 20 carbon atoms represented by $R^1$ include a methoxy group, an ethoxy group, an n-propoxy group, an i-propoxy group, an n-butoxy group, an i-butoxy group, a sec-butoxy group, a t-butoxy group, an n-pentyloxy group, an n-hexyloxy group, a cyclopentyloxy group, a cyclohexyloxy group, and the like.

Examples of the linear, branched, or cyclic alkyl group having 1 to 20 carbon atoms represented by $R^1$ include a methyl group, an ethyl group, an n-propyl group, an i-propyl group, an n-butyl group, an i-butyl group, a sec-butyl group, a t-butyl group, an n-pentyl group, an n-hexyl group, a cyclopentyl group, a cyclohexyl group, and the like. Among these linear, branched, or cyclic alky groups having 1 to 20 carbon atoms represented by $R^1$, an alkyl group having 1 to 3 carbon atoms is preferable, and a methyl group is more preferable.

Examples of the linear, branched, or cyclic substituted alkyl group having 1 to 20 carbon atoms represented by $R^1$ include an arylalkyl group, a fluoroalkyl group, a chloroalkyl group, a hydroxyalkyl group, a (meth)acryloxyalkyl group, and a mercaptoalkyl group. Specific examples of these include arylalkyl groups such as a phenyl methyl (benzyl) group, a 1-phenylethyl group, a 2-phenylethyl group, a 1-phenyl-n-propyl group, a 2-phenyl-2-propyl (cumyl) group, a 3-phenyl-n-propyl group, a 1-phenylbutyl group, a 2-phenylbutyl group, a 3-phenylbutyl group, a 4-phenylbutyl group, a 1-phenylpentyl group, a 2-phenylpentyl group, a 3-phenylpentyl group, a 4-phenylpentyl group, a 5-phenylpentyl group, a 1-phenylhexyl group, a 2-phenylhexyl group, a 3-phenylhexyl group, a 4-phenylhexyl group, a 5-phenylhexyl group, a 6-phenylhexyl group, a 1-phenylcyclohexyl group, a 2-phenylcyclohexyl group, a 3-phenylcyclohexyl group, a 1-phenylheptyl group, a 2-phenylheptyl group, a 3-phenylheptyl group, a 4-phenylheptyl group, a 5-phenylheptyl group, a 6-phenylheptyl group, a 1-phenyloctyl group, a 2-phenyloctyl group, a 3-phenyloctyl group, a 4-phenyloctyl group, a 5-phenyloctyl group, a 6-phenyloctyl group, a 1-naphthylethyl group, a 2-naphthylethyl group, a 1-naphthyl-n-propyl group, a 2-naphthyl-n-propyl group, a 3-naphthyl-n-propyl group, a 1-naphthylbutyl group, a 2-naphthylbutyl group, a 3-naphthylbutyl group, a 4-naphthylbutyl group, a 1-naphthylpentyl group, a 2-naphthylpentyl group, a 3-naphthylpentyl group, a 4-naphthylpentyl group, a 5-naphthylpentyl group, a 1-naphthylhexyl group, a 2-naphthylhexyl group, a 3-naphthylhexyl group, a 4-naphthylhexyl group, a 5-naphthylhexyl group, a 6-naphthylhexyl group, a 1-naphthylcyclohexyl group, a 2-naphthylcyclohexyl group, a 3-naphthylcyclohexyl group, a 1-naphthylheptyl group, a 2-naphthylheptyl group, a 3-naphthylheptyl group, a 4-naphthylheptyl group, a 5-naphthylheptyl group, a 6-naphthylheptyl group, a 1-naphthyloctyl group, a 2-naphthyloctyl group, a 3-naphthyloctyl group, a 4-naphthyloctyl group, a 5-naphthyloctyl group, and a 6-naphthyloctyl group; fluoroalkyl groups such as a fluoromethyl group, a trifluoromethyl group, a 2-fluoroethyl group, a (trifluoromethyl)methyl group, a pentafluoroethyl group, a 3-fluoro-n-propyl group, a 2-(trifluoromethyl)ethyl group, a (pentafluoroethyl)methyl group, a heptafluoro-n-propyl group, a 4-fluoro-n-butyl group, a 3-(trifluoromethyl)-n-propyl group, a 2-(pentafluoroethyl) ethyl group, a (heptafluoro-n-propyl)methyl group, a nonafluoro-n-butyl group, a 5-fluoro-n-pentyl group, a 4-(trifluoromethyl)-n-butyl group, a 3-(pentafluoroethyl)-n-propyl group, a 2-(pentafluoro-n-propyl)ethyl group, a (nonafluoro-n-butyl)methyl group, a perfluoro-n-pentyl group, a 6-fluoro-n-hexyl group, a 5-(trifluoromethyl)-n-pentyl group, a 4-(pentafluoroethyl)-n-butyl group, a 3-(pentafluoro-n-propyl)-n-propyl group, a 2-(nonafluoro-n-butyl)ethyl group, a (perfluoro-n-pentyl)methyl group, a perfluoro-n-hexyl group, a 7-(trifluoromethyl)-n-heptyl group, a 6-(pentafluoroethyl)-n-hexyl group, a 5-(heptafluoro-n-propyl)-n-pentyl group, a 4-(nonafluoro-n-butyl)-n-butyl group, a 3-(perfluoro-n-pentyl)-n-propyl group, a 2-(perfluoro-n-hexyl) ethyl group, a (perfluoro-n-heptyl)methyl group, a perfluoro-n-octyl group, a 9-(trifluoromethyl)-n-nonyl group, a 8-(pentafluoroethyl)-n-octyl group, a 7-(heptafluoro-n-propyl)-n-heptyl group, a 6-(nonafluoro-n-butyl)-n-hexyl group, a 5-(perfluoro-n-pentyl)-n-pentyl group, a 4-(perfluoro-n-hexyl)-n-butyl group, a 3-(perfluoro-n-heptyl)-n-propyl group, a 2-(perfluoro-n-octyl)ethyl group, a (perfluoro-n-nonyl)methyl group, a perfluoro-n-decyl group, a 4-fluorocyclopentyl group, and a 4-fluorocyclohexyl group; a chloromethyl group; a 2-chloroethyl group; a 3-chloro-n-propyl group; a 4-chloro-n-butyl group; a 3-chlorocyclopentyl group; a 4-chlorocyclohexyl group; a hydroxymethyl group; a 2-hydroxyethyl group; a 3-hydroxycyclopentyl group; a 4-hydroxycyclohexyl group; a 3-(meth)acryloxypropyl group; a 3-mercaptopropyl group; and the like.

Examples of the linear, branched, or cyclic alkenyl group having 2 to 20 carbon atoms represented by $R^1$ include a vinyl group, a 1-methylvinyl group, a 1-propenyl group, an allyl group (2-propenyl group), a 2-methyl-2-propenyl group, a 1-butenyl group, a 2-butenyl group, a 3-butenyl group, a 3-cyclopentenyl group, a 3-cyclohexenyl group, and the like. Among the linear, branched, or cyclic substituted alkyl groups having 2 to 20 carbon atoms represented by $R^1$, an arylalkyl group is preferable, and a cumyl group is more preferable.

Examples of the aryl group having 6 to 20 carbon atoms represented by $R^1$ include a phenyl group, an o-tolyl group, an m-tolyl group, a p-tolyl group, a 2,3-xylyl group, a 2,4-xylyl group, a 2,5-xylyl group, a 2,6-xylyl group, a 3,4-xylyl group, a 3,5-xylyl group, a 1-naphthyl group, and the like. Among these aryl groups having 6 to 20 carbon atoms represented by $R^1$, an o-tolyl group, an m-tolyl group, a p-tolyl group, a 2,3-xylyl group, a 2,4-xylyl group, a 2,5-xylyl group, a 2,6-xylyl group, a 3,4-xylyl group, a 3,5-xylyl group, and a 1-naphthyl group other than an unsubstituted phenyl group are preferable; and an o-tolyl group, an m-tolyl group, and a p-tolyl group are more preferable, since these do not easily generate benzene when being heated.

Examples of the aralkyl group having 7 to 20 carbon atoms represented by $R^1$ include a benzyl group, a phenethyl group, and the like.

In the Formula (1), $R^1$ independently preferably represents a hydrogen atom, a linear, branched, or cyclic alkyl group having 1 to 20 carbon atoms, a linear, branched, or cyclic substituted alkyl group having 1 to 6 carbon atoms, or an aryl group having 6 to 9 carbon atoms (the aryl group is preferably an aryl group other than an unsubstituted phenyl group since such an aryl group does not easily generate benzene when being heated), and more preferably represents a hydrogen atom, a methyl group, or a tolyl group.

The siloxane structure represented by the Formula (1) preferably contains a methyl group as $R^1$, since an L-value of the decorative layer can be further increased.

The straight silicone is preferably a copolymer of two or more kinds of siloxane structures represented by the Formula (1) that differ from each other in terms of $R^1$. In this case, preferable examples of the straight silicone include a copolymer consisting of a siloxane structure represented by the Formula (1) in which $R^1$ is an alkyl group and a siloxane structure represented by the Formula (1) in which $R^1$ is a hydrogen atom, a substituted alkyl group, or an aryl group. The copolymerization ratio is not particularly limited. However, the ratio of the siloxane structure represented by the Formula (1) in which $R^1$ is an alkyl group to the total siloxane structures represented by the Formula (1) is preferably 50 mol % to 100 mol %, more preferably 60 mol % to 100 mol %, and particularly preferably 70 mol % to 100 mol %.

As the straight silicone used in the transfer film of the present invention, straight silicone that contains, in addition to the siloxane structure represented by the Formula (1), a siloxane structure having been co-condensed with a siloxane structure represented by the following Formula (2) in a molecule can be preferably used.

Formula (2)

[Chem. 3]

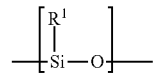

$R^2$ in Formula (2) has the same definition as $R^1$ in the Formula (1), and the preferable range thereof is also the same.

Specific examples usable as the straight silicone include alkyl-based straight silicone (methyl-based straight silicone or the like) prepared by condensation of a silane compound having an alkyl and alkoxy groups having 1 to 20 carbon atoms, straight silicone based on alkyl/aryl such as methyl/phenyl, straight silicone based on aryl such as phenyl, and straight silicone based on hydrogen such as methyl/hydrogen.

The straight silicone is more preferably a methyl-based straight silicone resin, a methyl tolyl-based straight silicone resin, a methyl phenyl-based straight silicone resin, or an acrylic resin-modified silicone resin. From the viewpoint of inhibiting decrease in brightness without generating benzene at the time of heating, a methyl-based straight silicone resin, a methyl tolyl-based straight silicone resin, a methyl/hydrogen-based straight silicone resin, and a hydrogen/tolyl-based straight silicone resin are particularly preferable.

One kind of these silicone-based resins may be used singly, or two or more kinds thereof may be used concurrently. By mixing these together at any ratio, the physical properties of a film can be controlled.

The amount of benzene generated can be determined by gas chromatography-mass spectrometry (GC-MS). The decorative layer, which will be described later, obtained by transferring the transfer film of the present invention or transferring the colored layer of the transfer film of the present invention preferably contains a small amount of benzene as a decomposition product generated by heating, and more preferably does not contain benzene. The amount of benzene contained in the decorative layer as a decomposition product generated by heating is preferably 29 mg or less, more preferably 19 mg or less, particularly preferably 9.2 mg or less, and more particularly preferably 0.01 mg or less, per 100 cm$^2$ of the decorative layer.

The weight average molecular weight of the straight silicone is preferably 1,000 to 1,000,000, more preferably 2,000 to 800,000, and particularly preferably 2,500 to 500,000.

Examples of silane compounds used for preparing the modified silicone resin and the straight silicone resin include trialkoxy, triacyloxy, or triphenoxysilanes such as tetramethoxysilane, tetraethoxysilane, tetra n-propoxysilane, tetraisopropoxysilane, tetra n-butoxysilane, tetraisobutoxysilane, methyl trimethoxysilane, methyl triethoxysilane, methyl triacetoxysilane, methyl tributoxysilane, ethyl trimethoxysilane, ethyl triethoxysilane, isobutyl trimethoxysilane, propyl trimethoxysilane, vinyl trimethoxysilane, vinyl triethoxysilane, vinyl trimethoxyethoxysilane, phenyl trimethoxysilane, phenyl triethoxysilane, phenyl triacetoxysilane, cumyl trimethoxysilane, tolyl trimethoxysilane, 3,3,3-trifluoropropyl trimethoxysilane, γ-methacryloxypropyl trimethoxysilane, γ-aminopropyl trimethoxysilane, γ-aminopropyl triethoxysilane, γ-mercaptopropyl trimethoxysilane, γ-mercaptopropyl triethoxysilane, N-β(aminoethyl)-γ-aminopropyl trimethoxysilane, N-β(aminoethyl)-γ-aminopropyl triethoxysilane, β-cyanoethyl triethoxysilane, methyl triphenoxysilane, glycidoxymethyl trimethoxysilane, glycidoxymethyl triethoxysilane, α-glycidoxyethyl trimethoxysilane, α-glycidoxyethyl triethoxysilane, β-glycidoxyethyl trimethoxysilane, β-glycidoxyethyl triethoxysilane, α-glycidoxypropyl trimethoxysilane, α-glycidoxypropyl triethoxysilane, β-glycidoxypropyl trimethoxysilane, β-glycidoxypropyl triethoxysilane, γ-glycidoxypropyl trimethoxysilane, γ-glycidoxypropyl triethoxysilane, γ-glycidoxypropyl tripropoxysilane, γ-glycidoxypropyl tributoxysilane, γ-glycidoxypropyl trimethoxyethoxysilane, γ-glycidoxypropyl triphenoxysilane, α-glycidoxybutyl trimethoxysilane, α-glycidoxybutyl triethoxysilane, β-glycidoxybutyl trimethoxysilane, β-glycidoxybutyl triethoxysilane, γ-glycidoxybutyl trimethoxysilane, γ-glycidoxybutyl triethoxysilane, δ-glycidoxybutyl trimethoxysilane, δ-glycidoxybutyl triethoxysilane, (3,4-epoxycyclohexyl)methyl trimethoxysilane, (3,4-epoxycyclohexyl)methyl triethoxysilane, β-(3,4-epoxycyclohexyl)ethyl trimethoxysilane, β-(3,4-epoxycyclohexyl)ethyl triethoxysilane, β-(3,4-epoxycyclohexyl)ethyl tripropoxysilane, β-(3,4-epoxycyclohexyl)ethyl tributoxysilane, β-(3,4-epoxycyclohexyl)ethyl trimethoxysilane, β-(3,4-epoxycyclohexyl)ethyl triphenoxysilane, γ-(3,4-epoxycyclohexyl)propyl trimethoxysilane, γ-(3,4-epoxycyclohexyl)propyl triethoxysilane, and δ-(3,4-epoxycyclohexyl)butyl triethoxysilane; alkoxysilanes or diacyloxysilanes such as phenyl methyl dimethoxysilane, phenyl methyl diethoxysilane, dimethyl diacetoxysilane, γ-methacryloxypropyl methyl dimethoxysilane, γ-methacryloxypropyl methyl diethoxysilane, γ-mercaptopropyl methyl dimethoxysilane, γ-mercaptopropyl methyl diethoxysilane, γ-aminopropyl methyl dimethoxysilane, γ-aminopropyl methyl diethoxysilane, vinyl methyl dimethoxysilane, vinyl methyl diethoxysilane, glycidoxymethyl dimethoxysilane, glycidoxymethyl diethoxysilane, α-glycidoxyethyl methyl dimethoxysilane, α-glycidoxyethyl diethoxysilane, β-glycidoxyethyl methyl dimethoxysilane, β-glycidoxyethyl methyl diethoxysilane, α-glycidoxypropyl methyl dimethoxysilane, α-glycidoxypropyl methyl diethoxysilane, β-glycidoxypropyl methyl dimethoxysilane, β-glycidoxypropyl methyl diethoxysilane, γ-glycidoxypropyl methyl dimethoxysilane, γ-glycidoxypropyl methyl diethoxysilane, γ-glycidoxypropyl methyl dipropoxysilane, γ-glycidoxypropyl methyl dibutoxysilane, γ-glycidoxypropyl methyl dimethoxyethoxysilane, γ-glycidoxypropyl methyl diphenoxysilane, γ-glycidoxypropyl ethyl dimethoxysilane, γ-glycidoxypropyl ethyl diethoxysilane, γ-glycidoxypropyl ethyl dipropoxysilane, γ-glycidoxypropyl vinyl dimethoxysilane, γ-glycidoxypropyl vinyl diethoxysilane, γ-glycidoxypropyl phenyl dimethoxysilane, and γ-glycidoxypropyl phenyl diethoxysilane; dimethoxymethylsilane, trimethoxysilane, dimethylethoxysilane, diacetoxymethylsilane, diethoxymethylsilane, diethylmethylsilane, triethylsilane, butyldimethylsilane, dimethylphenylsilane, methylphenylvinylsilane, diphenylmethylsilane, tripropylsilane, tripentyloxysilane, triphenylsilane, trihexylsilane, diethylsilane, allyldimethylsilane, methylphenylsilane, diphenylsilane, phenylsilane, octylsilane, 1,4-bis(dimethylsilyl)benzene, 1,1,3,3-tetramethyldisiloxane, dimethyltolylsilane, methyltolylvinylsilane, ditolylmethylsilane, tritolylsilane, dimethylbenzylsilane, methylbenzylvinylsilane, dibenzylmethylsilane, tribenzylsilane, diphenylsilane, 2-chloroethylsilane, bis[(p-dimethylsilyl)phenyl]ether, 1,4-dimethyldisilylethane, 1,3,5-tris(dimethylsilyl)benzene, 1,3,5-trimethyl-1,3,5-trisilane, poly(methylsilylene)phenylene, poly(methyl silylene)methylene, tetrachlorosilane, trichlorosilane, triethoxysilane, tri-n-propoxysilane, tri-i-propoxysilane, tri-n-butoxysilane, tri-sec-butoxysilane, fluorotrichlorosilane, fluorotrimethoxysilane, fluorotriethoxysilane, fluorotri-n-propoxysilane, fluorotri-i-propoxysilane, fluorotri-n-butoxysilane, fluorotri-sec-butoxysilane, methyl trichlorosilane, methyl tri-n-propoxysilane, methyl tri-i-propoxysilane, methyl tri-n-butoxysilane, methyl tri-sec-butoxysilane, 2-(trifluoromethyl)ethyl trichlorosilane, 2-(trifluoromethyl)ethyl trimethoxysilane, 2-(trifluoromethyl)ethyl triethoxysilane, 2-(trifluoromethyl)ethyl tri-n-propoxysilane, 2-(trifluoromethyl)ethyl tri-i-propoxysilane, 2-(trifluoromethyl)ethyl tri-n-butoxysilane, 2-(trifluoromethyl)ethyl tri-sec-butoxysilane, 2-(perfluoro-n-hexyl)ethyl trichlorosilane, 2-(perfluoro-n-hexyl)ethyl trimethoxysilane, 2-(perfluoro-n-hexyl)ethyl triethoxysilane, 2-(perfluoro-n-hexyl)ethyl tri-n-propoxysilane, 2-(perfluoro-n-hexyl)ethyl tri-i-propoxysilane, 2-(perfluoro-n-hexyl)ethyl tri-n-butoxysilane, 2-(perfluoro-n-hexyl)ethyl tri-sec-butoxysilane, 2-(perfluoro-n-octyl)ethyl trichlorosilane, 2-(perfluoro-n-octyl)ethyl trimethoxysilane, 2-(perfluoro-n-octyl)ethyl triethoxysilane, 2-(perfluoro-n-octyl)ethyl tri-n-propoxysilane, 2-(perfluoro-n-octyl)ethyl tri-i-propoxysilane, 2-(perfluoro-n-octyl)ethyl tri-n-butoxysilane, 2-(perfluoro-n-octyl)ethyl tri-sec-butoxysilane, hydroxymethyl trichlorosilane, hydroxymethyl trimethoxysilane, hydroxyethyl trimethoxysilane, hydroxymethyl tri-n-propoxysilane, hydroxymethyl tri-i-propoxysilane, hydroxymethyl tri-n-butoxysilane, hydroxymethyl tri-sec-butoxysilane, 3-(meth)acryloxypropyl trichlorosilane, 3-(meth)acryloxypropyl trimethoxysilane, 3-(meth)acryloxypropyl triethoxysilane, 3-(meth)acryloxypropyl tri-n-propoxysilane, 3-(meth)acryloxypropyl tri-i-propoxysilane, 3-(meth)acryloxypropyl tri-n-butoxysilane, 3-(meth)acryloxypropyl tri-sec-butoxysilane, 3-mercaptopropyl trichlorosilane, 3-mercaptopropyl trimethoxysilane, 3-mercaptopropyl triethoxysilane, 3-mercaptopropyl tri-n-propoxysilane, 3-mercaptopropyl tri-i-propoxysilane, 3-mercaptopropyl tri-n-butoxysilane, 3-mercaptopropyl tri-sec-butoxysilane, vinyltrichlorosilane, vinyl tri-n-propoxysilane, vinyl tri-i-propoxysilane, vinyl tri-n-butoxysilane, vinyl tri-sec-butoxysilane, allyltrichlorosilane, allyltrimethoxysilane, allyltriethoxysilane, allyl tri-n-propoxysilane, allyl tri-i-propoxysilane, allyl tri-n-butoxysilane, allyl tri-sec-butoxysilane, phenyltrichlorosilane, phenyl tri-n-propoxysilane, phenyl tri-i-propoxysilane, phenyl tri-n-butoxysilane, phenyl tri-sec-butoxysilane, methyldichlorosilane, methyldiethoxysilane, methyl di-n-propoxysilane, methyl di-i-propoxysilane, methyl di-n-butoxysilane, methyl di-sec-butoxysilane, dimethyldichlorosilane, dimethyldimethoxysilane, dimethyldiethoxysilane, dimethyl di-n-propoxysilane, dimethyl di-i-propoxysilane, dimethyl di-n-butoxysilane, dimethyl di-sec-butoxysilane, (methyl) [2-(perfluoro-n-octyl)ethyl]dichlorosilane, (methyl)[2-(perfluoro-n-octyl)ethyl]dimethoxysilane, (methyl)[2-(perfluoro-n-octyl)ethyl]diethoxysilane, (methyl)[2-(perfluoro-n-octyl)ethyl]di-n-propoxysilane, (methyl)[2-(perfluoro-n-octyl)ethyl]di-i-propoxysilane, (methyl)[2-(perfluoro-n-octyl)ethyl]di-n-butoxysilane, (methyl)[2-(perfluoro-n-octyl)ethyl]di-sec-butoxysilane, (methyl)(γ-glycidoxypropyl)dichlorosilane, (methyl)(γ-glycidoxypropyl)dimethoxysilane, (methyl)(γ-glycidoxypropyl)diethoxysilane, (methyl)(γ-glycidoxypropyl)di-n-propoxysilane, (methyl)(γ-glycidoxypropyl)di-i-propoxysilane, (methyl)(γ-glycidoxypropyl)di-n-butoxysilane, (methyl)(γ-glycidoxypropyl)di-sec-butoxysilane, (methyl)(3-mercaptopropyl)dichlorosilane, (methyl)(3-mercaptopropyl)dimethoxysilane, (methyl)(3-mercaptopropyl)diethoxysilane, (methyl)(3-mercaptopropyl)di-n-propoxysilane, (methyl)(3-mercaptopropyl)di-i-propoxysilane, (methyl)(3-mercaptopropyl)di-n-butoxysilane, (methyl)(3-mercaptopropyl)di-sec-butoxysilane, (methyl)(vinyl)dichlorosilane, (methyl)(vinyl)dimethoxysilane, (methyl)(vinyl)diethoxysilane, (methyl)(vinyl)di-n-propoxysilane, (methyl)(vinyl)di-i-propoxysilane, (methyl)(vinyl)di-n-butoxysilane, (methyl)(vinyl)di-sec-butoxysilane, divinyldichlorosilane, divinyldimethoxysilane, divinyldiethoxysilane, divinyl di-n-propoxysilane, divinyl di-i-propoxysilane, divinyl di-n-butoxysilane, divinyl di-sec-butoxysilane, diphenyldichlorosilane, diphenyldimethoxysilane, diphenyldiethoxysilane, diphenyl di-n-propoxysilane, diphenyl di-i-propoxysilane, diphenyl di-n-butoxysilane, diphenyl di-sec-butoxysilane, chlorodimethysilane, methoxydimethylsilane, ethoxydimethylsilane, chlorotrimethylsilane, bromotrimethylsilane, iodotrimethylsilane, methoxytrimethylsilane, ethoxytrimethylsilane, n-propoxytrimethylsilane, i-propoxytrimethylsilane, n-butoxytrimethylsilane, sec-butoxytrimethylsilane, t-butoxytrimethylsilane, (chloro)(vinyl)dimethylsilane, (methoxy)(vinyl)dimethylsilane, (ethoxy)(vinyl)dimethylsilane, (chloro)(methyl)diphenylsilane, (methoxy)(methyl)diphenylsilane, (ethoxy)(methyl)diphenylsilane, and the like. However, the present invention is not limited to these specific examples.

As the silicone-based resins such as the modified silicone resin and the straight silicone resin, commercially available products can be used, and examples thereof include partial condensates under the trade names of KC-89, KC-89S, X-21-3153, X-21-5841, X-21-5842, X-21-5843, X-21-5844, X-21-5845, X-21-5846, X-21-5847, X-21-5848, X-22-160AS, X-22-170B, X-22-170BX, X-22-170D, X-22-170DX, X-22-176B, X-22-176D, X-22-176DX, X-22-176F, X-40-2308, X-40-2651, X-40-2655A, X-40-2671, X-40-2672, X-40-9220, X-40-9225, X-40-9226, X-40-9227, X-40-9246, X-40-9247, X-40-9250, X-40-9323, X-40-2460M, X-41-1053, X-41-1056, X-41-1805, X-41-1810, KF6001, KF6002, KF6003, KR212, KR-213, KR-217, KR220L, KR242A, KR271, KR282, KR300, KR311, KR400, KR251, KR255, KR401N, KR500, KR510, KR5206, KR5230, KR5235, KR9218, KR9706, and KR165 (Shin-Etsu Chemical Co., Ltd.); Glass Resin (SHOWA DENKO K.K.); SH804, SH805, SH806A, SH840, SR2400, SR2402, SR2405, SR2406, SR2410, SR2411, SR2416, and SR2420 (Dow Corning Toray Co., Ltd.); FZ3711 and FZ3722 (Nippon Unicar Company Limited); DMS-S12, DMS-S15, DMS-S21, DMS-S27, DMS-S31, DMS-S32, DMS-S33, DMS-S35, DMS-S38, DMS-S42, DMS-S45, DMS-S51, DMS-227, PDS-0332, PDS-1615, PDS-9931, and XMS-5025 (CHISSO CORPORATION); Methyl Silicate MS51 and Methyl Silicate MS56 (Mitsubishi Chemical Corporation); Ethyl Silicate 28, Ethyl Silicate 40, and Ethyl Silicate 48 (COLCOAT CO., Ltd.); and GR100, GR650, GR908, and GR950 (SHOWA DENKO K.K.). However, the present invention is not limited to these specific examples.

Herein, the colored layer of the transfer film of the present invention is not necessarily subjected to photocuring performed using a combination of a photocurable resin and a photopolymerization initiator. The colored layer may or may not contain a photocurable resin or a photopolymerization initiator. Particularly, when the colored layer contains an antioxidant, which will be described later, from the viewpoint of preventing the function of the antioxidant from being impaired due to the radicals generated when a photopolymerization initiator is exposed to light and sufficiently increasing the whiteness after baking, the colored light preferably does not contain a photopolymerization initiator. Accordingly, the (B) silicone-based resin is preferably a thermosetting resin.

—(C) Antioxidant—

From the viewpoint of increasing the whiteness of the decorative layer, which is obtained by transferring the colored layer from the transfer film of the present invention, after baking, the colored layer of the transfer film of the present invention preferably contains an antioxidant. Herein, for forming transparent electrode patterns of ITO or the like in a capacitive input device, the film needs to be baked at a high temperature. If an antioxidant is added to the film, the whiteness after baking can be increased.

As the antioxidant, known antioxidants can be used. For example, hindered phenol-based antioxidants, semi-hindered phenol-based antioxidants, phosphoric acid-based antioxidants, and hybrid-type antioxidants containing phosphoric acid/hindered phenol in a molecule can be used.

Among these, phosphoric acid-based antioxidants, combinations of phosphoric acid-based antioxidants and hindered phenol-based antioxidants or semi-hindered phenol-based antioxidants, or hybrid-type antioxidants containing phosphoric acid/hindered phenol in a molecule are preferable.

Commercially available antioxidants can be used as the aforementioned antioxidants. Examples of the phosphoric acid-based antioxidants include IRGAFOS168 and IRGAFOS38 (all manufactured by BASF JAPAN Ltd.). Examples of the phosphoric acid/hindered phenol-based antioxidants include IRGAMOD295 (manufactured by BASF JAPAN Ltd.). Examples of the hybrid-type antioxidants containing phosphoric acid/hindered phenol in a molecule include Sumilizer GP (manufactured by SUMITOMO CHEMICAL Co., Ltd.).

From the viewpoint of preventing decrease in whiteness, the antioxidants are preferably phosphoric acid-based antioxidants, and among these, IRGAFOS168 is particularly preferable.

The amount of the antioxidant to be added with respect to the total solid content of the colored layer is not particularly limited, but is preferably 0.001% by mass to 10% by mass, more preferably 0.01% by mass to 1% by mass, and particularly preferably 0.05% by mass to 0.2% by mass.

—Solvent—

Moreover, as a solvent used for manufacturing the colored layer of the transfer film of the present invention by coating, the solvents described in paragraphs <0043> and <0044> of JP2011-95716A can be used.

—Catalyst—

From the viewpoint of curing the silicone-based resin-containing colored layer and thus improving the brittleness thereof, the colored layer of the transfer film of the present invention preferably contains a catalyst. Particularly, when two or more kinds of silicone-based resins are used, a catalyst is preferably used for accelerating crosslinking by causing a dehydration/dealcoholization condensation reaction.

As the catalyst, known catalysts can be used.

Examples of preferable catalysts include organic metal compound catalysts such as organic complexes or organic salts of at least one kind of metal component selected from a group consisting of tin (Sn), zinc (Zn), iron (Fe), titanium (Ti), zirconium (Zr), bismuth (Bi), hafnium (Hf), yttrium (Y), aluminum (Al), boron (B), and gallium (Ga).

Among these, Sn, Ti, Zn, Zr, Hf, and Ga are preferable since these are highly reactive. From the viewpoint of preventing cracking at the time of baking, Zn or Ti is more preferable, and from the viewpoint of improving pot life, Zn is particularly preferable.

Examples of the organic metal compound catalysts containing zinc (Zn) include zinc triacetyl acetonate, zinc stearate, bis(acetylacetonato)zinc (II) (monohydrate), and the like.

As the organic metal compound catalysts containing tin (Sn), titanium (Ti), zirconium (Zr), hafnium (Hf), or gallium (Ga), for example, the catalysts described in JP2012-238636A can be preferably used.

Commercially available catalysts can be used as the aforementioned catalysts, and examples thereof include a zinc-based condensation catalyst D-15 (manufactured by Shin-Etsu Chemical Co., Ltd.).

In the present invention, one kind of the catalysts may be used singly, or two or more kinds thereof may be used by being combined at any ratio. Furthermore, the catalysts may be concurrently used with a reaction accelerator or a reaction inhibitor.

From the viewpoint of preventing cracking at the time of baking and improving pot life, the content of the catalyst is preferably 0.01% by mass to 10% by mass with respect to the silicone-based resin. The content is more preferably 0.03% by mass to 5.0% by mass.

—Additives—

In addition, other additives may be used for the colored layer. Examples of the additives include the surfactants described in paragraph <0017> of JP4502784B and paragraphs <0060> to <0071> of JP2009-237362A, the thermopolymerization inhibitor described in paragraph <0018> of JP4502784B, and other additives described in paragraphs <0058> to <0071> of JP2000-310706A.

Up to now, the case in which the transfer film of the present invention is a non-photosensitive material has been mainly described, but the transfer film may be a negative material or a positive material as necessary.

(Thickness)

From the viewpoint of enhancing the hiding power of the decorative layer at the time when the transfer film of the present invention is used as the decorative layer of a capacitive input device, the thickness of the colored layer is preferably 1 μm to 40 μm.

The thickness of the colored layer is more preferably 1.5 μm to 38 μm, and particularly preferably 1.8 μm to 35 μm.

(Viscosity of Colored Layer)

The viscosity of the colored layer measured at 100° C. is preferably within a range of 2,000 Pa·sec to 50,000 Pa·sec and preferably satisfies the following Expression (A). Expression (A): Viscosity of thermoplastic resin layer <Viscosity of colored layer Herein, the viscosity of each layer can be measured in the following manner. A thermoplastic resin layer or a coating solution for decorative layer is dried under the atmospheric pressure or under reduced pressure so as to remove a solvent and prepare a sample for measurement. Thereafter, for example, by using Vibron (DD-III model: manufactured by Toyo Baldwin Co., Ltd.) as a measurement instrument, the viscosity is measured under the conditions of a measurement start temperature of 50° C., a measurement end temperature of 150° C., a temperature increase rate of 5° C./min, and a vibration frequency of 1 Hz/deg. The value measured at 100° C. can be used as the viscosity.

<Thermoplastic Resin Layer>

In the transfer film of the present invention, a thermoplastic resin layer is preferably disposed between the temporary support and the colored layer, and the thermoplastic resin layer is preferably alkali-soluble. The thermoplastic resin layer functions as a cushioning material that can cover concavities and convexities (including concavities, convexities, and the like formed by an image that has been formed) of the surface of the base. The thermoplastic resin layer preferably has properties in which it can be deformed in accordance with the concavities and convexities on the subject surface.

The thermoplastic resin layer preferably adopts an embodiment containing the organic polymer substance described in JP1993-72724A (JP-H05-72724A) as a component, and particularly preferably adopts an embodiment containing at least one kind selected from among organic polymer substances of which the softening point measured by a Vicat method (specifically, a method for measuring the softening point of a polymer according to America material testing method, ASTMD1235) is about 80° C. or less.

Specifically, examples thereof include organic polymers like polyolefins such as polyethylene and polypropylene, ethylene copolymers consisting of ethylene and vinyl acetate or a saponified product thereof, copolymers consisting of ethylene and an acrylic acid ester or a saponified product thereof, vinyl chloride copolymers consisting of polyvinyl chloride or vinyl chloride and vinyl acetate or a saponified product thereof, polyvinylidene chloride, vinylidene chloride copolymers, polystyrene, styrene copolymers consisting of styrene and a (meth)acrylic acid ester or a saponified product thereof polyvinyl toluene, vinyl toluene copolymers consisting of vinyl toluene and a (meth)acrylic acid ester or a saponified product thereof, poly(meth)acrylic acid esters, (meth)acrylic acid ester copolymers consisting of butyl (meth)acrylate and vinyl acetate and the like, vinyl acetate copolymer nylon, copolymer nylon, polyamide resins such as N-alkoxymethylated nylon and N-dimethylaminated nylon, and polyester.

Furthermore, it is preferable to add a foaming agent or the like to the thermoplastic rein layer so as to control peelability, and those described in paragraphs <0020> to <0028> of JP2007-225939A can be appropriately used.

It is also preferable to add a surfactant to the thermoplastic resin layer, and for example, those described in paragraph <0017> of JP4502784B and in paragraphs <0060> to <0071> in JP2009-237362A can be appropriately used.

The thickness of the thermoplastic resin layer is preferably 3 µm to 30 µm. If the thickness of the thermoplastic resin layer is 3 µm or more, follow-up properties at the time of lamination become sufficient, and the concavities and convexities on the surface of the base can be easily and completely covered. If the thickness is 30 µm or less, a load is not easily applied to drying (removing of solvent) performed at the time of forming the thermoplastic resin layer on the temporary support; the time taken for developing the thermoplastic resin layer is not excessively lengthened; and process suitability becomes excellent. The thickness of the thermoplastic resin layer is more preferably 4 µm to 25 µm and particularly preferably 5 µm to 20 µm.

The thermoplastic resin layer can be formed by coating of a preparation containing a thermoplastic organic polymer, and the preparation used for coating and the like can be prepared using a solvent. The solvent is not particularly limited as long as it can dissolve a polymer component constituting the layer, and examples thereof include methyl ethyl ketone, cyclohexanone, propylene glycol monomethyl ether acetate, n-propanol, and 2-propanol, and the like.

The viscosity of the thermoplastic resin layer measured at 100° C. is preferably within a range of 1,000 Pa·sec to 10,000 Pa·sec.

<Other Layers>

The transfer film used in the present invention can be suitably constituted such that an intermediate layer is disposed between the decorative layer and the thermoplastic resin layer, or a protective film or the like is further disposed on the surface of the decorative layer.

For the purpose of preventing intermixing of components at the time of coating a plurality of layers or at the time of preserving the coated layers, an intermediate layer is preferably disposed in the transfer film used in the present invention. As the intermediate layer, an oxygen barrier film which is described as a "separation layer" in JP1993-72724A (JP-H05-72724A) and has a function of blocking oxygen is preferable. If such an intermediate layer is used, the sensitivity at the time of exposure is increased, a temporal load applied to the exposure machine can be reduced, and productivity is improved.

As the intermediate layer and the protective film, those described in paragraphs <0083> to <0087> and <0093> of JP2006-259138A can be appropriately used.

<Method for Preparing Transfer Film>

The transfer film of the present invention can be prepared based on the method for preparing a photosensitive transfer material described in paragraphs <0094> to <0098> of JP2006-259138A.

Specifically, in order to form the transfer film of the present invention having the intermediate layer, a solution (coating solution for thermoplastic resin layer) in which a thermoplastic organic polymer has been dissolved together with additives is coated onto the temporary support; the resultant is dried to form a thermoplastic resin layer; a preparation (coating solution for intermediate layer), which is prepared by adding a resin or additives to a solvent not dissolving the thermoplastic resin layer, is then coated onto the thermoplastic resin layer; the resultant is dried such that an intermediate layer is laminated thereon; a coating solution for colored layer, which is prepared by using a solvent not dissolving the intermediate layer, is further coated onto the intermediate layer; and the resultant is dried such that a colored layer is laminated thereon. In this manner, the transfer film of the present invention can be suitably prepared.

[Manufacturing Method of Capacitive Input Device]

The manufacturing method of a capacitive input device of the present invention (hereinafter, also referred to as a "manufacturing method of the present invention") is a manufacturing method of a capacitive input device which includes a front panel and at least the following elements (1) and (3) to (5) at one side (a non-contact side) of the front panel. The manufacturing method of the present invention includes a step of forming at least the (1) decorative layer by transferring the colored layer of the transfer film of the present invention to the one side of the front panel.

(1) A decorative layer (3) A plurality of first transparent electrode patterns composed of a plurality of pad portions being so connected to one another through connection portions as to extend in a first direction (4) A plurality of second electrode patterns electrically insulated from the first transparent electrode patterns and composed of a plurality of pad portions being so connected to one another as to extend in a direction crossing the first direction (5) An insulating layer which electrically insulates the first transparent electrode patterns from the second electrode patterns The capacitive input device of the present invention may further have the following element (6).

(6) A conductive element which is electrically connected to at least either the first transparent electrode patterns or the second electrode patterns, and is different from the first transparent electrode patterns and the second electrode patterns In the capacitive input device of the present invention, the second electrode patterns may be transparent electrode patterns. Furthermore, in the present specification, the second transparent electrode patterns are described in some cases instead of the second electrode patterns. However, preferable embodiments of the second electrode patterns are the same as preferable embodiments of the second transparent electrode patterns.

In the manufacturing method of a capacitive input device of the present invention, (2) a mask layer is preferably further disposed on the surface of the (1) decorative layer opposite to the front panel.

<Constitution of Capacitive Input Device>

First, the constitution of the capacitive input device formed by the manufacturing method of the present invention will be described. FIG. 1 is a cross-sectional view showing a preferable constitution of the capacitive input device of the present invention. In FIG. 1, a capacitive input device 10 is constituted with a front panel 1, a decorative layer 2a, a mask layer 2b, a first transparent electrode pattern 3, a second transparent electrode pattern 4, an insulating layer 5, a conductive element 6, and a transparent protective layer 7.

The front panel 1 is constituted with a translucent substrate such as a glass substrate, and toughened glass represented by Gorilla Glass of Corning Incorporated, can be used for it. Furthermore, in FIG. 1, the side of the front panel 1 at which the respective elements have been disposed is called a non-contact surface 1a. In the capacitive input device 10 of the present invention, a contact surface (surface opposite to the non-contact surface 1a) of the front panel 1 is brought into contact with a finger or the like for input. Hereinafter, the front panel will be called a "substrate" in some cases.

On the non-contact surface of the front panel 1, the mask layer 2b is formed on the decorative layer 2a. The mask layer 2b is a frame-like pattern around a display area formed at the non-contact side of the front panel of the touch panel. The mask layer 2b is formed so as to make routing wires and the like invisible.

The decorative layer 2a is formed on the mask layer 2b, that is, between the non-contact side and the mask layer 2b of the front panel of the touch panel for decoration.

Figure 2:
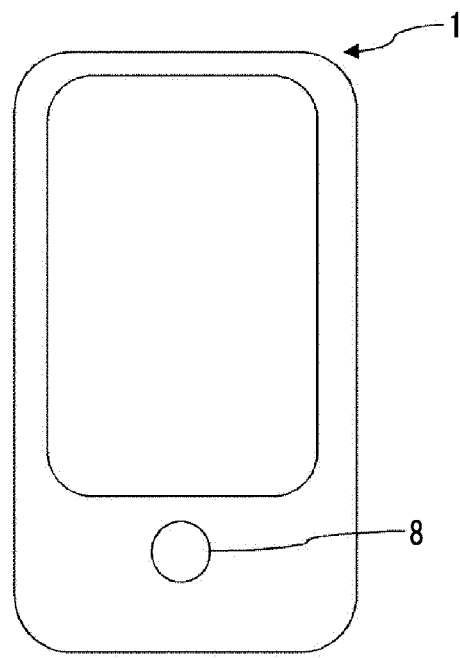
FIG. 2 is a view for illustrating an example of a front panel in the present invention.

As shown in FIG. 2, in the capacitive input device 10 of the present invention, the decorative layer 2a and the mask layer 2b are preferably disposed so as to cover a portion of the area (in FIG. 2, the area excluding an input surface) of the front panel 1. Furthermore, as shown in FIG. 2, an opening portion 8 can be disposed in a portion of the front panel 1. In the opening portion 8, a mechanical switch to be pressed can be disposed. Having a high strength, the toughened glass used as the substrate is not easily processed. Accordingly, in order to form the opening portion 8, generally, the toughening treatment is performed prior to the formation of the opening portion 8. However, if an attempt is made to form the decorative layer 2a on the substrate, which has the opening portion 8 and has undergone the toughening treatment, by using a liquid resist for forming the decorative layer or using an ink for screen printing, the resist component leaks from the opening portion, or alternatively, in the decorative layer disposed between the front panel and the mask layer, in which light-shielding patterns need to be formed to the position very close to the boundary of the front panel, the resist component sticks out of the edge of the glass, and this leads to a problem in that the back of the substrate is contaminated in some cases. However, if the decorative layer 2a is formed on the substrate having the opening portion 8 by using the transfer film of the present invention, such a problem can be solved.

On the non-contact surface of the front panel 1, the plurality of first transparent electrode patterns 3 in which a plurality of pad portions connected to one another through connection portions extends in a first direction, the plurality of second transparent electrode patterns 4 which is electrically insulated from the first transparent electrode patterns 3 and composed of a plurality of pad portions extending in a direction crossing the first direction, and the insulating layer 5 which electrically insulates the first transparent electrode patterns 3 from the second transparent electrode patterns 4 have been formed. The first transparent electrode patterns 3, the second transparent electrode patterns 4, and the conductive element 6, which will be described later, can be prepared by using, for example, a translucent conductive metal oxide film such as ITO (Indium Tin Oxide) or IZO (Indium Zinc Oxide). Examples of the metal film include ITO films; films of metals such as Al, Zn, Cu, Fe, Ni, Cr, and Mo; films of metal oxide such as $SiO_2$; and the like. At this time, the film thickness of each element can be controlled to be 10 nm to 200 nm. Furthermore, in order to make an amorphous ITO film into a polycrystalline ITO film by firing, electrical resistivity can be reduced. Moreover, the first transparent electrode patterns 3, the second transparent electrode patterns 4, and the conductive element 6, which will be described later, can be manufactured by using a transfer film having a conductive curable resin layer using conductive fiber, which will be described later. In addition, for forming the first transparent electrode patterns and the like by using ITO and the like, paragraphs <0014> to <0016> of JP4506785B and the like can be referred to.

Furthermore, at least either the first transparent electrode patterns 3 or the second transparent electrode patterns 4 can be disposed over the areas of both the non-contact surface of the front panel 1 and the surface of the mask layer 2 opposite to the front panel 1. FIG. 1 shows a state in which the second transparent electrode patterns are disposed over the areas of both the non-contact surface of the front panel 1 and the surface of the mask layer 2 opposite to the front panel 1. As shown in the drawing, even when the transfer film is laminated on both the mask layer requiring a certain thickness and the back surface of the front panel, if the transfer film of the present invention having a specific layer constitution is used, it is possible to laminate the transfer film by simple steps while preventing bubbles from being generated in the boundary of the mask portion, without using expensive equipment such as a vacuum laminator.

Figure 3:
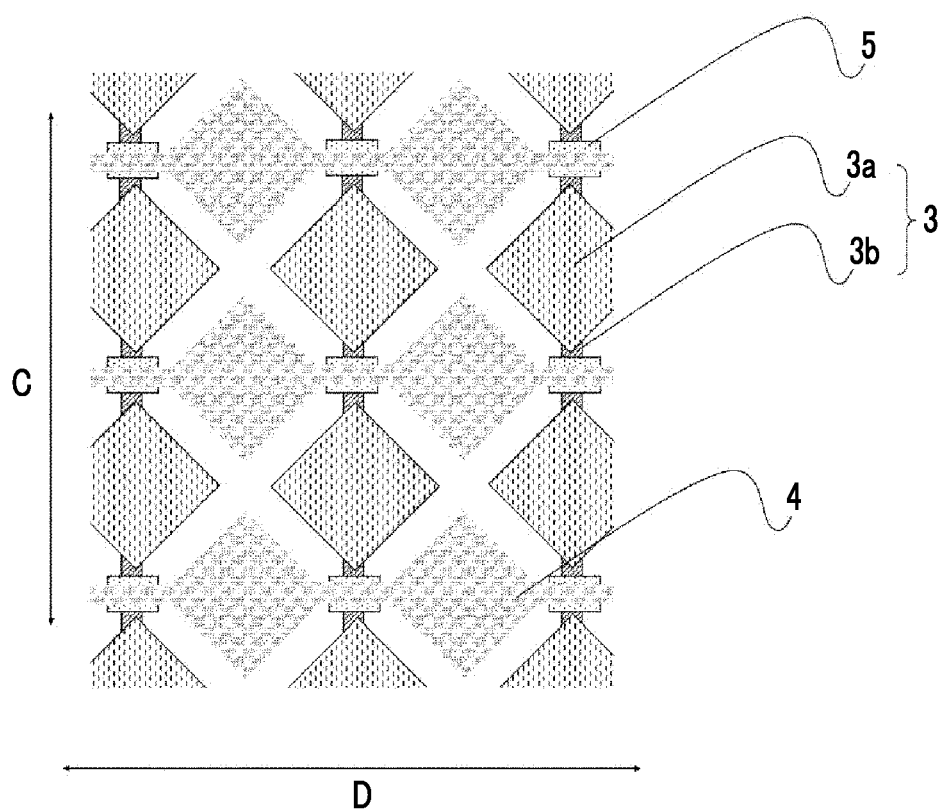
FIG. 3 is view for illustrating an example of first transparent electrode patterns and second transparent electrode patterns in the present invention.

The first transparent electrode patterns 3 and the second transparent electrode patterns 4 will be described based on FIG. 3. FIG. 3 is a view for illustrating an example of the first transparent electrode patterns and the second transparent electrode patterns of the present invention. As shown in FIG. 3, in the first transparent electrode patterns 3, pad portions 3a connected to one another through connection portions 3b extend in a first direction. Moreover, the second transparent electrode patterns 4 are electrically insulated from the first transparent electrode patterns 3 by the insulating layer 5 and composed of a plurality of pad portions extending in a direction (second direction in FIG. 3) crossing the first direction. Herein, for forming the first transparent electrode patterns 3, the pad portions 3a and the connection portions 3b may be integrally prepared. Alternatively, the connection portions 3b may be separately prepared, and the pad portions 3a and the second transparent electrode patterns 4 may be integrally prepared (patterned). For preparing (patterning) the pad portions 3a and the second transparent electrode patterns 4 integrally, a portion of the connection portions 3b is linked to a portion of the pad portions 3a as shown in FIG. 3, and each layer is formed such that the first transparent electrode patterns 3 are electrically insulated from the second transparent electrode patterns 4 by the insulating layer 5.

In FIG. 1, the conductive element 6 is disposed on the surface side of the mask layer 2 opposite to the front panel 1. The conductive element 6 is electrically connected to at least either the first transparent electrode patterns 3 or the second transparent electrode patterns 4, and is an element different from the first transparent electrode patterns 3 and the second transparent electrode patterns 4. FIG. 1 shows a state in which the conductive element 6 is connected to the second transparent electrode patterns 4.

Furthermore, in FIG. 1, the transparent protective layer 7 is disposed so as to cover all of the constituents. The transparent protective layer 7 may cover only a portion of each of the constituents. The insulating layer 5 and the transparent protective layer 7 may be formed of the same material or different materials. As the material constituting the insulating layer 5 and the transparent protective layer 7, those having a high degree of surface hardness and heat resistance are preferable. As the material, known photosensitive siloxane resin materials, acrylic resin materials, and the like are used.

Hereinafter, the manufacturing method of the present invention will be specifically described for each layer.

Figure 4:
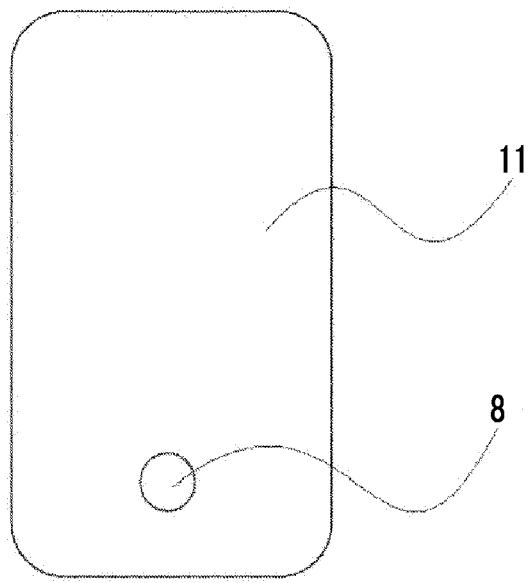
FIG. 4 is a top view showing an example of toughened glass in which an opening portion has been formed.
Figure 5:
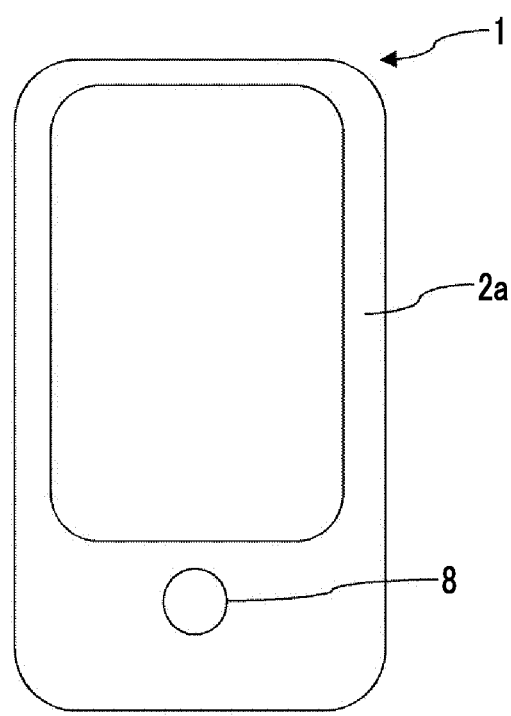
FIG. 5 is a top view showing an example of a front panel in which a decorative layer and a mask layer have been formed.
Figure 6:
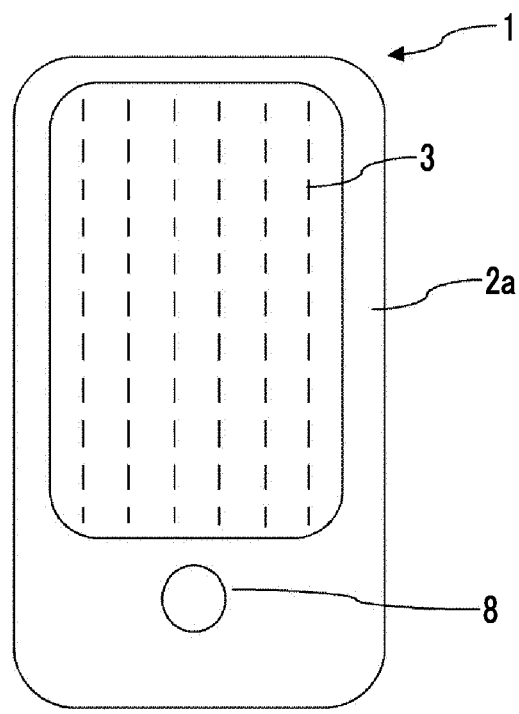
FIG. 6 is a top view showing an example of a front panel in which the first transparent electrode patterns have been formed.
Figure 7:
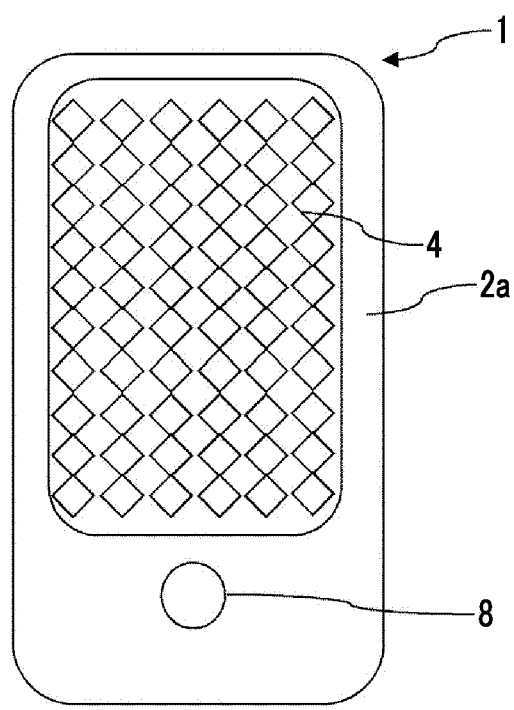
FIG. 7 is a top view showing an example of a front panel in which the first and second transparent electrode patterns have been formed.
Figure 8:
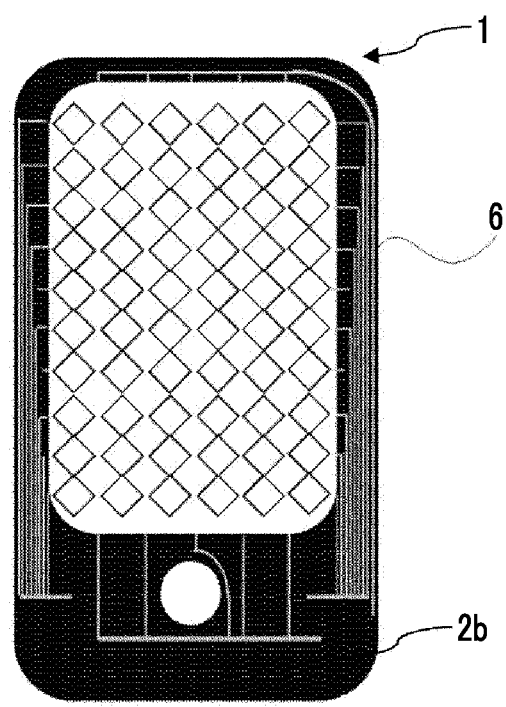
FIG. 8 is a top view showing an example of a front panel in which a conductive element different from the first and second transparent electrode patterns has been formed.

Examples of embodiments formed by the steps of the manufacturing method of the present invention include the embodiments of FIGS. 4 to 8. FIG. 4 is a top view showing an example of toughened glass 11 in which the opening portion 8 has been formed. FIG. 5 is a top view showing an example of a front panel in which the decorative layer 2a and the mask layer 2b have been formed. FIG. 6 is a top view showing an example of a front panel in which the first transparent electrode patterns 3 have been formed. FIG. 7 is a top view showing an example of a front panel in which the first transparent electrode patterns 3 and the second transparent electrode patterns 4 have been formed. FIG. 8 is a top view showing an example of a front panel in which the conductive element 6 different from the first and second transparent electrode patterns has been formed. These are merely drawings showing examples of embodiments of the above description, and the scope of the present invention is not limited to these drawings.

<(1) Decorative Layer>

In the manufacturing method of the present invention, at least the (1) decorative layer is formed by using the transfer film of the present invention.

In the capacitive input device having the opening portion 8 constituted as shown in FIG. 2, if the decorative layer 2a shown in FIG. 1, the mask layer, which will be described later, and the like are formed by using the transfer film of the present invention or the transfer film having a photocurable resin layer, which will be described later, the resist component does not leak from the opening portion even in the substrate (front panel) having the opening portion. Particularly, in the decorative layer, in which light-shielding patterns need to be formed to the position very close to the boundary of the front panel, or in the mask layer, the resist component does not stick out of the edge of the glass. Consequentially, the back of the substrate is not contaminated, and a touch panel having an advantage of being able to be made into a thin-layer/lightweight touch panel can be manufactured by simple steps.

A method for forming the decorative layer by using the transfer film of the present invention will be described. Generally, when a transfer film is used, as long as the colored layer thereof contains a photocurable resin, the decorative layer can be formed by a common photolithography method. Herein, the colored layer of the transfer film of the present invention may or may not contain a photocurable resin, and in any cases, by a transfer method performed by half cutting or die cutting described below, the decorative layer can be formed by using the transfer film of the present invention.

Figure 10:
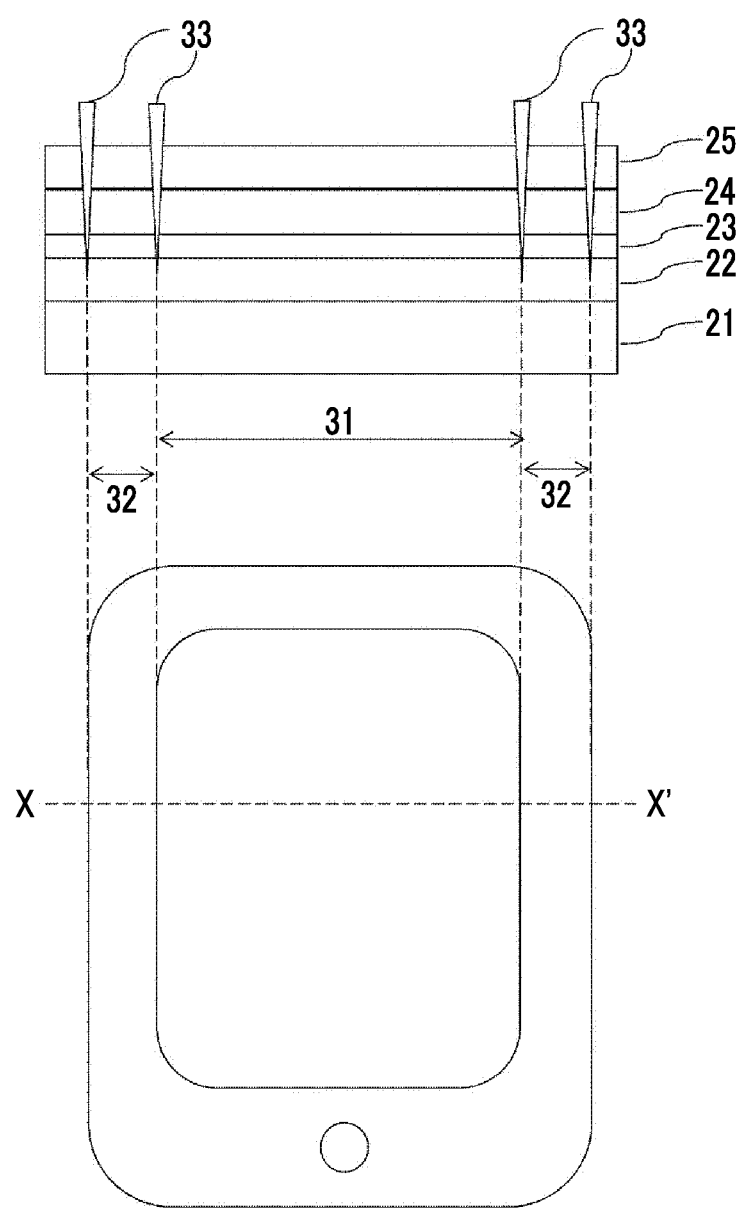
FIG. 10 is a view for illustrating a half-cutting method of a transfer film used for forming a decorative layer within an X-X' cross-section of a front panel.
Figure 11:
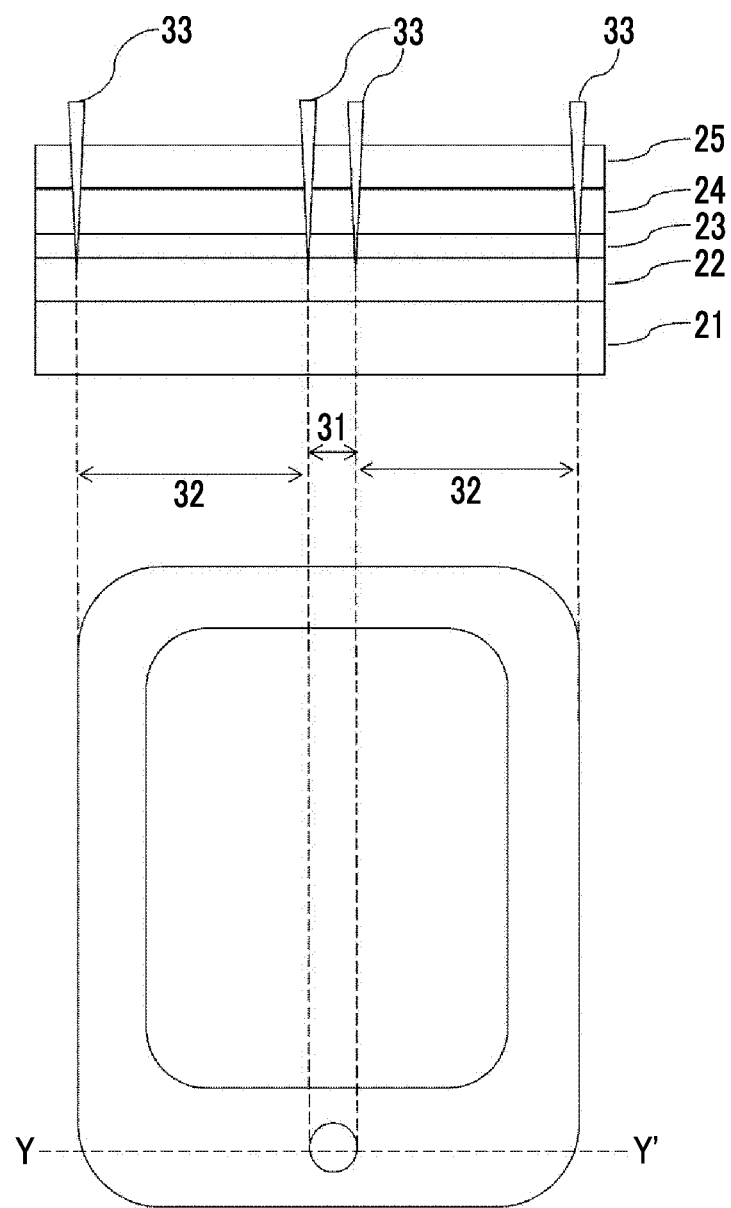
FIG. 11 is a view for illustrating a half-cutting method of a transfer film used for forming a decorative layer within a Y-Y' cross-section of a front panel.
Figure 12:
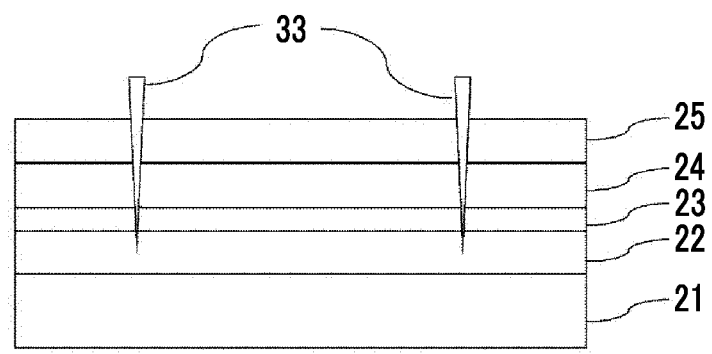
FIG. 12 is a view for illustrating a half-cutting method used for evaluating pre-cutting properties.

In the transfer method performed by half cutting, first, as shown in FIGS. 10 to 12, the boundary between an image portion 32 and a non-image portion 31 of the decorative layer is precut by using a razor or the like; the protective film, the decorative layer, and the intermediate layer of the non-image portion 31 are then removed by using a tape; the protective film of the image portion 32 is also removed in the same manner; and the patterns of the decorative layer are transferred to the substrate.

Figure 13:
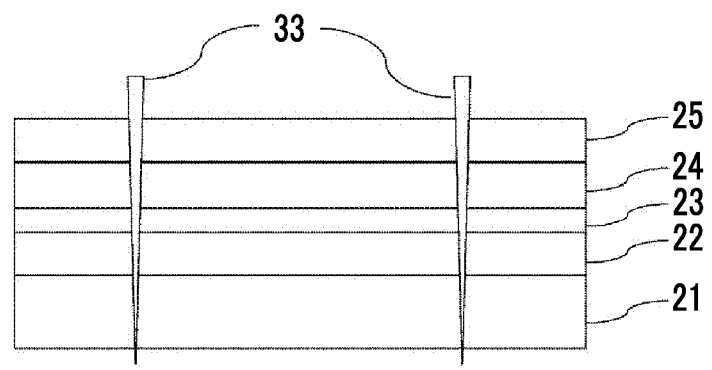
FIG. 13 is a view for illustrating a die-cutting method of a transfer film used for forming a decorative layer within the X-X' cross-section of the front panel.
Figure 14:
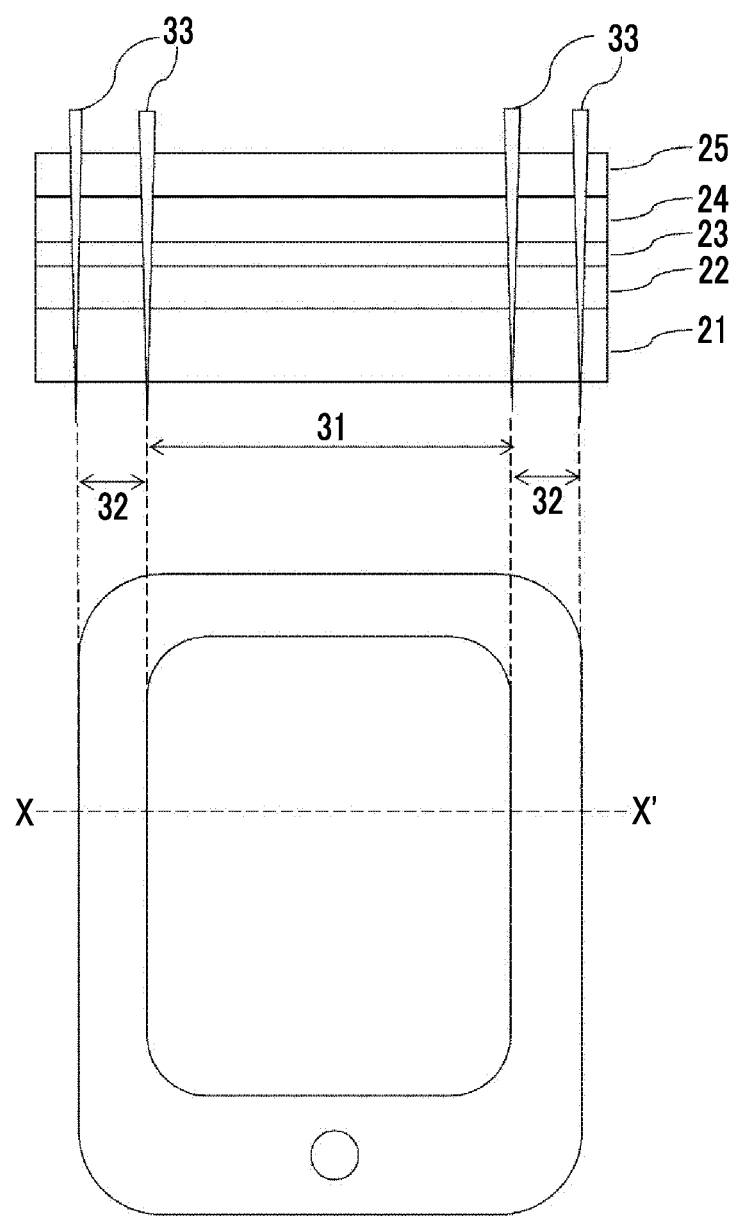
FIG. 14 is a view for illustrating a die-cutting method of a transfer film used for forming a decorative layer within the Y-Y' cross-section of the front panel.
Figure 15:
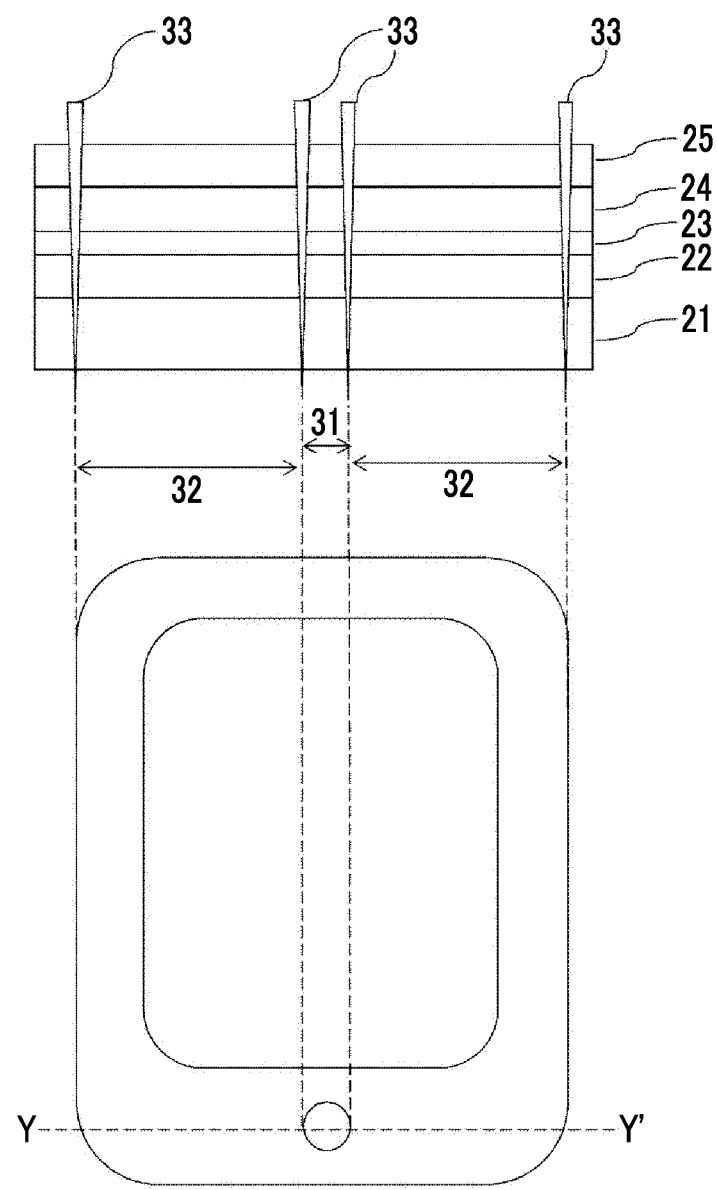
FIG. 15 is a view for illustrating a die-cutting method used for evaluating pre-cutting properties.

Meanwhile, in the transfer method performed by die cutting, first, as shown in FIGS. 13 to 15, the boundary between the image portion 32 and the non-image portion 31 of the decorative layer is precut by using a razor or the like such that all layers are penetrated; the colored layer (non-image portion 31) in a portion of the area is then removed; the protective film of the remaining image portion 32 is subsequently removed by using a tape; and the patterns of the decorative layer are transferred to the substrate.

Thereafter, by development, the thermoplastic resin layer and the intermediate layer are removed, and in this manner, the patterns of the decorative layer can be formed.

If necessary, known development equipment such as a brush or a high-pressure jet may be used in combination. After the development, if necessary, post-exposure or post-baking may be performed, and it is preferable to perform post-baking.

Furthermore, in order to improve adhesiveness of the decorative layer by lamination in a transfer step performed later, the non-contact surface of the substrate (front panel) may be subjected to surface treatment in advance. The surface treatment is preferably performed as surface treatment using a silane compound (silane coupling treatment). As the silane coupling agent, compounds having functional groups interacting with a photosensitive resin are preferable. For example, as a silane coupling solution, a 0.3% by mass aqueous (N-β(aminoethyl)γ-aminopropyltrimethoxyxilane) solution (trade name: KBM603, manufactured by Shin-Etsu Chemical Co., Ltd.) is sprayed to the substrate for 20 seconds by shower, and then the substrate is washed with pure water by shower. Thereafter, the substrate is heated to cause reaction. At this time, a heating tank may be used, and if the substrate is preheated by a laminator, the reaction can be accelerated.

Regarding a case of forming a permanent material by using the transfer film of the present invention, the patterning method using the transfer film of the present invention will be described with an example of a method for forming the decorative layer.

The method for forming a decorative layer preferably includes a half cutting step, that is, a step of making cuts, which penetrate the colored layer but do not penetrate the temporary support, in a portion of the transfer film, a step of removing the colored layer in at least a portion of the area surrounded by the cuts, and a step of forming the (1) decorative layer by using the transfer film from which the colored layer in a portion of the area has been removed.

Moreover, the method for forming the decorative layer preferably includes a die-cutting step, that is, a step of making cuts, which penetrate the temporary support from the colored layer, in a portion of the transfer film, and a step of forming the (1) decorative layer by using the transfer film from which the colored layer in a portion of the area has been removed.

The step of making cuts, which penetrate a portion of the colored layer but do not penetrate the temporary support, in a portion of the transfer film or the step of making cuts, which penetrate the temporary support from the colored layer, is also called a step of precutting the image portion to be transferred within the colored layer. Herein, the operation of making cuts which penetrate the colored layer but do not penetrate the temporary support is also called half-cutting. The operation of making cuts penetrating the temporary support from the colored layer is also called die-cutting.

The step of removing the colored layer in at least a portion of the area surrounded by the cuts is also called a step of removing the colored layer of the non-image portion not to be transferred.

Furthermore, when the transfer film of the present invention includes the protective film, the intermediate layer, or the thermoplastic resin layer, the step of removing the colored layer in at least a portion of the area surrounded by the cuts is preferably a step of removing the protective film and the colored layer of the non-image portion, and the protective film of the image portion.

The step of forming the (1) decorative layer by using the transfer film from which the colored layer in a portion of the area has been removed is called a transfer step of transferring the colored layer of the image portion onto the substrate.

In addition, when the transfer film of the present invention includes the protective film, the intermediate layer, or the thermoplastic resin layer, the step of forming the (1) decorative layer by using the transfer film from which the colored layer in a portion of the area has been removed is preferably a transfer step of transferring the colored layer of the image portion of the transfer film, from which the protective film has been removed, onto the substrate.

In this case, the step of forming the (1) decorative layer by using the transfer film from which the colored layer in at least a portion of the area has been removed preferably includes a step of peeling the temporary support having been transferred onto the substrate.

In this case, the step of forming the (1) decorative layer by using the transfer film, from which the colored layer in at least a portion of the area has been removed, preferably includes a step of removing the thermoplastic rein layer and the intermediate layer.

The manufacturing method of the present invention is more preferably a method including a step of precutting the image portion to be transferred within the colored layer of the transfer film of the present invention; a step of removing the protective film and the colored layer of the non-image portion, and the protective film of the image portion; a transfer step of transferring the colored layer of the image portion of the transfer film, from which the protective film has been removed, onto the substrate; a step of peeling the temporary support having been transferred onto the substrate; and a step of removing the thermoplastic resin layer and the intermediate layer.

Furthermore, when the colored layer has a photocurable resin layer, examples of the method for forming the decorative layer include a method including a protective film removing step of removing the protective film from the transfer film, and a transfer step of transferring the photocurable resin layer of the photosensitive transfer material, from which the protective film has been removed, onto the substrate. In this case, the method preferably further includes, after the transfer step, a step of subjecting the transferred photocurable resin layer to post-exposure.

(Precutting Step)

In the manufacturing method of the present invention, if the common photolithography method is not used for forming an image, an image portion needs to be formed in the colored layer before transfer.

The type of precutting include a step (half-cutting step) of making cuts, which penetrate the colored layer but do not penetrate the temporary support, in a portion of the transfer film, and a step (die-cutting step) of making cuts, which penetrate the temporary support from the colored layer, in a portion of the transfer film.

(i) Half-Cutting Step

First, the half-cutting step will be described below.

The method for making cuts is not particularly limited. The cuts can be made by any method using a blade, a laser, and the like, but it is preferable to make the cuts by using a blade. Furthermore, the structure of the blade is not particularly limited.

When the transfer film is constituted with, for example, the temporary support, the thermoplastic resin layer, the intermediate layer, the colored layer, and the protective film laminated on one another in this order, if cuts, which penetrate the protective film, the colored layer, and the intermediate layer from the top of the protective film and reaches a portion of the thermoplastic resin layer, are made by using a blade or a laser, the image portion to be transferred can be separated from the non-image portion not to be transferred.

—Step of Removing Colored Layer of Non-Image Portion—

In order to selectively transfer the image portion of the colored layer precut by half-cutting to the substrate, it is necessary to devise methods for preventing the transfer of the non-image portion. One of the methods is a method of removing the colored layer of the non-image portion before transfer, which is a method of removing the protective film and then peeling the colored layer and the intermediate layer of the non-image portion at the same time. The other method is a method of peeling the protective film on the non-image portion, then peeling the colored layer and the intermediate layer at the same time, and peeling the protective film on the image portion. From the viewpoint of protecting the image portion of the colored layer until just prior to transfer, the latter method is preferable.

(ii) Die-Cutting Step

Next, the step (die-cutting step) of making cuts, which penetrate the temporary support from the colored layer, in a portion of the transfer film will be described below.

Similarly to the half-cutting, the method of making cuts is not particularly limited. The cuts can be made by any method using a blade, a laser, and the like, but it is preferable to make the cuts by using a blade. Furthermore, the structure of the blade is not particularly limited.

When the transfer film is constituted with, for example, the temporary support, the thermoplastic resin layer, the intermediate layer, the colored layer, and the protective film laminated on one another in this order, for example, if cuts, which penetrate the protective film, the colored layer, the intermediate layer, the thermoplastic resin layer, and the temporary support from the top of the protective film, are made by using a blade or a laser, the image portion to be transferred can be separated from the non-image portion not to be transferred.

(Transfer Step)

The transfer step is a step of transferring the colored layer of the transfer film, from which the protective film has been removed, onto the substrate.

At this time, it is preferable to use a method of laminating the colored layer of the transfer film on the substrate and then removing the temporary support.

The transfer (bonding) of the colored layer onto the substrate surface is performed by layering the colored layer on the substrate surface and applying pressure and heat to the resultant. For bonding, it is possible to use known laminators such as a laminator, a vacuum laminator, and an auto cut laminator which can further improve productivity.

(Step of Removing Thermoplastic Resin Layer and Step of Removing Intermediate Layer)

The step of removing the thermoplastic resin layer and the intermediate layer can be performed by using an alkaline developer which is generally used in the photolithography method. The alkaline developer is not particularly limited, and known developers such as those described in JP1993-72724A (JP-H05-72724A) can be used. As the alkaline developer, developers dissolving the decorative layer are preferable. For example, developers containing a compound having a pKa of 7 to 13 at a concentration of 0.05 mol/L to 5 mol/L are preferable, and a small amount of organic solvent mixable with water may be added thereto. Examples of the organic solvent mixable with water include methanol, ethanol, 2-propanol, 1-propanol, butanol, diacetone alcohol, ethylene glycol monomethyl ether, ethylene glycol monoethyl ether, ethylene glycol mono-n-butyl ether, benzyl alcohol, acetone, methyl ethyl ketone, cyclohexanone, $\epsilon$-caprolactone, $\gamma$-butyrolactone, dimethylformamide, dimethylacetamide, hexamethylphosphoramide, ethyl lactate, methyl lactate, $\epsilon$-caprolactam, N-methylpyrrolidone, and the like. The concentration of the organic solvent is preferably 1% by mass to 30% by mass.

Moreover, a known surfactant can be further added to the alkaline developer. The concentration of the surfactant is preferably 0.01% by mass to 10% by mass.

The step of removing the thermoplastic resin layer and the intermediate layer may be performed by any of the methods using paddle, shower, shower and spin, dipping, and the like. Specifically, in the method using shower, the thermoplastic resin layer or the intermediate layer can be removed by spraying the developer by shower. Moreover, it is preferable to spray a washer or the like by shower after development and remove the residue by rubbing the film with a brush or the like. The temperature of the developer is preferably 20° C. to 40° C., and pH thereof is preferably 8 to 13.

(Post-Baking Step)

The manufacturing method of the present invention preferably includes a post-baking step after the transfer step, and more preferably includes a step of performing post-baking after the step of removing the thermoplastic resin layer and the intermediate layer.

From the viewpoint of satisfying both the whiteness and productivity, in the manufacturing method of the present invention, the (1) decorative layer is preferably formed by heating the colored layer of the transfer film of the present invention at 180° C. to 300° C. in an environment of 0.08 atm to 1.2 atm.

In the post-baking step, heating is preferably performed in an environment of 0.5 atm or greater. The heating is more preferably performed in an environment of 1.1 atm or less, and particularly preferably performed in an environment of 1.0 atm or less. Furthermore, it is particularly preferable to perform the heating in an environment of about 1 atm (atmospheric pressure), since the production cost can be reduced without using a special pressure-reducing device. Herein, conventionally, when the (1) decorative layer is formed by curing by means of heating, the heating is performed in an environment in which the pressure is reduced to an extremely low level so as to reduce the oxygen concentration and to maintain the whiteness after baking. However, if the transfer film of the present invention is used, the whiteness of the decorative layer can be increased even after baking is performed within the aforementioned pressure range.

The temperature of the post-baking is preferably 200° C. to 280° C., and particularly preferably 220° C. to 260° C.

The time of the post-baking is preferably 20 minutes to 150 minutes, and particularly preferably 30 minutes to 100 minutes.

The post-baking may be performed either in an air environment or in a nitrogen-purged environment. However, it is particularly preferable to perform the post-baking in an air environment, since the production cost can be reduced without using a special pressure-reducing device.

(Other Steps)

The manufacturing method of the present invention may further include other steps such as a post-exposure step.

When the colored layer has the photocurable resin layer, the manufacturing method preferably includes a post-exposure step for forming the decorative layer. The post-exposure step may be performed only in the direction of the surface of the colored layer that comes into contact with the substrate or only in the direction of the surface of the colored layer that does not come into contact with the transparent substrate. Alternatively, the post-exposure step may be formed in both the directions.

As the step of removing the thermoplastic resin layer and the intermediate layer and other steps, for example, the method described in paragraphs <0035> to <0051> of JP2006-23696A can be suitably used in the present invention.

<(2) Mask Layer>

In the manufacturing method of the present invention, at least one of the elements including the mask layer 2b, the first transparent electrode patterns 3, the second transparent electrode patterns 4, the insulating layer 5, the conductive element 6, and if necessary, the transparent protective layer 7 is preferably formed by using the transfer film having the temporary support and the curable resin layer in this order. Specifically, the manufacturing method preferably includes a step of forming at least one of the elements including the mask layer 2b, the first transparent electrode patterns 3, the second transparent electrode patterns 4, the insulating layer 5, the conductive element 6, and if necessary, the transparent protective layer 7, by transferring the curable resin layer of the transfer film. Herein, as the transfer film having the temporary support and the curable resin layer in this order, the transfer film of the present invention or a transfer film having a photocurable resin layer obtained by laminating the photocurable resin layer on the temporary support is preferable. Furthermore, the transfer film having the temporary support and the curable resin layer in this order more preferably includes the aforementioned thermoplastic resin layer as a layer included in the transfer film of the present invention, between the temporary support and the curable resin layer. Herein, the "curable resin layer" in the transfer film having the temporary support and the curable resin layer in this order refers to the "colored layer" in the transfer film of the present invention, or the "photocurable resin layer" in the transfer film having the photocurable resin layer.

At least one of the elements including the mask layer 2b, the first transparent electrode patterns 3, the second transparent electrode patterns 4, the insulating layer 5, the conductive element 6, and if necessary, the transparent protective layer 7 is preferably formed by using the transfer film having the photocurable resin layer, and particularly preferably formed by using the transfer film having the photocurable resin layer that has the temporary support, the thermoplastic resin layer, and the photocurable resin layer in this order.

For example, for forming a black mask layer 2, the transfer film of the present invention that has a black decorative layer as the decorative layer or the transfer film having a photocurable resin layer that has a black photocurable resin layer is used, and the black decorative layer is transferred onto the surface of the front panel 1, whereby the black mask layer can be formed.

Furthermore, for forming the mask layer 2b requiring light-shielding properties, if a transfer film having a specific layer constitution in which the thermoplastic resin layer is disposed between the photocurable resin layer and the temporary support is used, it is possible to prevent bubbles from being generated at the time of laminating the transfer film and to form the high-quality mask layer 2b or the like not causing light leakage.

When the colored layer of the transfer film of the present invention or the photocurable resin layer of the transfer film having the photocurable resin layer is used as the mask layer, a colorant can be used for the colored layer of the transfer film of the present invention or for the transfer film having the photocurable resin layer. In the present invention, known colorants (organic pigments, inorganic pigments, dyes, and the like) can be suitably used as the colorant. Moreover, in the present invention, a mixture or the like consisting of pigments of white, black, red, blue, green, and the like can be used.

Particularly, when the mask layer is used as a black mask layer, from the viewpoint of optical density, it is preferable to use a black colorant. Examples of the black colorant include carbon black, titanium carbon, iron oxide, titanium oxide, graphite, and the like, and among these, carbon black is preferable.

In order to use the mask layer as a mask layer of other colors, the pigments or dyes described in paragraphs <0183> to <0185> of JP4546276B and the like may be used by being mixed with each other. Specifically, the pigments or dyes described in paragraphs <0038> to <0054> of JP2005-

17716A, the pigments described in paragraphs <0068> to <0072> of JP2004-361447A, the colorants described in paragraphs <0080> to <0088> of JP2005-17521A, and the like can be suitably used.

In the present invention, from the viewpoint of dispersion stability, the number average particle size of the colorant used for layers other than the decorative layer is preferably 0.001 μm to 0.1 μm, and more preferably 0.01 μm to 0.08 μm. Herein, the "particle size" refers to the diameter obtained when electron microscope images of the particles are converted into circles having the same area. Furthermore, "number average particle size" refers to a value determined by measuring the particle size of a large number of particles and calculating the average of 100 particles.

The transfer film having the photocurable resin layer may include the protective film or the intermediate layer, in addition to the photocurable resin layer, the temporary support, and the thermoplastic resin layer. The preferable constitution of the respective layers and the order of laminating the respective layers are the same as described above, except that the photocurable resin layer is used instead of the colored layer in the transfer film of the present invention.

The photocurable resin layer of the transfer film having the photocurable resin layer is preferably constituted as below.

The monomer used in the photocurable resin layer is not particularly limited as long as it is not against the gist of the present invention, and known polymerizable compounds can be used.

As the polymerizable compounds, the polymerizable compounds described in paragraphs <0023> and <0024> of JP4098550B can be used.

The binder used in the photocurable resin layer is not particularly limited as long as it is not against the gist of the present invention, and known polymerizable compounds can be used.

When the transfer film having the photocurable resin layer is a negative material, the photocurable resin layer preferably contains an alkali-soluble resin, a polymerizable compound, a polymerization initiator, or a polymerization-initiating compound. In addition, a colorant, an additive, and the like are used, but the present invention is not limited thereto.

As the alkali-soluble resin contained in the photocurable resin layer of the transfer film having the photocurable resin layer, the polymers described in paragraph <0025> of JP2011-95716A and paragraphs <0033> to <0052> of JP2010-237589A can be used.

When the transfer film having the photocurable resin layer is a positive material, for example, the material described in JP2005-221726A and the like are used for the photocurable resin layer, but the present invention is not limited thereto.

As the photopolymerization initiator used for the photocurable resin layer, the polymerizable compounds described in paragraphs <0031> to <0042> of JP2011-95716A can be used.

—Additives—

Furthermore, additives may be used for the photocurable resin layer. Examples of the additives include the surfactants described in paragraph <0017> of JP4502784B and in paragraphs <0060> to <0071> of JP2009-237362A, the thermopolymerization inhibitors described in paragraph <0018> of JP4502784B, and other additives described in paragraphs <0058> to <0071> of JP2000-310706A.

—Solvent—

Moreover, as the solvent used for manufacturing the transfer film having the photocurable resin layer by coating, the solvents described in paragraphs <0043> and <0044> of JP2011-95716A can be used.

Up to now, the case in which the transfer film having the photocurable resin layer is a negative material has been mainly described. However, the photosensitive film may be a positive material.

(Viscosity of Photocurable Resin Layer)

The viscosity of the photocurable resin layer measured at 100° C. is preferably within a range of 2,000 Pa·sec to 50,000 Pa·sec, and preferably satisfies the following expression. Viscosity of thermoplastic resin layer <Viscosity of photocurable resin layer Herein, the viscosity of each layer can be measured in the following manner. A coating solution for thermoplastic resin layer or for photocurable resin layer is dried under the atmospheric pressure or under reduced pressure so as to remove a solvent and prepare a sample for measurement. Thereafter, for example, by using Vibron (DD-III model: manufactured by Toyo Baldwin Co., Ltd.) as a measurement instrument, the viscosity is measured under the conditions of a measurement start temperature of 50° C., a measurement end temperature of 150° C., a temperature increase rate of 5° C./min, and a vibration frequency of 1 Hz/deg. The value measured at 100° C. can be used as the viscosity.

<(3) A Plurality of First Transparent Electrode Patterns Composed of a Plurality of Pad Portions being so Connected to One Another Through Connection Portions as to Extend in a First Direction>

In the manufacturing method of a capacitive input device of the present invention, at least one of the first transparent electrode patterns, the second transparent electrode patterns, and the conductive element is preferably formed by performing etching treatment on a transparent conductive material by using an etching pattern formed by using the transfer film having the temporary support and the curable resin layer in this order, and is more preferably formed by performing etching treatment on a transparent conductive material by using an etching pattern formed by using the transfer film having the temporary support, the thermoplastic resin layer, and the curable resin layer in this order.

Furthermore, at least one of the first transparent electrode patterns, the second transparent electrode patterns, and the conductive element even more preferably uses an etching pattern formed by using the transfer film having the photocurable resin layer that has the temporary support and the photocurable resin layer, and particularly preferably uses an etching pattern formed by using the transfer film having the photocurable resin layer that has the temporary support, the thermoplastic resin layer, and the photocurable resin layer in this order.

Meanwhile, in the manufacturing method of a capacitive input device of the present invention, at least one of the first transparent electrode patterns, the second transparent electrode patterns, and the conductive element is preferably formed by using the transfer film having the temporary support and the conductive curable resin layer in this order, and more preferably formed by using the transfer film having the temporary support, the thermoplastic resin layer, and the conductive curable resin layer in this order. The method in which at least one of the first transparent electrode pattern, the second transparent electrode pattern, and the conductive element is formed by using the transfer film having the temporary support and the conductive curable resin layer in this order is specifically a method in which at least one of the first transparent electrode patterns, the second transparent electrode patterns, and the conductive element is formed by transferring the conductive curable resin layer of the transfer film having the temporary support and the conductive curable resin layer in this order.

That is, the first transparent electrode patterns 3 are preferably formed by etching treatment or formed by using the transfer film having the conductive curable resin layer.

(Etching Treatment)

For forming the first transparent electrode patterns 3 by etching treatment, first, on the non-contact surface of the front panel 1 on which the mask layer 2b or the like has been formed, a transparent electrode layer of ITO or the like is formed by sputtering. Next, on the transparent electrode layer, by using a transfer film, which is the same as the transfer film used for forming the mask layer except that this transfer film has a photocurable resin layer for etching as the photocurable resin layer, an etching pattern is formed by means of exposure and development. Thereafter, the transparent electrode layer is etched so as to pattern the transparent electrode, and the etching pattern is removed, whereby the first transparent electrode patterns 3 or the like can be formed.

Even when the transfer film having the photocurable resin layer is used as an etching resist (etching pattern), resist patterns can be obtained by the same method as described above. In the etching treatment, etching and resist stripping can be performed by known methods described in paragraphs <0048> to <0054> of JP2010-152155A and the like.

Examples of the etching method include a generally used wet etching method in which the film is dipped into an etchant. The etchant used for wet etching may be appropriately selected from among acidic etchants and alkaline etchants in accordance with the subject to be etched. Examples of the acidic etchants include an aqueous solution containing only an acidic component such as hydrochloric acid, sulfuric acid, hydrofluoric acid, and phosphoric acid, a mixed solution consisting of an acidic component and ferric chloride, ammonium fluoride, or a salt such as potassium permanganate, and the like. As the acidic component, a combination of a plurality of acidic components may be used. Examples of the alkaline etchants include an aqueous solution containing only an alkaline component such as sodium hydroxide, potassium hydroxide, ammonia, organic amine, or a salt of organic amine like tetramethyl ammonium hydroxide, an aqueous mixed solution consisting of an alkaline component and a salt such as potassium permanganate, and the like. As the alkaline component, a combination of a plurality of alkaline components may be used.

The temperature of the etchant is not particularly limited but is preferably 45° C. or less. If the resin pattern used as an etching mask (etching pattern) in the present invention is formed by using the aforementioned decorative layer, the resin pattern exhibits particularly excellent resistance to the acidic and alkaline etchants in the aforementioned temperature range. Accordingly, the resin pattern is prevented from being peeled in the process of etching, and the portion free of the resin pattern is selectively etched.

After the etching, if necessary, in order to prevent line contamination, a washing step and a drying step may be performed. In the washing step, for example, the substrate may be washed with pure water at room temperature for 10 seconds to 300 seconds, and in the drying step, the substrate may be dried by using an air blower by appropriately regulating the air blow pressure (about 0.1 kg/cm$^2$ to 5 kg/cm$^2$).

The peeling method of the resin pattern is not particularly limited. Examples of the method include a method of dipping the substrate in a remover being stirred at 30° C. to 80° C. preferably at 50° C. to 80° C., for 5 minutes to 30 minutes. As described above, the resin pattern used as the etching mask in the present invention exhibits excellent chemical resistance at a temperature equal to or less than 45° C. However, the resin pattern has properties in which it swells by the alkaline remover when the temperature of the chemical becomes 50° C. or higher. Due to such properties, the resin pattern has an advantages that the time taken for the peeling step is shortened if the remover of 50° C. to 80° C. is used for the peeling step, and the resin pattern is peeled leaving a small amount of residues. That is, if the temperature of the chemical is varied in the etching step and the peeling step, the resin pattern used as the etching mask in the present invention exhibits excellent chemical resistance in the etching step and excellent peelability in the peeling step. Consequentially, both the chemical resistance and peelability, which are conflicting properties, can be satisfied at the same time.

Examples of the remover include those obtained by dissolving an inorganic alkaline component such as sodium hydroxide or potassium hydroxide or an organic alkaline component such as a tertiary amine or a quaternary ammonium salt in water, dimethyl sulfoxide, N-methylpyrrolidone, or a mixed solution of these. The resin pattern may be peeled by means of a spray method, a shower method, a paddle method, or the like by using the remover.

(Method of Using Transfer Film Having Conductive Curable Resin Layer)

In addition, when the first transparent electrode patterns, the second transparent electrode patterns, and other conductive members are formed by using the transfer film having the temporary support and the curable resin layer as a lift-off material, as the transfer film, for example, the transfer film of the present invention and the transfer film having the photocurable resin layer can be used. Even in this case, the transfer film having the temporary support and the curable resin layer preferably has the thermoplastic resin layer between the temporary support and the curable resin layer. In this case, patterning is performed by using the transfer film of the present invention or the transfer film having the photocurable resin layer; a transparent conductive layer is then formed on the whole surface of the substrate; and then for each of the transparent conductive layers deposited, the colored layer in the transfer film of the present invention or the photocurable resin layer in the transfer film having the photocurable resin layer is dissolved and removed, whereby an intended transparent conductive layer pattern can be obtained (lift-off method).

When the first transparent electrode patterns 3 are formed by using the transfer film having the conductive curable resin layer, the patterns can be formed by transferring the conductive curable resin layer onto the surface of the front panel 1.

If the first transparent electrode patterns 3 are formed by using the transfer film having the conductive curable resin layer, even in the substrate (front panel) having an opening portion, the resist component does not leak from the opening portion; the back of the substrate is not contaminated; and a touch panel having an advantage of being able to be made into a thin-layer/lightweight touch panel can be manufactured by simple steps.

Furthermore, if the transfer film having a specific layer constitution, in which the thermoplastic resin layer is disposed between the conductive curable resin layer and the temporary support, is used for forming the first transparent electrode patterns 3, it is possible to prevent air bubbles from being generated at the time of laminating the transfer film and to form the first transparent electrode patterns 3 excellent in conductivity and exhibiting small resistivity.

Moreover, when the transfer film has the conductive curable resin layer, conductive fiber and the like are added to the conductive curable resin layer.

~Conductive Curable Resin Layer (Conductive Fiber)~

When the transfer film laminated with the conductive curable resin layer is used for forming the transparent electrode pattern or other conductive elements, the following conductive fiber and the like can be used for the conductive curable resin layer.

The structure of the conductive fiber is not particularly limited and can be appropriately selected according to the purpose. However, the structure is preferably either a solid structure or a hollow structure.

Herein, the fiber having a solid structure is called a "wire" in some cases, and the fiber having a hollow structure is called a "tube" in some cases. Moreover, the conductive fiber having an average minor axis length of 5 nm to 1,000 nm and an average major axis length of 1 μm to 100 μm is called a "nanowire" in some cases.

Furthermore, the conductive fiber having an average minor axis length of 1 nm to 1,000 nm and an average major axis length of 0.1 μm to 1,000 μm and having a hollow structure is called a "nanotube" in some cases.

The material of the conductive fiber is not particularly limited as long as the material exhibits conductivity and can be appropriately selected according to the purpose. The material is preferably at least one of the metals and carbon, and among these, at least one of the metal nanowire, metal nanotube, and carbon nanotube is particularly preferable as the conductive fiber.

—Metal Nanowire—
—Metal—

The metal of the metal nanowire is not particularly limited. For example, at least one kind of metal selected from a group consisting of metals of the fourth period, the fifth period, and the sixth period of the long periodic table (IUPAC 1991) is preferable; at least one kind of metal selected from group 2 to group 14 is more preferable; and at least one kind of metal selected from group 2, group 8, group 9, group 10, group 11, group 12, group 13, and group 14 is even more preferable. The metal nanowire particularly preferably contains these metals as a main component.

Examples of the metal include copper, silver, gold, platinum, palladium, nickel, tin, cobalt, rhodium, iridium, iron, ruthenium, osmium, manganese, molybdenum, tungsten, niobium, tantalum, titanium, bismuth, antimony, lead, an alloy of these, and the like. From the viewpoint of excellent conductivity, a metal nanowire containing silver as a main component among these metals or a metal nanowire containing an alloy composed of silver and other metals is preferable.

When the metal nanowire contains silver as a main component, it means that the content of the silver in the metal nanowire is 50% by mass or more and preferably 90% by mass or more.

Examples of the metal used in the form of an alloy with silver include platinum, osmium, palladium, iridium, and the like. One kind of these metals may be used singly, or two or more kinds thereof used concurrently.

—Shape—

The shape of the metal nanowire is not particularly limited and can be appropriately selected according to the purpose. For example, the metal nanowire can have any of the shape of cylinder, rectangle, and column having a polygonal cross-section. However, if it is used for the purpose requiring a high degree of transparency, the metal nanowire preferably has a cylindrical shape or a shape having cross-sectional shape with rounded corner.

The cross-sectional shape of the metal nanowire can be analyzed by coating a water dispersion of metal nanowire onto a substrate and observing the cross-section by using a transmission electron microscope (TEM).

Figure 9:
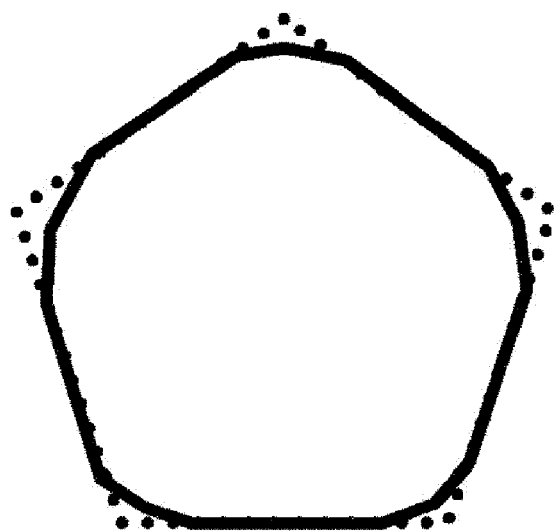
FIG. 9 is a view for illustrating the cross-section of a metal nanowire.

Regarding the corner of the cross-section of the metal nanowire, when each side of the cross-section is extended, there is a point that meets perpendicular lines drawn from the sides adjacent to each other, and at this time, the portion in the vicinity of the point is the corner. Moreover, the "each side of the cross-section" refers to a straight line by which the corners adjacent to each other are connected to each other. In this case, a ratio of the "outer circumferential length of the cross-section" to the total length of the "each side of the cross-section" is taken as sharpness. For example, in the cross-section of the metal nanowire shown in FIG. 9, the sharpness can be represented by the ratio between the outer circumferential length of the cross-section indicated by a solid line and the outer circumferential length of the pentagon indicated by a dotted line. If the sharpness of a cross-sectional shape is 75% or less, the shape is defined as a round cross-sectional shape. The sharpness is preferably 60% or less, and more preferably 50% or less. If the sharpness exceeds 75%, electrons may be localized in the corner, or plasmon absorption may be accelerated, and accordingly, transparency deteriorates in some cases since yellow tinge remains. In addition, linearity of the edge portion of the pattern deteriorates, and thus wobbling occurs in some cases. The lower limit of the sharpness is preferably 30%, and more preferably 40%.

—Diameter of Average Minor Axis Length and Average Major Axis Length—

The average minor axis length (referred to as "average manor axis diameter" or "average diameter" in some cases) of the metal nanowire is preferably 150 mm or less, more preferably 1 nm to 40 nm, even more preferably 10 nm to 40 nm, and particularly preferably 15 nm to 35 nm.

If the average minor axis length is less than 1 nm, oxidation resistance deteriorates, and thus durability deteriorates in some cases. If it exceeds 150 nm, light is scattered due to the metal nanowire, and thus sufficient transparency cannot be obtained in some cases.

In order to measure the average minor axis length of the metal nanowire, 300 metal nanowires are observed with a transmission electron microscope (TEM; manufactured by JEOL Ltd., JEM-2000FX), and from the average thereof, the average minor axis length of the metal nanowires is determined. When the cross sectional surface of the metal nanowire is not circular, the greatest length is taken as the minor axis.

The average major axis length (also referred to as "average length" in some cases) of the metal nanowire is preferably 1 μm to 40 μm, more preferably 3 μm to 35 μm, and even more preferably 5 μm to 30 μm.

If the average major axis length is less than 1 μm, it is difficult to form a dense network, and thus sufficient conductivity cannot be obtained in some cases. If it exceeds 40 μm, the metal nanowire is tangled since it is too long, and thus aggregates are generated in the manufacturing process in some cases.

In order to measure the average major axis length of the metal nanowire, 300 metal nanowires are observed with a transmission electron microscope (TEM; manufactured by JEOL Ltd, JEM-2000FX), and from the average thereof, the average major axis length of the metal nanowires is determined. When the metal nanowire is curved, a circle having the curve as an arc is imagined, and the value calculated from the radius and curvature thereof is taken as the major axis length.

From the viewpoint of process suitability including stability of the coating solution, drying at the time of coating, and development time at the time of patterning, the thickness of the conductive curable resin layer is preferably 0.1 μm to 20 μm, more preferably 0.5 μm to 18 μm, and particularly preferably 1 μm to 15 μm. From the viewpoint of the conductivity and stability of the coating solution, the content of the conductive fiber with respect to the total solid content of the conductive curable resin layer is preferably 0.01% by mass to 50% by mass, more preferably 0.05% by mass to 30% by mass, and particularly preferably 0.1% by mass to 20% by mass.

<(4) A Plurality of Second Transparent Electrode Patterns which is Electrically Insulated from the First Transparent Electrode Patterns and Composed of a Plurality of Pad Portions Extending in a Direction Crossing the First Direction>

The second transparent electrode patterns 4 can be formed by the etching treatment or by using the transfer film having the conductive curable resin layer. Preferable embodiments at this time are the same as in the formation method of the first transparent electrode patterns 3.

<(5) Insulating Layer which Electrically Insulates the First Transparent Electrode Patterns from the Second Transparent Electrode Patterns>

For forming the insulating layer 5, by using the transfer film of the present invention that has an insulative colored layer as the colored layer or using the transfer film having the photocurable resin layer that has an insulative photocurable resin layer as the photocurable resin layer, the insulative colored layer or the photocurable resin layer is transferred onto the surface of the front panel 1 on which the first transparent electrode patterns have been formed, whereby the insulating layer 5 can be formed.

When the insulating layer is formed by using the transfer film, from the viewpoint of maintaining the insulating properties, the thickness of the insulating layer is preferably 0.1 µm to 5 µm, more preferably 0.3 µm to 3 µm, and particularly preferably 0.5 µm to 2 µm.

<(6) Conductive Element which is Electrically Connected to at Least Either the First Transparent Electrode Patterns or the Second Transparent Electrode Patterns, and is Different from the First Transparent Electrode Patterns and the Second Transparent Electrode Patterns>

The conductive element 6 can be formed by the etching treatment or by using the transfer film having the conductive curable resin layer.

<(7) Transparent Protective Layer>

For forming the transparent protective layer 7, by using the transfer film of the present invention that has a transparent colored layer as the colored layer or using the transfer film having the photocurable resin layer that has a transparent photocurable resin layer as the photocurable resin layer, the transparent colored layer or the transparent photocurable resin layer is transferred onto the surface of the front panel 1 on which the respective elements have been formed, whereby the transparent protective layer 7 can be formed.

When the transparent protective layer is formed by using the transfer film, from the viewpoint of making the protective layer perform sufficient surface-protecting function, the thickness of the transparent protective layer is preferably 0.5 µm to 10 µm, more preferably 0.8 µm to 5 µm, and particularly preferably 1 µm to 3 µm.

<<Capacitive Input Device and Image Display Device Including the Capacitive Input Device as a Constituent>>

To the capacitive input device obtained by the manufacturing method of the present invention and an image display device including the capacitive input device as a constituent, the constitution disclosed in "The Latest Touch Panel Technologies" (published on Jul. 6, 2009, Techno-Times Co., Ltd.), "Technologies and Development of Touch Panel" (supervised by Yuji Mitani, CMC Publishing CO., LTD., 2004, 12), T-11 lecture textbook of FPD International 2009 Forum, Cypress Semiconductor Corporation Application Note 2292, and the like can be applied.

EXAMPLES

Hereinafter, the present invention will be more specifically described based on examples.

The materials, the amount and proportion thereof used, the content of treatment, treatment procedure, and the like can be appropriately changed within a range that does not depart from the gist of the present invention. Accordingly, the scope of the present invention is not limited to the following specific examples. Herein, unless otherwise specified, "%" and "part(s)" are based on mass.

Synthesis Example 1

Synthesis of tolyl trimethoxysilane((4-methylphenyl)trimethoxysilane)

19.0 g (0.784 mol) of magnesium and 300 mL of tetrahydrofuran were put into a four-neck flask equipped with a stirrer, a reflux condenser, a dripping funnel, and a thermometer, and an iodine chip is added thereto. After a small amount of tolyl chloride was added dropwise thereto to initiate a reaction, a total of 94.4 g (0.746 mol) of tolyl chloride was added dropwise thereto at 5° C. to 10° C., to prepare a Gringnard reagent.

Next, 568 g (3.73 mol) of methyl orthosilicate was put into a 1,000 mL four-neck flask equipped with a stirrer, a reflux condenser, a dripping funnel, and a thermometer, and the Gringnard reagent prepared as above was added dropwise thereto over 2 hours at a temperature of 60° C. to 70° C. Thereafter, the resultant was cooled, and the precipitated magnesium salt was filtered. Subsequently, the solvent was removed, and the resultant was collected after being subjected to rectification. As a result of analyzing the obtained fraction by GC, the GC purity thereof was confirmed to be 98.8%. Moreover, as a result of analyzing the fraction by NMR and IR, the fraction was confirmed to be tolyl trimethoxysilane (b.p. 74° C. to 75° C.).

(Synthesis of Condensate of Tolyl Trimethoxysilane/Metl Trimethoxysilane=30 Mol %/70 Mol %)

2.1 g of 25% aqueous tetramethyl ammonium hydroxide solution and 7.5 g of water were put into a 500 mL four-neck flask equipped with a stirrer, a reflux condenser, a dripping funnel, and a thermometer, and 60 mL of 2-propanol and 30 mL of toluene were added thereto. To the resultant that was being stirred at a temperature of 35° C. to 45° C., a solution, which was obtained by dissolving 26.6 g (0.195 mol) of methyl trimethoxysilane and 17.8 g (0.084 mol) of tolyl methoxysilane in 30 mL of toluene, was added dropwise. After the drowise addition ended, the resultant was aged for 2 hours and cooled to room temperature, and 90 mL of toluene and 90 mL of water were added thereto. The obtained solution was put into a separating funnel to discharge a water layer, and then an oil layer was washed with an aqueous solution of diluted acetic acid so as to discharge a water layer. Thereafter, the oil layer was washed 4 times continuously by water. Subsequently, the oil layer was filtered through a 0.5 µm PTFE filter and concentrated so as to prepare a solution containing 50% by mass of toluene, thereby obtaining a toluene solution of a condensate of tolyl trimetohxysilane/methyl trimethoxysilane=30 mol %/70 mol %.

Synthesis Example 2

Synthesis of Benzyl Trimethoxysilane

Benzyl trimethoxysilane was prepared in the same manner as in Synthesis example 1, except that in Synthesis example, equimolar benzyl chloride was used instead of tolyl chloride.

(Synthesis of Condensate of Benzyl Trimethoxysilane/Methyl Trimethoxysilane=30 Mol %/70 Mol %)

A toluene solution of a condensate of benzyl trimethoxysilane/methyl trimethoxysilane=30 mol %/70 mol % was obtained in the same manner as in Synthesis example 1, except that in the synthesis method of the copolymer of tolyl trimethoxysilane/methyl trimethoxysilane=30 mol %/70 mol % in Synthesis example 1, equimolar benzyl trimethoxysilane used instead of tolyl trimethoxysilane.

Synthesis Example 3

Synthesis of Cumyl Trimethoxysilane

Cumyl trimethoxysilane was prepared in the same manner as in Synthesis example 1, except that equimolar cumyl chloride was used instead of tolyl chloride in Synthesis example 1.

(Synthesis of Condensate of Cumyl Trimethoxysilane/Methyl Trimethoxysilane=30 Mol %/70 Mol %)

A toluene solution of a condensate of cumyl trimethoxysilane/methyl trimethoxysilane=30 mol %/70 mol % was obtained in the same manner as in Synthesis example 1, except that in the synthesis method of the condensate of tolyl trimethoxysilane/methyl trimethoxysilane=30 mol %/70 mol %, equimolar cumyl trimethoxysilane was used instead of tolyl trimethoxysilane.

Synthesis Example 4

Synthesis of Condensate of Tolyl Trimethoxysilane/Ethyl Trimethoxysilane=30 Mol %/70 Mol %

A toluene solution of a condensate of tolyl trimethoxysilane/ethyl trimethoxysilane=30 mol %/70 mol % was obtained in the same manner as in Synthesis example 1, except that in Synthesis example 1, equimolar ethyl trimethoxysilane was used instead of methyl trimethoxysilane.

Synthesis Example 5

Synthesis of Condensate of Tolyl Trimethoxysilane/Propyl Trimethoxysilane=30 Mol %/70 Mol %

A toluene solution of a condensate of tolyl trimethoxysilane/propyl trimethoxysilane=30 mol %/70 mol % was obtained in the same manner as in Synthesis example 1, except that in Synthesis example 1, equimolar propyl trimethoxysilane (Synthesis example 5) was used instead of methyl trimethoxysilane in Synthesis example 1.

Synthesis Example 6

Synthesis of Condensate of Methyl Trimethoxysilane/Methyl Dimethoxysilane=90 mol %/10 mol %

A toluene solution of a condensate of methyl trimethoxysilane/methyl dimethoxysilane=90 mol %/10 mol % (methyl/hydrogen-type silicone resin) was obtained in the same manner as in Synthesis example 1, except that in the synthesis method of the copolymer of tolyl trimethoxysilane/methyl trimethoxysilane=30 mol %/70 mol % in Synthesis example 1, the total mol number of tolyl trimethoxysilane and methyl trimethoxysilane added was controlled to remain constant, and methyl trimethoxysilane and methyl dimethoxysilane were added thereto such that the molar ratio thereof became 90 mol %/10 mol %.

Example 1

Preparation of Transfer Film of the Present Invention

<Preparation of Transfer Film of Example 1 that is Transfer Film L1 for Forming Decorative Layer>

A coating solution for a thermoplastic resin layer that was based on the following formula H1 was coated onto a polyethylene terephthalate film (temporary support) having a thickness of 75 μm by using a slit-like nozzle, and dried. Thereafter, the resultant was coated with a coating solution for an intermediate layer based on the following formula P1 and dried. Next, the resultant was coated with a coating solution for a colored layer based on the following formula L1 and dried. In this manner, on the temporary support, a thermoplastic resin layer having a dry film thickness of 15.1 μm, an intermediate layer having a dry film thickness of 1.6 μm, and a white colored layer having a dry film thickness of 35 μm were disposed, and finally, a protective film (polypropylene film having a thickness of 12 μm) was compressed onto theses. In this manner, a transfer material in which the temporary support, the thermoplastic resin layer, the intermediate layer (oxygen barrier layer), the colored layer, and the protective film had been integrally formed was prepared, and the sample was named transfer film for forming a decorative layer L1 (transfer film of Example 1).

| (Coating solution for thermoplastic resin layer: formula H1) | |
|---|---|
| Methanol: | 11.1 parts by mass |
| Propylene glycol monomethyl ether acetate: | 6.36 parts by mass |
| Methyl ethyl ketone: | 52.4 parts by mass |
| Methyl methacrylate/2-ethylhexylacrylate/benzyl methacrylate/methacrylic acid copolymer (compositional ratio of copolymer (molar ratio) = 55/11.7/4.5/28.8, molecular weight = 100,000, Tg ≈70° C.): | 5.83 part by mass |
| Styrene/acrylic acid copolymer (compositional ratio of copolymer (molar ratio) = 63/37, weight average molecular weight = 10,000, Tg ≈100° C.): | 13.6 parts by mass |
| Monomer 1 (trade name: BPE-500, manufactured by SHIN-NAKAMURA CHEMICAL CO., LTD.): | 9.1 parts by mass |
| Surfactant (fluorine-based polymer, trade name: Megaface F780F, manufactured by DIC Corporation): | 0.54 parts by mass |

The fluorine-based polymer is a copolymer consisting of 40 parts of $C_6F_{13}CH_2CH_2OCOCH=CH_2$, 55 parts of $H(OCH(CH_3)CH_2)_7OCOCH=CH_2$, and 5 parts of $H(OCHCH_2)_7OCOCH=CH_2$, and has a weight average molecular weight of 30,000. The polymer is in the form of a 30% by mass methyl ethyl ketone solution.

Herein, the viscosity at 120° C. of the coating solution for a thermoplastic resin layer H1 from which the solvent had been removed was 1,500 Pa·sec.

| (Coating solution for intermediate layer: formula P1) | |
|---|---|
| Polyvinyl alcohol: (trade name: PVA205 manufactured by KURARAY CO., LTD., saponification degree = 88%, polymerization degree of 550) | 32.2 parts by mass |

-continued

| | |
|---|---|
| Polyvinylpyrrolidone: (trade name: K-30, manufactured by ISP Japan Co., Ltd.) | 14.9 parts by mass |
| Distilled water: | 52.4 parts by mass |
| Methanol: | 42.9 parts by mass |
| (Coating solution for colored layer: formula L1) | |
| Methyl ethyl ketone (manufactured by Tonen Chemical Corporation): | 15.7 parts by mass |
| Silicone resin KR-311 (manufactured by Shin-Etsu Chemical Co., Ltd.; xylene solution of straight silicone (solid content of 50% by mass)): | 20.9 parts by mass |
| White pigment dispersion 1 (following composition): | 12.3 parts by mass |
| Antioxidant (Sumilizer GP, manufactured by SUMITOMO CHEMICAL Co., Ltd.): | 0.195 parts by mass |
| Surfactant (trade name: Megaface F-780F, manufactured by DIC Corporation): | 0.78 parts by mass |

—Composition of White Pigment Dispersion 1—

Titanium oxide (CR97 manufactured by ISHIHARA SANGYO KAISHA, LTD.; alumina/zirconia-treated rutile type, primary particle size of 0.25 μm):70.0% by mass Random copolymer consisting of benzyl methacrylate/methacrylic acid at a molar ratio of 72/28 (weight average molecular weight of 37,000):3.5% by mass Methyl ethyl ketone (manufactured by Tonen Chemical Corporation):26.5% by mass <Evaluation of Transfer Film of Example 1 as Transfer Film for Forming Decorative Layer L1>

(Evaluation of Transferability)

From the transfer film for forming a decorative layer L1 (transfer film of Example 1) prepared as above, the protective film was peeled, and the colored layer of the transfer film for forming a decorative layer L1 was superposed on the surface of the toughened glass, which had undergone silane coupling treatment in the process of manufacturing the capacitive input device of the present invention, which will be described later. After the colored layer was bonded to the glass by a laminator, the temporary support made of a polyethylene terephthalate film was peeled, and the film surface of the peeled temporary support was observed and evaluated according to the following criteria. A level equal to or higher than level C is a practical level.

<Evaluation Criteria>

A: The colored layer was completely transferred onto the whole glass surface, hence the transferability was extremely excellent.
B: The colored layer transferred left a slight residue only in the edge of the film, hence the transferability was excellent.
C: The colored layer transferred left a slight residue over the whole film, hence the transferability was fair.
D: The colored layer (photosensitive resin) transferred left a film-like residue everywhere in the film, hence the transferability was poor.

The results of evaluation are shown in the following Table 1.

~Preparation of Capacitive Input Device of the Present Invention~

By using the transfer film of Example 1 obtained as above was used as a transfer film for forming a decorative layer, a capacitive input device of Example 1 was manufactured in the following manner.

<<Formation of Decorative Layer>>

In a state in which a glass washer kept at 25° C. was being sprayed for 20 seconds to toughened glass (300 mm×400 mm×0.7 mm) in which an opening portion (15 mmφ) had been formed, the glass was washed by using a rotary brush having nylon bristles, and then the glass was being washed by being showered with pure water. Thereafter, a silane coupling solution (0.3% by mass aqueous N-β(aminoethyl)γ-aminopropyltrimethoxysilane solution, trade name: KBM603, manufactured by Shin-Etsu Chemical Co., Ltd.) was sprayed for 20 seconds to the glass by shower, and the glass was washed by being showered with pure water. The substrate was preheated for 2 minutes at 90° C. in a preheating device for substrate.

From a protective film 25 side of the obtained transfer film for forming a decorative layer L1 (transfer film of Example 1), cuttings, which penetrated the protective film 25, the colored layer 24, and the intermediate layer 23 and reach a portion of a thermoplastic resin layer 22, were made as shown in FIGS. 10 and 11, and the glass substrate was divided into the image portion 32 to which the colored layer was to be transferred and the non-image portion 31 to which the colored layer was not to be transferred. Thereafter, only the protective film 25 of the non-image portion 31 was peeled by using a tape, and likewise, two layers including the colored layer 24 and the intermediate layer 23 of the non-image portion 31 were also peeled at the same time. Furthermore, only the protective film 25 in the area corresponding to the image portion 32 was peeled.

The transfer film was superposed on the toughened glass substrate, which had been preheated at 90° C. and undergone the silane coupling treatment, such that the surface of the colored layer 24 of the image portion 32 exposed after peeling of the protective film 25 came into contact with the surface of the toughened glass substrate. Thereafter, by using a laminator (manufactured by Hitachi Industrial Equipment Systems Co., Ltd. (Lamic II model)), the resultant was subjected to lamination at a rubber roller temperature of 120° C., a nip pressure of 100 N/cm, and a transport speed of 2.5 m/min. Subsequently, a temporary support 21 made of polyethylene terephthalate was removed by being peeled from the interface between the temporary support 21 and the thermoplastic resin layer 22.

As a result, to the image portion 32 of the glass substrate, the colored layer 24, the intermediate layer 23, and the thermoplastic resin layer 22 were transferred from the transfer film of Example 1, and to the non-image portion 31 of the glass substrate, only the thermoplastic resin layer 22 was transferred from the transfer film of Example 1.

Next, the glass substrate was developed by being showered with a triethanolamine-based developer (containing 30% by mass of triethanolamine, obtained by diluting T-PD2 (trade name, manufactured by FUJIFILM Corporation) with pure water by 10-fold) for 60 seconds at 30° C. and a flat nozzle pressure of 0.1 MPa, thereby removing the thermoplastic resin layer 22 and the intermediate layer 23 of the image portion 32 of the glass substrate and the thermoplastic resin layer 22 of the non-image portion 31. Subsequently, air was blown to the top surface of the glass substrate so as to drain off liquid, and pure water was sprayed for 10 seconds to the substrate so as to wash the substrate. Thereafter, air was blown to the glass substrate so as to reduce liquid pool on the substrate.

Subsequently, by using an oven including ventilation equipment, post-baking treatment was performed in the air under atmospheric pressure (1 atm) for 60 minutes at 240° C. such that the colored layer 24 became a decorative layer. As a result of measuring the film thickness of the top surface of the glass substrate in the following manner, it was confirmed that a front panel in which a decorative layer having a film thickness of 35 μm had been formed was obtained.

As a result of measuring brightness from the surface, on which the decorative layer of the front panel had not been formed, in the following manner, an L-value of 84.6 was obtained. Furthermore, as a result of visually judging the whiteness of the decorative layer of the front panel in the following manner, it was confirmed that there was no problem with the whiteness. Moreover, the amount of benzene generated at the time of baking was measured in the following manner. As a result, it was confirmed that the amount of benzene generated was 19.1 mg per 100 cm² of the decorative layer that is the amount of a practical level.

(Measurement of Film Thickness)

The film thickness of the decorative layer in the front panel in which a decorative layer has been formed on the toughened glass was measured by using a surface profilometer P-10 (manufactured by Tencor Corporation). The results are shown in the following Table 1. In the following Table 1, "μ" means "μm"

<<Evaluation of Front Panel in which Decorative Layer has been Formed>>

(Evaluation of Brightness)

The front panel in which the decorative layer had been formed on the toughened glass was measured from the surface opposite to the surface in which the decorative layer had been formed, by using black paper as an underlay and 938 Spectrodensitometer manufactured by X-Rite, Incorporated; and the brightness was evaluated based on the L-value. A level equal to or higher than level D is a practical level, and the level is preferably equal to or higher than level C.

<Evaluation Criteria>

AA: L-value of 87 or higher
A: L-value of 85 or higher but less than 87
B: L-value of 83 or higher but less than 85
C: L-value of 81 or higher but less than 83
D: L-value of 77 or higher but less than 81
E: L-value of less than 77

The evaluated results are shown in the following Table 1.

(Evaluation of Whiteness)

The decorative layer was transferred onto the toughened glass as described above, and the resultant was post-baked for 60 minutes under atmospheric pressure (1 atm) at 240° C. in the air so as form a front panel. Thereafter, 60 people were asked to observe the front panel from the back of the substrate so as to evaluate the whiteness according to the following evaluation criteria. A level equal to or higher than level C is a practical level.

| <Evaluation criteria> | |
|---|---|
| A: Number of people who felt that the front panel had yellow tinge | 0 to 1 |
| B: Number of people who felt that the front panel had yellow tinge | 2 to 3 |
| C: Number of people who felt that the front panel had yellow tinge | 4 to 5 |
| D: Number of people who felt that the front panel had yellow tinge | 6 to 10 |
| E: Number of people who felt that the front panel had yellow tinge | 11 or greater |

The evaluated results are shown in the following Table 1.

(Evaluation of Reticulation)

The front panel in which the decorative layer has been formed on the toughened glass was left in an environment of 23° C. and a relative humidity of 50% for 24 hours. Thereafter, the surface of the decorative layer of the front panel and the surface of the front panel opposite to the surface on which the decorative layer had been formed were observed by a microscope by using reflected light and transmitted light, and the reticulation was evaluated according to the following criteria. A level equal to or higher than level C is a practical level.

<Evaluation Criteria>

A: Within the pattern surface of the decorative layer, fine "wrinkles" were not observed at all, hence the reticulation was evaluated to be extremely excellent.

B: Extremely shallow "wrinkles" were partially observed only in the central portion of the pattern surface of the decorative layer. However, the wrinkles were not observed within the surface of the front panel opposite to the surface on which the decorative layer had been formed, hence the reticulation was evaluated to be excellent.

C: Within the pattern surface of the decorative layer, fine "wrinkles" and the like were slightly observed, but the wrinkles could not be observed within the surface of the front panel opposite to the surface on which the decorative layer had been formed. It was practically unproblematic level, and the reticulation was evaluated to be fair.

D: Fine "wrinkles" and the like were clearly observed, and slight unevenness was observed within the surface of the front panel opposite to the surface on which the decorative layer had been formed. The reticulation was evaluated to be a poor level.

E: Fine "wrinkles" and the like were observed throughout the whole surface, and unevenness was observed within the surface of the front panel opposite to the surface on which the decorative layer had been formed. The reticulation was evaluated to be an extremely poor level.

The evaluated results are shown in the following Table 1.

(Evaluation of Yield)

Five hundred front panels in which the decorative layer had been formed on the toughened glass were prepared, and the yield of the usable front panels was examined.

<Evaluation Criteria>

A: The yield exceeded 94%, which was extremely excellent level.

B: The yield was 91% or higher but less than 94%, which was excellent level.

C: The yield was 88% or higher but less than 91%, which was fair.

D: The yield was 83% or higher but less than 88%, which was poor.

E: The yield was less than 83%, which was extremely poor.

The evaluated results are shown in the following Table 1.

(Evaluation of Adhesiveness of Decorative Layer)

In a decorative layer of a front panel in which a decorative layer had been formed on toughened glass according to JIS K 5600-5-6:ISO2409 (cross-cutting method), cuts having a width of 1 mm were made, and the decorative layer was peeled by using a cellophane tape. In this manner, peeling of the decorative layer surface and existence of pinholes were observed. A level equal to or higher than level C is a practical level.

<Evaluation Criteria>

A: The component of the decorative layer was not peeled, hence the adhesiveness of the decorative layer was extremely excellent level.

B: The component of the decorative layer was slightly peeled only at the edge of the cuttings, but there was portion peeled in the form of grid. The adhesiveness of the decorative layer was excellent level.

C: The component of the decorative layer was peeled in the form of grid at a ratio of 0% or higher but less than 2%, which was a practical level, hence the adhesiveness of the decorative layer was fair.
D: The component of the decorative layer was peeled in the form of grid at a ratio of 2% or higher but less than 5%. It was confirmed that the component of the decorative layer was peeled in the form of square. It practically required repair, and the adhesiveness of the decorative layer was poor.
E: It was confirmed that the component of the decorative layer was peeled at a ratio of 5% or higher. It practically required repair, and the adhesiveness of the decorative layer was extremely poor.

The evaluated results are shown in the following Table 1.

(Evaluation of Precutting Properties by Half-Cutting)

The cuts, which penetrated the protective film 25, the colored layer 24, and the intermediate layer 23 from the protective film 25 side of the transfer film for forming a decorative layer and reached a portion of the thermoplastic resin layer 22, were made as shown in FIG. 12 so as to pre-cut the film. Thereafter, the contour and peripheral portion of the image pattern of the formed colored layer were observed by using an optical microscope, and whether cutting residues remained in the contour and the periphery was evaluated based on the following criteria. A level equal to or higher than level D is a practical level, and the level is preferably equal to or higher than level C.

<Evaluation Criteria>
A: The cross-section was clearly cut, and the blade was not contaminated at all, hence the precutting suitability was extremely excellent.
B: Only the edge of the cross-section was slightly contaminated or peeled, but the blade was not contaminated at all. The precutting suitability was excellent.
C: Although the cross-section was slightly contaminated and peeled, it is unproblematic since the cross-section became smooth after baking. The blade was contaminated to an extremely small extent, hence the precutting suitability was fair.
D: The cross-section was contaminated or peeled in a width of several mm, and the cross-section was not restored even after baking, so it practically required repair. The blade was also seriously contaminated and needed to be washed once in several operations, hence the precutting suitability was poor.
E: The image portion was broken from the crack of the cross-section, so the film is practically problematic. Alternatively, the blade was seriously contaminated and needed to be washed each time, hence the precutting suitability was extremely poor.

The evaluated results are shown in the following Table 1.

(Evaluation of Precutting Properties by Die-Cutting)

The cuts, which penetrated the protective film 25, the colored layer 24, the intermediate layer 23, the thermoplastic resin layer 22, and the temporary support 21 from the protective film 25 side of the transfer film for forming a decorative layer, were made as shown in FIG. 15 so as to pre-cut the film. Thereafter, the contour and peripheral portion of the image pattern of the formed colored layer were observed by using an optical microscope, and whether cutting residues remained in the contour and the periphery was evaluated based on the following criteria. A level equal to or higher than level D is a practical level, and the level is preferably equal to or higher than level C.

<Evaluation Criteria>
A: The cross-section was clearly cut, and the blade was not contaminated at all, hence the precutting suitability was extremely excellent.
B: Only the edge of the cross-section was slightly contaminated or peeled, but the blade was not contaminated at all. The precutting suitability was excellent.
C: Although the cross-section was slightly contaminated and peeled, it is unproblematic since the cross-section became smooth after baking. The blade was contaminated to an extremely small extent, hence the precutting suitability was fair.
D: The cross-section was contaminated or peeled in a width of several millimeters, and the cross-section was not restored even after baking, so it practically require repair. The blade was also seriously contaminated and needed to be washed once in several operations, hence the precutting suitability was poor.
E: The image portion was broken from the crack of the cross-section, so the film is practically problematic. Alternatively, the blade was seriously contaminated and needed to be washed each time, hence the precutting suitability was extremely poor.

The evaluated results are shown in the following Table 1.

(Evaluation of Contamination of Opening Portion)

The opening portion of the front panel in which the decorative layer had been formed on the toughened glass was observed with a microscope, and whether the component of the decorative layer was present as a contaminant was observed. A level equal to or higher than level C is a practical level.

<Evaluation Criteria>
A: The opening portion was not contaminated at all with the component of the decorative layer, hence the contamination of the opening portion was evaluated to be extremely excellent.
B: It was confirmed that only the edge of the opening portion was slightly contaminated with the component of the decorative layer. However, it was unproblematic for practical use, hence the contamination of the opening portion was evaluated to be excellent.
C: It was confirmed that the opening portion was contaminated with the component of the decorative layer by about several μm from the edge of the opening portion to the inside of the opening portion. However, it was unproblematic for practical use, hence the contamination of the opening portion was evaluated to be fair.
D: It was confirmed that the opening portion was contaminated with the component of the decorative layer from the edge of the opening portion to the inside of the opening portion by about half of the thickness of the glass. It practically require repair, hence the contamination of the opening portion was evaluated to be poor.
E: It was confirmed that the opening portion was contaminated with the component of the decorative layer from the edge of the opening portion to the inside of the opening portion and the back of the glass, hence the contamination of the opening portion was evaluated to be extremely poor.

The evaluated results are shown in the following Table 1.

(Evaluation of Missing of Opening Portion)

The vicinity of the opening portion of the front panel in which the decorative layer had been formed on the toughened glass was observed with a microscope so as to observe peeling of the component of the decorative layer and existence of pinholes.

<Evaluation Criteria>
A: The component of the decorative layer of the substrate in the vicinity of the opening portion was not peeled at all, hence the missing of the opening portion was evaluated to be extremely excellent level.

B: Slight peeling occurred only at the edge of the opening portion. However, peeling did not occur at all in other portions, hence the missing of the opening portion was evaluated to be excellent level.
C: It was confirmed that the component of the decorative layer was peeled in the vicinity of the edge of the opening portion by several μm. However, it was unproblematic for practical use, hence the missing of the opening portion was evaluated to be fair.
D: It was confirmed that the component of the decorative layer was peeled in the vicinity of the opening portion in a width of several mm. It practically required repair, hence the missing of the opening portion was evaluated to be poor.
E: It was confirmed that the component of the decorative layer was peeled in the vicinity of the opening portion in a width of several cm. It practically required repair, hence the missing of the opening portion was evaluated to be extremely poor.

The evaluated results are shown in the following Table 1.

(Amount of Benzene Generated)

On the toughened glass, the transfer film for forming a decorative layer, from which only the protective film was removed from the whole film surface without precutting the transfer film for forming a decorative layer, was laminated. The resultant was developed and washed with pure water, and air was blown thereto. Subsequently, the resultant was dried for 30 minutes in an oven at 105° C. The decorative layer was chipped off from the toughened glass by about a certain area, and the sample was put into a sample tube. Thereafter, the sample was subjected to direct heating by being heated for 15 minutes (including time taken for increasing temperature from room temperature) at 280° C. under He gas by using a heating and desorbing device, and then subjected to GC-MS.

For a calibration curve, commercially available reagent-grade benzene was used. The benzene was collected into a TENAX adsorbing tube by the existing method and then subjected to heating and desorbing measurement similarly to the sample.

As a GC column, DB-5MS manufactured by Agilent Technologies was used, and after it was kept at 40° C. for 3 minutes, temperature increase measurement was performed. MS detection was performed by EI ionization, and for quantification, the peak area of chromatogram of benzene was used.

| Heating and desorbing device | |
|---|---|
| Company name | Japan Analytical Industry Co., Ltd. |
| Device name | Heating and desorbing device |
| Model | JTD-505111 |

| GC-MS | |
|---|---|
| Company name | Shimadzu Corporation |
| Device name | Gas chromatography-mass spectrometer |
| Model | QP2010Ultra |

<Evaluation Criteria>
AA: The amount of benzene generated was less than 0.01 mg/100 $cm^2$ which was extremely excellent.
A: The amount of benzene generated was 0.01 mg/100 $cm^2$ or greater but less than 9.2 mg/100 $cm^2$ which was excellent.
B: The amount of benzene generated was 9.2 mg/100 $cm^2$ or greater but less than 19 mg/100 $cm^2$ which was fair.
C: The amount of benzene generated was 19 mg/100 $cm^2$ or greater but less than 29 mg/100 $cm^2$ which was unproblematic for practical use and fair.
D: The amount of benzene generated was 29 mg/100 $cm^2$ or greater which was poor.

The evaluated results are shown in the following Table 1.

<<Formation of Mask Layer>>

<Preparation of Transfer Film for Forming Mask Layer K1>

A transfer film for forming a mask layer K1, in which the temporary support, the thermoplastic resin layer, the intermediate layer (oxygen barrier film), the photocurable resin layer for forming a mask layer, and the protective film had been integrated, was obtained in the same manner as used for preparing the transfer film for forming a decorative layer L1 (transfer film of Example 1), except that in preparing the transfer film for forming a decorative layer L1 (transfer film of Example 1), the coating solution for colored layer prepared according to the formula L1 was replaced with a coating solution for forming a mask layer that was prepared according to the formula K1 (the film thickness of the photocurable resin layer for forming a mask layer was 2.2 μm).

| (Coating solution for forming mask layer: formula K1) | |
|---|---|
| K pigment dispersion 1 (following composition) | :31.2 parts by mass |
| R pigment dispersion 1 (following composition) | :3.3 parts by mass |
| MMPGAc (manufactured by Daicel Corporation) | :6.2 parts by mass |
| Methyl ethyl ketone (manufactured by Tonen Chemical Corporation) | :34.0 parts by mass |
| Cyclohexanone (manufactured by Kanto Denka Kogyo Co., Ltd.) | :8.5 parts by mass |
| Binder 2 (random compolymer consisting of benzyl methacrylate and methacrylic acid at a molar ratio of 78/22, weight average molecular weight of 38,000) | :10.8 parts by mass |
| Phenothiazine (manufactured by Tokyo Chemical Industry Co., Ltd.) | :0.01 parts by mass |
| Propylene glycol monomethyl ether acetate solution (76% by mass) of DPHA (dipentaerythritol hexaacrylate, manufactured by Nippon Kayaku Co., Ltd.) | :5.5 parts by mass |
| 2,4-Bis(trichloromethyl)-6-[4'-(N,N-bis(ethoxycarbonylmethyl)amino-3'-bromophenyl)-s-triazine | :0.4 parts by mass |
| Surfactant (trade name: Megaface F-780F, manufactured by DIC Corporation) | :0.1% by mass |
| Composition of K pigment dispersion 1 | |
| Carbon black (trade name: Nipex35, manufactured by Evonik Degussa Co., Ltd.) | :13.1% by mass |
| Following dispersant 1 | :0.65% by mass |
| Binder 1 (random copolymer consisting of benzyl methacrylate and methacrylic acid at a molar ratio of 72/28, weight average molecular weight of 37,000) | :6.72% by mass |
| Propylene glycol monomethyl ether acetate | :79.53% by mass |

[Chem. 4]

(Coating solution for forming mask layer: formula K1)

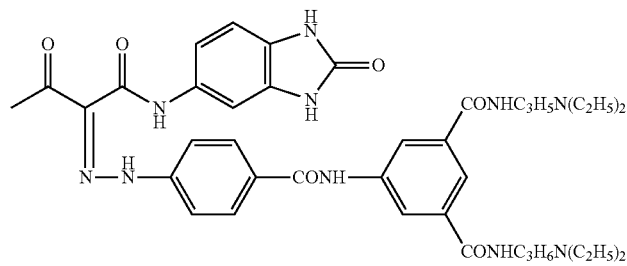

| Composition of R pigment dispersion 1 | |
|---|---|
| Pigment (C. I. Pigment Red 177) | 18% by mass |
| Binder 1 (random copolymer consisting of benzyl methacrylate and methacrylic acid at a molar ratio of 72/28, weight average molecular weight of 37,000) | 12% by mass |
| Propylene glycol monomethyl ether acetate | 70% by mass |

<Formation of Mask Layer>

The front panel in which the decorative layer had been formed (hereinafter, also referred to as a decorative layer-equipped front panel) was washed in the same manner as used for washing the toughened glass substrate in formation of the decorative layer.

Thereafter, the transfer film for forming a mask layer K1, which had not undergone half-cutting and from which only the protective film had been removed from the whole surface of the film, was laminated on the surface of the decorative layer-equipped front panel having been washed (substrate temperature: 140° C., rubber roller temperature: 130° C., nip pressure: 100 N/cm, transport speed: 2.2 m/min). After the temporary support was peeled, in a state where the decorative layer-equipped front panel, on which the transfer film for forming a mask layer K1 had been laminated, and an exposure mask (quartz exposure mask having a frame pattern) were standing vertically, the distance between the surface of the exposure mask and the photocurable resin layer for forming the mask layer was set to 500 μm, the laminate was pattrenwise exposed at an exposure dose of 70 mJ/cm² (i-line) by using a proximity-type exposure machine (manufactured by Hitachi High-Technologies Corporation) including a super-high pressure mercury lamp.

Next, the resultant was developed for 600 seconds at 33° C. by using a triethanolamine-based developer (containing 30% by mass of triethanolamine, solution obtained by diluting T-PD2 (trade name, manufactured by FUJIFILM Corporation) with pure water by 10-fold). The resultant was then developed for 45 seconds at 32° C. by using a sodium carbonate/sodium hydrogen carbonate-based developer (solution obtained by diluting T-CD1 (trade name, manufactured by FUJIFILM Corporation) with pure water by 5-fold) and by setting a shower pressure to 0.1 MPa, and then washed with pure water.

Subsequently, a surfactant-containing washer (solution obtained by diluting T-SD3 (trade name, manufactured by FUJIFILM Corporation) with pure water by 10-fold) was sprayed to the resultant by shower for 20 seconds at 33° C. by setting a conical nozzle pressure to 0.1 MPa. Next, the formed pattern image was rubbed against a rotary brush having soft nylon bristles so as to remove residues. Furthermore, ultra-pure water was sprayed thereto by a super-high pressure washing nozzle at a pressure of 9.8 MPa, thereby removing residues.

Thereafter, the front panel was subjected to post-exposure from the front and back surfaces thereof at an exposure dose of 1,300 mJ/cm², and then subjected to post-baking treatment for 80 minutes at 240° C. As a result, a front panel, in which a mask layer having an optical density of 4.0 and a film thickness of 2.0 μm and a decorative layer had been formed in order of the front panel, the decorative layer, and the mask layer, was obtained.

<<Formation of First Transparent Electrode Patterns>>

<Formation of Transparent Electrode Layer>

The front panel, in which the decorative layer and the mask layer had been formed, was put into a vacuum chamber, and by using an ITO target (indium:tin=95:5 (molar ratio)) with an SnO₂ content of 10% by mass, an ITO thin film having a thickness of 40 nm was formed by DC magnetron sputtering (conditions: substrate temperature of 250° C., argon pressure of 0.13 Pa, oxygen pressure of 0.01 Pa), thereby obtaining a front panel in which a transparent electrode layer was formed. The surface resistivity of the ITO thin film was 80 Ω/square.

<Preparation of Transfer Film for Etching E1>

A transfer film for etching E1, in which the temporary support, the thermoplastic resin layer, the intermediate layer (oxygen barrier layer), the photocurable resin layer for etching, and the protective film had been integrated, was obtained in the same manner as used for preparing the transfer film for forming a decorative layer L1, except that in preparing the transfer film for forming a decorative Layer L1, the coating solution for colored layer prepared according to the formula L1 was replaced with a coating solution for photocurable resin layer for etching prepared according to the following formula E1 (the film thickness of the photocurable resin layer for etching was 2.0 μm).

| (Coating solution for photocurable resin layer for etching: formula E1) | |
|---|---|
| Methyl methacrylate/styrene/methacrylic acid copolymer (compositon of copolymer (% by mass): 31/40/29, mass average molecular weight: 60,000, acid value: 163 mg KOH/g): | 16 parts by mass |
| Monomer 1 (trade name: BPE-500, manufactured by SHIN-NAKAMURA CHEMICAL CO., LTD.): | 5.6 parts by mass |
| Tetraethylene oxide monomethacrylate 0.5-mol | 7 parts by mass |

-continued

| (Coating solution for photocurable resin layer for etching: formula E1) | |
|---|---|
| adduct of hexamethylene diisocyanate: Cyclohexane dimethanol monoacrylate as a compound having one polymerizable group in a molecule: | 2.8 part by mass |
| 2-Chloro-N-butylacrydone: | 0.42 parts by mass |
| 2,2-Bis(o-chlorophenyl)-4,4',5,5'-tetraphenyl biimidazole: | 2.17 parts by mass |
| Leuco crystal violet: | 0.26 parts by mass |
| Phenothiazine: | 0.013 parts by mass |
| Surfactant (trade name: Megaface F-780F, manufactured by DIC Corporation): | 0.03 parts by mass |
| Methyl ethyl ketone: | 40 parts by mass |
| 1-Methoxy-2-propanol: | 20 parts by mass |

<Formation of First Transparent Electrode Patterns>

In the same manner as used for forming the mask layer, the front panel, in which the decorative layer, the mask layer, and the transparent electrode layer had been formed, was washed, and the transfer film for etching E1 from which the protective film had been removed (substrate temperature: 130° C., rubber roller temperature: 120° C., nip pressure: 100 N/cm, transport speed: 2.2 m/min) was laminated on the front panel. After the temporary support was peeled, the distance between the surface of a exposure mask (quartz exposure mask having transparent electrode patterns) and the photocurable resin layer for etching was set to 200 μm, and the laminate was patternwise exposed at an exposure dose of 50 mJ/cm² (i-line).

Next, the resultant was developed for 100 seconds at 25° C. by using a triethanolamine-based developer (containing 30% by mass of triethanolamine, solution obtained by diluting T-PD2 (trade name, manufactured by FUJIFILM Corporation) with pure water by 10-fold). Thereafter, the resultant was treated with a surfactant-containing washer (solution obtained by diluting T-SD3 (trade name, manufactured by FUJIFILM Corporation) with pure water by 10-fold) for 20 seconds at 33° C., and residues were removed by using a rotary brush and super-high pressure washing nozzle. Subsequently, the resultant was subjected to post-baking treatment for 30 minutes at 130° C., thereby obtaining a front panel in which the decorative layer, the mask layer, the transparent electrode layer, and the pattern of photocurable resin layer for etching had been formed.

The front panel, in which the decorative layer, the mask layer, the transparent electrode layer, and the pattern of photocurable resin layer for etching had been formed, was treated by being dipped in an etching tank containing an ITO etchant (aqueous solution containing hydrochloric acid and potassium chloride, solution temperature: 30° C.) for 100 seconds so as to dissolve and remove the transparent electrode layer in an exposed area that was not covered with the photocurable resin layer for etching. As a result, a transparent electrode layer pattern-formed front panel, in which the decorative layer, the mask layer, and the pattern of photocurable resin layer for etching had been formed, was obtained.

Thereafter, the transparent electrode layer pattern-formed front panel, in which the pattern of photocurable resin layer for etching had been formed, was treated by being dipped in a resist removing tank containing a resist remover (N-methyl-2-pyrrolidone, monoethanolamine, surfactant (trade name: Surfynol 465, manufactured by Air Products and Chemicals, Inc), solution temperature: 45° C.) for 200 seconds so as to remove the photocurable resin layer for etching. As a result, a front panel, in which the decorative layer, the mask layer, and the first transparent electrode patterns disposed over the area of both the non-contact surface of the front panel and the surface of the mask layer opposite to the front panel side as shown in FIG. 1 had been formed, was obtained.

<<Formation of Insulating Layer>>

<Preparation of Transfer Film for Forming Insulating Layer W1>

A transfer film for forming an insulating layer W1, in which the temporary support, the thermoplastic resin layer, the intermediate layer (oxygen barrier film), the photocurable resin layer for insulating layer, and the protective film had been integrated, was obtained in the same manner as used for preparing the transfer film for forming a decorative layer L1, except that in preparing the transfer film for forming a decorative layer L1, the coating solution for colored layer prepared according to the formula L1 was replaced with a coating solution for forming an insulating layer prepared according to the following formula W1 (the film thickness of the photocurable resin layer for insulating layer was 1.4 μm).

| (Coating solution for forming insulating layer: formula W1) | |
|---|---|
| Binder 3 (a solution of 1-methoxy-2-propanol and methyl ethyl ketone containing a glycidyl methacrylate adduct (d) of a copolymer composed of cyclohexyl methacrylate (a)/methyl methacrylate (b)/methacrylic acid (c) (composition (% by mass): a/b/c/d = 46/1/10/43, mass average molecular weight: 36,000, acid value: 66 mg KOH/g) (solid content: 45%)): | 12.5 parts by mass |
| DPHA (dipentaerythritol hexaacrylate, a propylene glycol monomethyl ether acetate solution (76% by mass) manufactured by Nippon Kayaku Co., Ltd.): | 1.4 parts by mass |
| Urethane-based monomer (trade name: NKOligo UA-32P manufactured by SHIN-NAKAMURA CHEMICAL CO, LTD.: 75% of nonvolatile component, 25% of propylene glycol monomethyl ether acetate): | 0.68 parts by mass |
| Tripentaerythritol octaacrylate (trade name: V#802, manufactured by OSAKA ORGANIC CHEMICAL INDUSTRY LTD.): | 1.8 parts by mass |
| Diethyl thioxanthone: | 0.17 parts by mass |
| 2-(Dimethylamino)-2-[(4-methylphenyl)methyl]-1-[4-(4-morpholinyl)phenyl]-1-butanone (trade name: Irgacure379, manufactured by BASF Corporation): | 0.17 parts by mass |
| Dispersant (trade name, Solsperse 20000, manufactured by Avecia Ltd.): | 0.19 parts by mass |
| Surfactant (trade name: Megaface F-780F, manufactured by DIC Corporation): | 0.05 parts by mass |
| Methyl ethyl ketone: | 23.3 parts by mass |
| MMPGAc (manufactured by Daicel Corporation): | 59.8 parts by mass |

Herein, the viscosity at 100° C. of the coating solution for forming an insulating layer W1 from which the solvent had been removed was 4,000 Pa·sec.

In the same manner as used for forming the mask layer, the front panel, in which the decorative layer, the mask layer, and the first transparent electrode patterns had been formed, was washed and subjected to the silane coupling treatment. Thereafter, the transfer film for forming an insulating layer W1 from which the protective layer had been removed (substrate temperature: 100° C., rubber roller temperature: 120° C., nip pressure: 100N/cm, transport speed: 2.3 m/min) was laminated on the front panel. After the temporary support was peeled, the distance between the surface of an exposure mask (quartz exposure mask having patterns for insulating layer) and the photocurable resin layer for etching was set to 100 μm, and the laminate was patternwise exposed at an exposure dose of 30 mJ/cm² (i-line).

Next, the resultant was developed for 60 seconds at 33° C. by using a triethanolamine-based developer (containing 30% by mass of triethanolamine, solution obtained by diluting T-PD2 (trade name, manufactured by FUJIFILM Corporation) with pure water by 10-fold). The resultant was then developed for 50 seconds at 25° C. by using a sodium carbonate/sodium hydrogen carbonate-based developer (solution obtained by diluting T-CD1 (trade name, manufactured by FUJIFILM Corporation) with pure water by 5-fold, and further treated with a surfactant-containing washer (solution obtained by diluting T-SD3 (trade name, manufactured by FUJIFILM Corporation,) with pure water by 10-fold) for 20 seconds at 33° C. Next, residues were removed by using a rotary brush and a super-high pressure washing nozzle, and then the resultant was subjected to post-baking treatment for 60 minutes at 230° C. As a result, a front panel, in which the decorative layer, the mask layer, the first transparent electrode patterns, and the insulating layer pattern had been formed, was obtained.

<<Formation of Second Transparent Electrode Patterns>>

<Formation of Transparent Electrode Layer>

In the same manner as used for forming the first transparent electrode patterns, the front panel, in which the decorative layer, the mask layer, the first transparent electrode patterns, and the insulating layer patterns had been formed, was subjected to DC magnetron sputtering treatment (conditions: substrate temperature of 50° C., argon pressure of 0.13 Pa, oxygen pressure of 0.01 Pa), thereby forming an ITO thin film having a thickness of 80 nm. As a result, a front panel, in which the decorative layer, the mask layer, the first transparent electrode patterns, the insulating layer pattern, and the transparent electrode layer had been formed, was obtained. The surface resistivity of the ITO thin film was 110 Ω/square.

In the same manner as used for forming the first transparent electrode patterns, a front panel, in which the decorative layer, the mask layer, the first transparent electrode patterns, the insulating layer pattern, the transparent electrode layer, and the pattern of the photocurable resin layer for etching had been formed, was obtained by using the transfer film for etching E1 (post-baking treatment; 130° C., for 30 minutes).

Furthermore, in the same manner as used for forming the first transparent electrode patterns, etching was performed (30° C., for 50 seconds), and the photocurable resin layer for etching was removed (45° C., for 200 seconds). As a result, a front panel, in which the decorative layer, the mask layer, the first transparent electrode patterns, the insulating layer pattern, and the second transparent electrode patterns disposed over the areas of both the non-contact surface of the front panel and the surface of the mask layer opposite to the front panel side as shown in FIG. 1 had been formed, was obtained.

<<Formation of Conductive Element Different from First and Second Transparent Electrode Patterns>>

In the same manner as used for forming the first and second transparent electrode patterns, the front panel, in which the decorative layer, the mask layer, first transparent electrode patterns, the insulating layer pattern, and the second transparent electrode patterns had been formed, was subjected to DC magnetron sputtering treatment, thereby obtaining a front panel in which an aluminum (AL) thin film having a thickness of 200 nm was formed.

In the same manner as used for forming the first and second transparent electrode patterns, by using the transfer film for etching E1, a front panel, in which the decorative layer, the mask layer, the first transparent electrode patterns, the insulating layer pattern, the second transparent electrode patterns, the aluminum thin film, and the pattern of the photocurable resin layer for etching had been formed, was obtained (post-baking treatment; 130° C., for 30 minutes).

Furthermore, in the same manner as used for forming the first transparent electrode patterns, etching was performed (30° C., for 50 seconds), and the photocurable resin layer for etching was removed (45° C., for 200 seconds). As a result, a front panel, in which the decorative layer, the mask layer, the first transparent electrode patterns, the insulating layer pattern, the second transparent electrode patterns, and the conductive element different from the first and second transparent electrode patterns had been formed, was obtained.

<<Formation of Transparent Protective Layer>>

In the same manner as used for forming the insulating layer, on the front panel, in which the conductive element different from the first and second transparent electrode patterns had been formed, the transfer film for forming an insulating layer W1 from which the protective film had been removed was laminated. After the temporary support was peeled, the whole surface thereof was exposed at an exposure dose of 50 mJ/cm$^2$ (i-line) without out using an exposure mask, followed by development, post-exposure (1,000 mJ/cm$^2$), and post-baking treatment. As a result, the front panel 1 on which the insulating layer (transparent protective layer) covering all of the decorative layer, the mask layer, the first transparent electrode patterns, the insulating layer pattern, the second transparent electrode patterns, and the conductive element different from the first and second transparent electrode patterns was laminated as shown in FIG. 1 was obtained. The obtained front panel 1 was taken as a capacitive input device of Example 1.

<<Preparation of Image Display Device (Touch Panel)>>

The liquid crystal display device manufactured by the method described in JP2009-47936A was bonded to the front panel 1 (capacitive input device of Example 1) manufactured as above, and an image display device 1 of Example 1 including the capacitive input device as a constituent was prepared by a known method.

<<Comprehensive Evaluation of Front Panel 1 and Image Display Device 1>>

In the front panel 1 (capacitive input device of Example 1), in which the decorative layer, the mask layer, the first transparent electrode patterns, the insulating layer pattern, the second transparent electrode patterns, and the conductive element different from the first and second transparent electrode patterns had been formed by the respective steps described above, the opening portion and the back surface thereof were not contaminated, and the front panel 1 was easily washed. Moreover, other members thereof had no problem of contamination.

Furthermore, the decorative layer was free of pinholes and had no problem with whiteness and unevenness. Similarly, the mask layer was free of pinholes and exhibited excellent light shielding properties.

Moreover, each of the first transparent electrode patterns, the second transparent electrode patterns, and the conductive element different from those patterns had no problem with conductivity, and the first transparent electrode patterns were insulated from the second transparent electrode patterns.

In addition, the transparent protective layer had no defect such as air bubbles, and an image display device excellent in display characteristics was obtained.

Example 2

<<Preparation of Transfer Film C1 Laminated with Conductive Layer>>

A transfer film C1 laminated with a conductive layer was obtained in the same manner as used for preparing the transfer film for forming a decorative layer L1, except that in preparing the transfer film for forming a decorative layer L1, the coating solution for colored layer prepared according to the formula L1 was replaced with a coating solution for forming a conductive layer prepared according to the following formula C1 (the thickness of the conductive layer was 2.0 µm).

<Preparation of Coating Solution for Forming Conductive Layer>

(Preparation of Silver Nanowire Dispersion (1))

0.51 g of silver nitrate powder was dissolved in 50 mL of pure water, thereby preparing a silver nitrate solution. Thereafter, 1N aqueous ammonia was added to the silver nitrate solution until the solution become transparent, and pure water was added thereto such that the amount of the solution became 100 mL in total, thereby preparing an additive solution A.

Furthermore, 0.5 g of glucose powder was dissolved in 140 mL of pure water, thereby preparing an additive solution G.

Moreover, 0.5 g of HTAB (hexadecyl-trimethyl ammonium bromide) powder was dissolved in 27.5 mL of pure water, thereby preparing an additive solution H.

Next, 20.6 mL of the additive solution A was put into a 3-neck flask and stirred at room temperature. To the solution, 41 mL of pure water, 20.6 mL of the additive solution H, and 16.5 mL of the additive solution G were added in this order by using a funnel, and the resultant was heated for 5 hours at 90° C. while being stirred at 200 rpm, thereby obtaining a silver nanowire water dispersion (1).

The obtained silver nanowire dispersion (1) was cooled, and then polyvinylpyrrolidone (trade name: K-30, manufactured by Wako Pure Chemical Industries, Ltd.) was added thereto under stirring such that the amount thereof became 0.05 when the mass of silver was regarded as being 1. Thereafter, by centrifugation, the resultant was purified until the conductivity became 50 µm/cm or less. Subsequently, centrifugation was performed again by using propylene glycol monomethyl ether, and water was removed from the resultant. Finally propylene glycol monomethyl ether was added thereto, thereby preparing a silver nanowire solvent dispersion (1).

(Preparation of coating solution for forming conductive layer C1)

The following composition was stirred and mixed with the silver nanowire solvent dispersion (1) such that the final silver concentration became 1.0% by mass, thereby preparing a coating solution for forming a conductive layer C1.

| -Composition of coating solution for forming conductive layer C1- | |
|---|---|
| The aforementioned binder 3 (solid content: 45%): | 3.80 parts by mass |
| KAYARAD DPHA (manufactured by Nippon Kayaku Co., Ltd.): | 1.59 parts by mass |
| 2-(Dimethylamino)-2-[(4-methylphenyl)methyl]-1-[4-(4-morpholinyl)phenyl]-1-butanone (trade name: Irgacure379, manufactured by BASF Corporation): | 0.159 parts by mass |
| EHPE-3150 (manufactured by Daicel Corporation): | 0.150 parts by mass |
| Surfactant (trade name: Megaface F-781F, manufactured by DIC Corporation): | 0.002 parts by mass |
| MMPGAc (manufactured by Daicel Corporation): | 19.3 parts by mass |

<<Formation of Transparent Electrode Patterns, Insulating Layer, and the Like>>

In the same manner as in Example 1, a front panel in which the decorative layer and the mask layer had been formed was obtained. Thereafter, by using the transfer film C1 laminated with the conductive layer, the first transparent electrode patterns were formed.

First, the front panel in which a mask layer had been formed was washed, and the transfer film C1 from which the protective film had been removed (substrate temperature: 120° C., rubber roller temperature: 120° C., nip pressure: 100 N/cm, transport speed: 1.7 m/min) was laminated on the front panel. After the temporary support was peeled, the distance between the surface of an exposure mask (quartz exposure mask having transparent electrode patterns) and the conductive layer was set 100 µm, and the laminate was patternwise exposed at an exposure dose of 100 mJ/cm$^2$ (i-line).

Next, the resultant was developed for 60 seconds at 30° C. by using a triethanolamine-based developer (containing 30% by mass of triethanolamine, solution obtained by diluting T-PD2 (trade name, manufactured by FUJIFILM Corporation) with pure water by 10-fold), and then developed for 60 seconds at 25° C. by using a sodium carbonate/sodium hydrogen carbonate-based developer (solution obtained by diluting T-CD1 (trade name, manufactured by FUJIFILM Corporation) with pure water by 5-fold). Thereafter, the resultant was treated with a surfactant-containing washer (solution obtained by diluting T-SD3 (trade name, manufactured by FUJIFILM Corporation) with pure water by 10-fold) for 20 seconds at 33° C., and the residues were removed by using a rotary brush and a super-high pressure washing nozzle. The resultant was then subjected to post-baking treatment for 60 minutes at 230° C., thereby obtaining a front panel in which the decorative layer, the mask layer, and the first transparent electrode patterns were formed.

Subsequently, in the same manner as in Example 1, an insulating layer was formed. Next, by using the transfer film C1 laminated with the conductive layer, the second transparent electrode patterns were formed. Furthermore, in the same manner as in Example 1, the conductive element different from the first and second transparent electrode patterns, and the transparent protective layer were formed, thereby obtaining a front panel 2. The front panel 2 was taken as a capacitive input device of Example 2.

Moreover, in the same manner as in Example 1, an image display device 2 of Example 2 was prepared.

<<Evaluation of Front Panel 2 and Image Display Device 2>>

In the front panel 2, in which the decorative layer, the mask layer, the first transparent electrode patterns, the insulating layer pattern, the second transparent electrode patterns, and the conductive element different from the first and second transparent electrode patterns had been formed by the respective steps described above, the opening portion and the back surface were not contaminated, and the front panel 2 was easily washed. Moreover, other members had no problem of contamination.

Furthermore, the mask layer was free of pinholes and exhibited excellent light shielding properties.

In addition, each of the first transparent electrode patterns, the second transparent electrode patterns, and the conductive element different from those patterns had no problem with conductivity. Moreover, the first transparent electrode patterns were insulated from the second transparent electrode patterns.

Moreover, the transparent protective layer had no defect such as air bubbles, and an image display device excellent in display characteristics was obtained.

Examples 3 to 10

Transfer films for forming a decorative layer of Examples 3 to 10 were prepared in the same manner as in Example 1, except that coating solutions for colored layer L3 to L10, which were obtained by replacing the silicone resin in the formula L1 for the coating solution for colored layer of Example 1 with a silicone resin KR300 (Example 3), a silicone resin KR282 (Example 4), a mixture consisting of a silicone resin KR300 and a silicone resin KR282 mixed with each other in the same amount in terms of solid content (Example 5), a silicone resin KR271 (Example 6), a silicone resin KR255 (Example 7), a silicone resin KR212 (Example 8), a silicone resin KR9706 (Example 9), and a silicone resin KR5230 (Example 10) without changing the solid content of the silicone resin added, that is, except that the type of binder was changed as shown in the following Table 1. Front panels in which a decorative layer had been formed were prepared in the same manner as in Example 1, except that the prepared transfer films for forming a decorative layer of Examples 3 to 10 were used respectively. The front panels were evaluated, and the results were written in the following Table 1. Thereafter, in the same manner as in Example 1, front panels 3 to 10 as capacitive input devices of Examples 3 to 10, in which the decorative layer, the mask layer, the first transparent electrode patterns, the insulating layer pattern, the second transparent electrode patterns, the conductive element different from the first and second transparent electrode patterns, and the transparent protective layer had been formed, and image display devices 3 to 10 including the capacitive input devices as a constituent were prepared.

The transferability, precutting suitability, brightness, whiteness, reticulation, yield, adhesiveness of the decorative layer, contamination of the opening portion, and missing of the opening portion of the front panels 3 to 10 were practical level.

Moreover, the mask layer was free of pinholes and exhibited excellent light shielding properties.

Furthermore, each of the first transparent electrode patterns, the second transparent electrode patterns, and the conductive element different from those patterns had no problem with conductivity. In addition, the first transparent electrode patterns were insulated from the second transparent electrode patterns.

Moreover, the transparent protective layer had no defect such as air bubbles, and image display devices excellent in display characteristics were obtained.

Examples 11 to 13

Transfer films for forming a decorative layer of Examples 11 to 13 were prepared in the same manner as in Example 5, except that in Example 5, instead of the titanium oxide (CR97 manufactured by ISHIHARA SANGYO KAISHA, LTD.; rutile-type treated with alumina/zirconia, primary particle size: 0.25 µm) used in the white pigment dispersion 1 used for the coating solution for colored layer, CR60 (manufactured by ISHIHARA SANGYO KAISHA, LTD., rutile-type treated with alumina, primary particle size: 0.21 µm, Example 11), CR50 (manufactured by ISHIHARA SANGYO KAISHA, LTD., rutile-type treated with alumina, primary particle size: 0.25 µm, Example 12), and CR58 (manufactured by ISHIHARA SANGYO KAISHA, LTD., rutile-type treated with alumina, primary particle size: 0.28 µm, Example 13) were used respectively. Moreover, front panels in which a decorative layer had been formed were prepared in the same manner as in Example 5, except that the prepared transfer films for forming a decorative layer of Examples 11 to 13 were used respectively. The front panels were evaluated, and the results were written in the following Table 1. Thereafter, in the same manner as in Example 5, front panels 11 to 13 as capacitive input devices of Examples 11 to 13, in which the decorative layer, the mask layer, the first transparent electrode patterns, the insulating layer pattern, the second transparent electrode patterns, the conductive element different from the first and second transparent electrode patterns, and the transparent protective layer had been formed, and image display devices 11 to 13 including the capacitive input devices as a constituent were prepared.

In the front panels 11 to 13, the opening portion and the back surface had no problem of contamination, and the front panels were easily washed. Furthermore, other members had no problem of contamination.

Moreover, the mask layer was free of pinholes and exhibited excellent light shielding properties.

In addition, each of the first transparent electrode patterns, the second transparent electrode patterns, and the conductive element different from those patterns had no problem with conductivity. Furthermore, the first transparent electrode patterns were insulated from the second transparent electrode patterns.

Moreover, the transparent protective layer had no defect such as air bubbles, and image display devices excellent in display characteristics were obtained.

Examples 14 to 19

Transfer films for forming a decorative layer of Examples 14 to 19 were prepared in the same manner as in Example 5, except that in Example 5, the content of titanium oxide with respect to the total solid content (parts by mass) in the coating solution for colored layer was changed from 44 parts by mass to 20 parts by mass (Example 14), 26 parts by mass (Example 15), 32 parts by mass (Example 16), 36 parts by mass (Example 17), 60 parts by mass (Example 18), and 75 parts by mass (Example 19) respectively. Front panels in which a decorative layer had been formed were prepared in the same manner as in Example 5, except that the prepared transfer films for forming a decorative layer of Examples 14 to 19 were used respectively. The front panels were evaluated, and the results were written in the following Table 1. Thereafter, in the same manner as in Example 5, front panels 14 to 19 as capacitive input devices of Examples 14 to 19, in which the decorative layer, the mask layer, the first transparent electrode patterns, the insulating layer pattern, the second transparent electrode patterns, the conductive element different from the first and second transparent electrode patterns, and the transparent protective layer had been formed, and image display devices 14 to 19 including the capacitive input devices as a constituent were prepared.

As is evident from the results of the following Table 1, within the range of 20 parts by mass to 75 parts by mass, all of the front panels were evaluated to be practical level. To be more specific, as the titanium oxide content increased from 20 parts by mass to 75 parts by mass, the transferability, precutting suitability, yield, adhesiveness of the decorative layer, missing of the opening portion tended to slightly deteriorate, but these were practical level. Moreover, the whiteness, reticulation, and contamination of the opening portion tended to improve. The brightness was the best within a range of 38 parts by mass to 60 parts by mass.

Furthermore, the mask layer was free of pinholes and exhibited excellent light shielding properties.

In addition, each of the first transparent electrode patterns, the second transparent electrode patterns, and the conductive element different from those patterns had no problem with conductivity. Moreover, the first transparent electrode patterns were insulated from the second transparent electrode patterns.

Furthermore, the transparent protective layer had no defect such as air bubbles, and image display devices excellent in display characteristics were obtained.

Examples 20 to 22

Transfer films for forming a decorative layer of Examples 20 to 22 were prepared in the same manner as in Example 5, except that in the formula L5 for the coating solution for colored layer of Example 5, Sumilizer GP as a phosphoric acid/hindered phenol-based antioxidant was replaced with IRGAFOS168 (manufactured by BASF Japan Ltd., Example 20) as a phosphoric acid-based antioxidant, IRGAFOS38 (manufactured by BASF Japan Ltd., Example 21) as a phosphoric acid-based antioxidant, and IRGAMOD295 (manufactured by BASF Japan Ltd., Example 22) as a phosphoric acid/hindered phenol-based antioxidant respectively. Furthermore, front panels in which a decorative layer had been formed was prepared in the same manner as in Example 5, except that the prepared transfer films for forming a decorative layer of Examples 20 to 22 were used respectively. The front panels were evaluated, and the results were written in the following Table 2. Thereafter, in the same manner as in Example 5, front panels 20 to 22 as capacitive input devices of Examples 20 to 22, in which the decorative layer, the mask layer, the first transparent electrode patterns, the insulating layer pattern, the second transparent electrode patterns, the conductive element different from the first and second transparent electrode patterns, and the transparent protective layer had been formed, and image display devices 20 to 22 including the capacitive input devices as a constituent were prepared.

The whiteness was slightly improved in the front panels 20 and 21 than in the front panel 5. Except for this, the front panel 20 and 21 were practical level similarly to the front panel 5.

There was no difference in the evaluation results between the front panel 22 and the front panel 5, and both the front panels were practical level.

Example 23

By using the formula L5 for the coating solution for colored layer of Example 5 and changing the thickness of the formed decorative layer from 35 μm to 17.5 μm, a transfer film for forming a decorative layer of Example 23 was prepared.

In the same manner as in Example 5, on the glass substrate having undergone silane coupling treatment, the obtained transfer film for forming a decorative layer (transfer film of Example 25), from which the protective film had been removed, was laminated by using a laminator. Thereafter, the temporary support made of polyethylene terephthalate was peeled from the interface between the temporary support and the thermoplastic resin layer, thereby removing the temporary support. Subsequently, in the same manner as in Example 5, a decorative layer was formed, and a front panel in which the decorative layer had been formed was prepared. The front panel was evaluated, and the results were written in the following Table 2. Then in the same manner as in Example 5, a front panel 23 as a capacitive input device of Example 23, in which the decorative layer, the mask layer, the first transparent electrode patterns, the insulating layer pattern, the second transparent electrode patterns, the conductive element different from the first and second transparent electrode patterns, and the transparent protective layer had been formed, and an image display device 23 including the capacitive input device as a constituent were prepared.

The brightness of the front panel 23 was slightly lower than that of the front panel 5, but it was practical level. Moreover, the reticulation and missing of the opening portion were improved in the front panel 23. In addition, the evaluation results of the yield, adhesiveness of the decorative layer, contamination of the opening portion, and whiteness of the front panels 23 were practical level similarly to the front panel 5.

In the front panel 23, the opening portion and the back surface had no problem of contamination. Furthermore, the front panel 23 was easily washed, and other members had no problem of contamination.

In addition, the mask layer was free of pinholes and exhibited excellent light shielding properties.

Moreover, each of the first transparent electrode patterns, the second transparent electrode patterns, and the conductive element different from those patterns had no problem with conductivity. Furthermore, the first transparent electrode patterns were insulated from the second transparent electrode patterns.

In addition, the transparent protective layer had no defect such as air bubbles, and an image display device excellent in display characteristics was obtained.

Example 24

By using the formula L5 for the coating solution for white decorative layer in Example 5 and changing the thickness of the formed decorative layer from 35 μm to 17.5 μm, a transfer film for forming a decorative layer 24 was prepared. The transfer film was taken as a transfer film for forming a decorative layer of Example 24.

In the same manner as in Example 1, on the glass substrate having undergone silane coupling treatment, the obtained transfer film for forming a decorative layer 24', from which the protective film had been removed, was laminated by using a laminator. Thereafter, the temporary support made of polyethylene terephthalate was peeled from the interface between the temporary support and the thermoplastic resin layer, thereby removing the temporary support.

Next, the resultant was shower-developed by using a triethanolamine-based developer (containing 30% by mass of triethanolamine, solution obtained by diluting T-PD2 (manufactured by FUJIFILM Corporation) with pure water by 10-fold) for 60 seconds at 30° C. under a flat nozzle pressure of 0.1 MPa, thereby removing the thermoplastic resin layer and the intermediate layer. Subsequently, after air was blown to the top surface of the glass substrate so as to drain off liquid, pure water was sprayed for 10 seconds to the glass substrate by shower so as to wash the substrate, and air was blown thereto so as to reduce the liquid pool on the substrate. Thereafter, a silane coupling solution (a 0.3% by mass aqueous N-(3(aminoethyl)γ-aminopropyltrimethoxysilane solution, trade name: KBM603, manufactured by Shin-Etsu Chemical Co., Ltd.) was sprayed to the glass substrate for 20 seconds by shower, and the substrate was washed by being showered with pure water. The substrate was then dried for 5 minutes at 100° C.

Subsequently, from the transfer film for forming a decorative layer 24 having the decorative layer with a thickness of 17.5 μm as the second layer, the protective film was removed. The transfer film was then laminated on the front panel, in which the decorative layer as the first layer had been formed, by a laminator in the same manner as used for the first layer. Thereafter, the temporary support made of polyethylene terephthalate was removed. Next, in the same manner as in Example 5, two decorative layers having a thickness of 17.5 μm were formed, thereby preparing a front panel in which decorative layers had been formed. The front panel was evaluated, and the results were written in the following Table 2. Subsequently, in the same manner as in Example 5, a front panel 24 as a capacitive input device of Example 24, in which the decorative layer, the mask layer, the first transparent electrode patterns, the insulating layer pattern, the second transparent electrode patterns, the conductive element different from the first and second transparent electrode patterns, and the transparent protective layer were formed, and an image display device 24 including the capacitive input device as a constituent were prepared.

The degree of missing of the opening portion was slightly higher in the front panel 24 than in the front panel 5, but it was a practical level. In addition, the evaluation results of the reticulation, whiteness, yield, adhesiveness of the decorative layer, and the like of the front panel 24 were practical level similarly to the front panel 5.

In the front panel 24, the opening portion and the back surface thereof had no problem of contamination, and the front panel 24 was easily washed. Moreover, other members thereof had no problem of contamination.

Furthermore, the mask layer was free of pinholes and exhibited excellent light shielding properties.

Moreover, each of the first transparent electrode patterns, the second transparent electrode patterns, and the conductive element different from those patterns had no problem with conductivity, and the first transparent electrode patterns were insulated from the second transparent electrode patterns.

In addition, the transparent protective film had no defect such as air bubbles, and an image display device excellent in display characteristics was obtained.

Example 25

By using the formula L5 for the coating solution for colored layer of Example 5 and changing the thickness of the formed decorative layer from 35 μm to 6 μm, a transfer film for forming a decorative layer of Example 25 was prepared. Moreover, a front panel 25' in which a decorative layer had been formed was prepared in the same manner as in Example 5, except that the prepared transfer film for forming a decorative layer of Example 25 was used. Thereafter, on the front panel 25', a white ink for screen printing S1 prepared according to the following formula was screen-printed by using a screen printer (manufactured by MISHIMA CO., LTD.; UDF-5L, mesh size: 250 μm), and the resultant was dried for 10 minutes at 100° C. for creating a tack-free state. The dry thickness of the ink was 6 μm. The screen printing was performed again in the same manner as above, and the resultant was dried for 10 minutes at 100° C. The step of printing and drying was repeated 4 times in total. By drying the resultant for 30 minutes at 150° C., a front panel in which a decorative layer had been formed was prepared. The front panel was evaluated, and the results were written in the following Table 2. Next, in the same manner as in Example 5, a front panel 25 as a capacitive input device of Example 25, in which the decorative layer, the mask layer, the first transparent electrode patterns, the insulating layer pattern, the second transparent electrode patterns, the conductive element different from the first and second transparent electrode patterns, and the transparent protective layer had been formed, and an image display device 25 including the capacitive input device as a constituent were prepared.

| (White ink for screen printing: formula S1) | |
|---|---|
| Random copolymer consisting of benzyl methacrylate and methacrylic acid at a molar ratio of 78/22, weight average molecular weight of 30,000, propylene glycol monomethyl ether acetate solution (solid content: 40.5% by mass): | 33.1 parts by mass |
| White pigment dispersion 1: | 157 parts by mass |
| Surfactant (trade name: Megaface F-780F, manufactured by DIC Corporation): | 1.0 part by mass |

The brightness, adhesiveness of the decorative layer, yield, and contamination of the opening portion were slightly poorer in the front panel 25 than in the front panel 5, but it was a practical level. Other evaluation results of the front panel 25 were practical level similarly to the front panel 5.

In the front panel 25, the opening portion and the back surface thereof had no problem of contamination, and the front panel 25 was easily washed. Moreover, other members thereof had no problem of contamination.

Furthermore, the mask layer was free of pinholes and exhibited excellent light shielding properties.

Moreover, each of the first transparent electrode patterns, the second transparent electrode patterns, and the conductive element different from those patterns had no problem with conductivity, and the first transparent electrode patterns were insulated from the second transparent electrode patterns.

In addition, the transparent protective film had no defect such as air bubbles, and an image display device excellent in display characteristics was obtained.

Example 26

By using the formula L5 for the coating solution for colored layer of Example 25 and changing the thickness of the formed decorative layer from 6 μm to 2 μm, a transfer film for forming a decorative layer of Example 26 was prepared. Moreover, a front panel 26' in which a decorative layer had been formed was prepared in the same manner as in Example 5, except that the prepared transfer film for forming a decorative layer of Example 26 was used. Thereafter, on the front panel 26', the ink for screen printing S1 was screen-printed by using a screen printer (manufactured by MISHIMA CO., LTD.; UDF-5L, mesh size: 250 μm), and the resultant was dried for 10 minutes at 100° C. for creating a tack-free state. The dry thickness of the ink was 2 μm. The screen printing was performed again in the same manner as above, and the resultant was dried for 10 minutes at 100° C. The step of printing and drying was repeated 5 times in total. By drying the resultant for 30 minutes at 150° C., a front panel in which a decorative layer had been formed was prepared. The front panel was evaluated, and the results were written in the following Table 2. Next, in the same manner as in Example 1, a front panel 26 as a capacitive input device of Example 26, in which the decorative layer, the mask layer, the first transparent electrode patterns, the insulating layer pattern, the second transparent electrode patterns, the conductive element different from the first and second transparent electrode patterns, and the transparent protective layer had been formed, and an image display device 26 including the capacitive input device as a constituent were prepared.

The brightness, reticulation, unevenness, yield, adhesiveness of the decorative layer, missing of the opening portion, and contamination of the opening portion were poorer in the front panel 26 than in the front panel 1, but it was practical level. The development residue was improved in the front panel 26. In addition, the evaluation result of the whiteness of the front panel 26 was practical level similarly to the front panel 1.

In the front panel 26, the opening portion and the back surface had no problem of contamination, and the front panel 26 was easily washed. Furthermore, other members had no problem of contamination.

Example 27

By using the formula L5 for the coating solution for colored layer of Example 5 and changing the thickness of the formed decorative layer from 35 μm to 42 μm, a transfer film for forming a decorative layer of Example 27 was prepared.

In the same manner as in Example 5, on the glass substrate having undergone silane coupling treatment, the obtained transfer film for forming a decorative layer (transfer film of Example 27), from which the protective film had been removed, was laminated by using a laminator. Subsequently, the temporary support made of polyethylene terephthalate was peeled from the interface between the temporary support and the thermoplastic resin layer, thereby removing the temporary support. Thereafter, in the same manner as in Example 5, the decorative layer was formed, thereby preparing a front panel in which the decorative layer was formed. The front panel was evaluated, and the results were written in the following Table 2. Next, in the same manner as in Example 5, a front panel 27 as a capacitive input device of Example 27, in which the decorative layer, the mask layer, the first transparent electrode patterns, the insulating layer pattern, the second transparent electrode patterns, the conductive element different from the first and second transparent electrode patterns, and the transparent protective layer had been formed, and an image display device 27 including the capacitive input device as a constituent were prepared.

The whiteness, adhesiveness of the decorative layer, contamination of the opening portion, missing of the opening portion, and precutting suitability were poorer in the front panel 27 than in the front panel 5, but it was a practical level. In addition, the evaluation results of the brightness, yield, and reticulation of the front panel 27 were practical level similarly to the front panel 5.

In the front panel 27, the opening portion and the back surface had no problem of contamination, and the front panel 27 was easily washed. Furthermore, other members had no problem of contamination.

Moreover, the mask layer was free of pinholes and exhibited excellent light shielding properties.

In addition, each of the first transparent electrode patterns, the second transparent electrode patterns, and the conductive element different from those patterns had no problem with conductivity, and the first transparent electrode patterns were insulated from the second transparent electrode patterns.

Moreover, the transparent protective layer had no defect such as air bubbles, and an image display device excellent in display characteristics was obtained.

Example 28

A transfer film for forming a decorative layer of Example 28 was prepared in the same manner as in Example 20, except that a coating solution for colored layer L28, which was obtained by replacing the silicone resin in the formula for the coating solution for colored layer of Example 20 with a mixture (Example 28) consisting of a silicone resin KR300 and a silicone resin KR311 at a ratio of 1/1 in terms of solid content without changing the total solid content of the silicone resin added, that is, except that the silicone resin was changed to the binder shown in the following Table 3. Moreover, a front panel in which the decorative layer had been formed was prepared in the same manner as in Example 20, except that the prepared transfer film for forming a decorative layer of Example 28 was used. The front panel was evaluated, and the results were written in the following Table 3. Thereafter, in the same manner as in Example 20, a front panel 28 as a capacitive input device of Example 28, in which the decorative layer, the mask layer, the first transparent electrode patterns, the insulating layer pattern, the second transparent electrode patterns, the conductive element different from the first and second transparent electrode patterns, and the transparent protective film had been formed, and an image display device 28 including the capacitive input device as a constituent were prepared.

The whiteness, adhesiveness of the decorative layer, contamination of the opening portion, missing of the opening portion, and precutting suitability were poorer in the front panel 28 than in the front panel 20, but it was a practical level. In addition, the evaluation results of the brightness, yield, and reticulation of the front panel 28 were practical level similarly to the front panel 20.

In the front panel 28, the opening portion and the back surface had no problem of contamination, and the front panel 28 was easily washed. Furthermore, other members had no problem of contamination.

Moreover, the mask layer was free of pinholes and exhibited excellent light shielding properties.

In addition, each of the first transparent electrode patterns, the second transparent electrode patterns, and the conductive element different from those patterns had no problem with conductivity, and the first transparent electrode patterns were insulated from the second transparent electrode patterns.

Moreover, the transparent protective layer had no defect such as air bubbles, and an image display device excellent in display characteristics was obtained.

Example 29

A transfer film for forming a decorative layer of Example 29 was prepared in the same manner as in Example 28, except that a coating solution for colored layer L29, to which the silicone resin in the formula for the coating solution for colored layer of Example 28 was added in an amount of 4% by mass in terms of the total solid content together with a zinc-based condensation catalyst D-15 (manufactured by Shin-Etsu Chemical Co., Ltd.), was used. Moreover, a front panel in which a decorative layer had been formed was prepared in the same manner as in Example 28, except that the prepared transfer film for forming a decorative layer of Example 29 was used. The front panel was evaluated, and the results were written in the following Table 3. Thereafter, in the same manner as in Example 29, a front panel 29 as a capacitive input device of Example 29, in which the decorative layer, the mask layer, the first transparent electrode patterns, the insulating layer pattern, the second transparent electrode patterns, the conductive element different from the first and second transparent electrode patterns, and the transparent protective layer had been formed, and an image display device 29 including the capacitive input device as a constituent were prepared.

The whiteness, adhesiveness of the decorative layer, contamination of the opening portion, missing of the opening portion, and precutting suitability were poorer in the front panel 29 than in the front panel 28, but it was a practical level. In addition, the evaluation results of the brightness, yield, and reticulation of the front panel 29 were practical level similarly to the front panel 28.

Moreover, the mask layer was free of pinholes and exhibited excellent light shielding properties.

In addition, each of the first transparent electrode patterns, the second transparent electrode patterns, and the conductive element different from those patterns had no problem with conductivity, and the first transparent electrode patterns were insulated from the second transparent electrode patterns.

Furthermore, the transparent protective layer had no defect such as air bubbles, and an image display device excellent in display characteristics was obtained.

Examples 30 and 31

Transfer films for forming a decorative layer of Examples 30 and 31 were prepared in the same manner as in Example 29, except that in the formula for the coating solution for colored layer of Example 29, the solid content ratio between the silicone resin KR300 and the silicone resin KR311 was changed from 1/1 (Example 29) to 3/7 (Example 30) and 7/3 (Example 31) respectively, without changing the total solid content of the silicone resin added. Front panels in which a decorative layer had been formed were prepared in the same manner as in Example 29, except for the prepared transfer films for forming a decorative layer of Examples 30 and 31 were used respectively. The front panels were evaluated, and the results were written in the following Table 3. Thereafter, in the same manner as in Example 29, front panels 30 and 31 as capacitive input devices of Examples 30 and 31, in which the decorative layer, the mask layer, the first transparent electrode patterns, the insulating layer pattern, the second transparent electrode patterns, the conductive element different from the first and second transparent electrode patterns, and the transparent protective layer had been formed, and image display devices 30 and 31 including the capacitive input devices as a constituent were prepared.

In the front panels 30, and 31, the transferability, precutting suitability, brightness, whiteness, reticulation, yield, adhesiveness of the decorative layer, contamination of the opening portion, and missing of the opening portion were practical level.

Moreover, the mask layer was free of pinholes and exhibited excellent light shielding properties.

In addition, each of the first transparent electrode patterns, the second transparent electrode patterns, and the conductive element different from those patterns had no problem with conductivity, and the first transparent electrode patterns were insulated from the second transparent electrode patterns.

Furthermore, the transparent protective layer had no defect such as air bubbles, and image display devices excellent in display characteristics were obtained.

Examples 32 to 36

Transfer films for forming a decorative layer of Examples 32 to 36 were prepared in the same manner as in Example 29, except that the silicone resin in the formula for the coating solution for colored layer of Example 29 was replaced with a silicone resin KR400 (Example 32), a silicone resin KR500 (Example 33), a mixture consisting of the silicone resin KR400 and the silicone resin 500 at a solid content ratio of 3/7 (Example 34), a mixture consisting of the silicone resin KR400 and the silicone resin KR500 at a solid content ratio of 7/3 (Example 35), and a mixture consisting of the silicone resin KR400, the silicone resin KR500, and a silicone alkoxy oligomer X-40-9225 at a solid content ratio of 70/30/2.5 (Example 36), without changing the total solid content of the silicone rein added. Front panels in which a decorative layer had been formed were prepared in the same manner as in Example 29, except that the prepared transfer films for forming a decorative layer of Examples 32 to 36 were used respectively. The front panels were evaluated, and the results were written in the following Table 3 Thereafter, in the same manner as in Example 29, front panels 32 to 36 as capacitive input devices of Examples 32 to 36, in which the decorative layer, the mask layer, the first transparent electrode patterns, the insulating layer pattern, the second transparent electrode patterns, the conductive element different from the first and second transparent electrode patterns, and the transparent protective layer had been formed, and image display devices 32 to 36 including the capacitive input devices as a constituent were prepared.

The transferability, precutting suitability, brightness, whiteness, reticulation, yield, adhesiveness of the decorative layer, contamination of the opening portion, and missing of the opening portion of front panels 32 to 36 were practical level.

Moreover, the mask layer was free of pinholes and exhibited excellent light shielding properties.

In addition, each of the first transparent electrode patterns, the second transparent electrode patterns, and the conductive element different from those patterns had no problem with conductivity, and the first transparent electrode patterns were insulated from the second transparent electrode patterns.

Furthermore, the transparent protective layer had no defect such as air bubbles, and image display devices excellent in display characteristics were obtained.

Examples 37 to 42

Transfer films for forming a decorative layer of Examples 37 to 42 were prepared in the same manner as in Example 29, except that the silicone resin in the formula for the coating solution for colored layer of Example 29 was replaced with a toluene solution of Synthesis example 1 (Example 37; methyl/tolyl-type silicone resin), a toluene solution of the condensate of Synthesis example 2 (Example 38; methyl/banzyl-type silicone resin), a toluene solution of the condensate of Synthesis example 3 (Example 39; methyl/cumyl-type silicone resin), a toluene solution of the condensate of Synthesis example 4 (Example 40; ethyl/tolyl-type silicone resin), a toluene solution of the condensate of Synthesis example 5 (Example 41; propyl/tolyl-type silicone resin), and a toluene solution of the condensate of Synthesis example 6 (Example 42; methyl/hydrogen-type silicone resin), without changing the total solid content of the silicone resin added. Front panels in which a decorative layer had been formed were prepared in the same manner as in Example 29, except that the prepared transfer films for forming a decorative layer of Examples 37 to 42 were used. The front panels were evaluated, and the results were written in the following Table 3. Thereafter, in the same manner as in Example 29, front panels 37 to 42 as capacitive input devices of Examples 37 to 42, in which the decorative layer, the mask layer, the first transparent electrode patterns, the insulating layer pattern, the second transparent electrode patterns, the conductive element different from the first and second transparent electrode patterns, and the transparent protective layer had been formed, and image display devices 37 to 42 including the capacitive input devices as a constituent were prepared.

The transferability, precutting suitability, brightness, whiteness, reticulation, yield, adhesiveness of the decorative layer, contamination of the opening portion, and missing of the opening portion of front panels 37 to 42 were practical level.

Moreover, the mask layer was free of pinholes and exhibited excellent light shielding properties.

In addition, each of the first transparent electrode patterns, the second transparent electrode patterns, and the conductive element different from those patterns had no problem with conductivity, and the first transparent electrode patterns were insulated from the second transparent electrode patterns.

Furthermore, the transparent protective layer had no defect such as air bubbles, and image display devices excellent in display characteristics were obtained.

Examples 43 and 44

Transfer films for forming a decorative layer of Examples 43 and 44 were prepared in the same manner as in Example 1, except that coating solutions for colored layer L43 and L44, which were obtained by replacing the silicone resin in the formula for the coating solution for colored layer of Example 1 with a silicone resin KR251 (Example 43) and a mixture (Example 44) consisting of the silicone resin KR251 and X-40-9246 mixed with each other at a solid content ratio of 9/1 respectively, were used, without changing the total solid content of the silicone resin added, that is, except that the type of binder was changed as shown in the following Table 3. Front panels in which a decorative layer had been formed were prepared in the same manner as in Example 1, except that the prepared transfer films for forming a decorative layer of Examples 43 and 44 was used. The front panels were evaluated, and the results were written in the following Table 3. Thereafter, in the same manner as in Example 1, front panels 43 and 44 as capacitive input devices of Examples 43 and 44, in which the decorative layer, the mask layer, the first transparent electrode patterns, the insulating layer pattern, the second transparent electrode patterns, the conductive element different from the first and second transparent electrode patterns, and the transparent protective layer had been formed, and image display devices 43 and 44 including the capacitive input devices as a constituent were prepared.

In the front panels 43 and 44, the brightness was greatly improved compared to the front panel 1, and the transferability, precutting suitability, whiteness, reticulation, yield, adhesiveness of the decorative layer, contamination of the opening portion, and missing of the opening portion were practical level.

Moreover, the mask layer was free of pinholes and exhibited excellent light shielding properties.

In addition, each of the first transparent electrode patterns, the second transparent electrode patterns, and the conductive element different from those patterns had no problem with conductivity, and the first transparent electrode patterns were insulated from the second transparent electrode patterns.

Furthermore, the transparent protective layer had no defect such as air bubbles, and image display devices excellent in display characteristics were obtained.

Example 45

From the protective film 25 side of the transfer film for forming a decorative layer L44 (transfer film of Example 44) obtained in Example 44, cuttings, which penetrated the protective film 25, the colored layer 24, the intermediate layer 23, the thermoplastic resin layer 22, and the temporary support 21, were made as shown in FIGS. 13 and 14, and the glass substrate was divided into the image portion 32 to which the colored layer was to be transferred and the non-image portion 31 to which the colored layer was not to be transferred. Thereafter, by using a tape, only the protective film 25 in an area corresponding to the image portion 32 was peeled. Thereafter, in the same manner as in Example 44, a front panel in which a decorative layer had been formed was prepared. The front panel was evaluated, and the results are written in the following Table 3. Subsequently, in the same manner as in Example 44, a front panel 45 as a capacitive input device of Example 45, in which the decorative layer, the mask layer, the first transparent electrode patterns, the insulating layer pattern, the second transparent electrode patterns, the conductive element different from the first and second transparent electrode patterns, and the transparent conductive layer had been formed, and an image display device 45 including the capacitive input device as a constituent were prepared.

The transferability, precutting suitability, brightness, whiteness, reticulation, yield, adhesiveness of the decorative layer, contamination of the opening portion, and missing of the opening portion of the front panel 45 were practical level.

Moreover, the mask layer was free of pinholes and exhibited excellent light shielding properties.

In addition, each of the first transparent electrode patterns, the second transparent electrode patterns, and the conductive element different from those patterns had no problem with conductivity, and the first transparent electrode patterns were insulated from the second transparent electrode patterns.

Furthermore, the transparent protective layer had no defect such as air bubbles, and an image display device excellent in display characteristics was obtained.

Comparative Example 1

A piece of toughened glass (300 mm×400 mm×0.7 mm) in which an opening portion (15 mmϕ) had been formed was washed by a UV washing device. Thereafter, the glass was washed with a washer by using a brush and then further washed with ultrapure water by means of ultrasonic cleaning. The substrate was subjected to thermal treatment for 3 minutes at 120° C. so as to stabilize the surface state. The substrate was cooled to 23° C., and then coated with the coating solution for white decorative layer L5 obtained in Example 5 by a glass substrate coater (manufactured by FAS Japan, trade name: MH-1600) having a slit-like nozzle. The coating solution for white decorative layer L5 flowed into the opening portion of the toughened glass, hence the opening portion and the back surface of the substrate were contaminated. Subsequently, a portion of the solvent was dried for 30 seconds by VCD (vacuum drying device, manufactured by TOKYO OHKA KOGYO CO., LTD.) so as to remove fluidity of the coating layer, and then the surplus coating solution around the substrate was removed by EBR (edge bead remover). Then the substrate was prebaked for 3 minutes at 120° C., thereby obtaining a white decorative layer L51 having a film thickness of 5.0 μm on the toughened glass (liquid resist process).

In a state where the substrate and an exposure mask (quartz exposure mask having frame patterns) were standing vertically, the distance between the surface of the exposure mask and the white decorative layer L51 was set to 200 μm, and the substrate was patternwise exposed at an exposure dose of 1,000 mJ/cm$^2$ from the white decorative layer L51 side by using a proximity-type exposure machine (manufactured by Hitachi High-Technologies Corporation) including a super-high pressure mercury lamp.

Next, pure water was sprayed to the substrate from a shower nozzle so as to evenly dampen the surface of the white decorative layer L51. Thereafter, the time (hereinafter, referred to as a "brakepoint") taken for an unexposed portion to be able to be completely developed was calculated, and the substrate was developed by using a sodium carbonate/sodium hydrogen carbonate-based developer (solution obtained by diluting T-CD1 (trade name, manufactured by FUJIFILM Corporation) with pure water by 5-fold) for a development time 1.5 times the calculated time, at 35° C. under a shower pressure set to 0.1 MPa. The substrate was then washed with pure water.

Subsequently, ultrapure water was sprayed to the substrate from a super-high pressure washing nozzle at a pressure of 8 MPa so as to remove residues, and then post-exposure was performed from the front and back of the substrate respectively at an exposure dose of 1,300 mJ/cm$^2$ under atmospheric pressure. Furthermore, under a condition of a pressure of 15 mmHg or less, the substrate was subjected to post-baking treatment for 30 minutes at 240° C. in a vacuum oven, thereby obtaining a front panel in which a decorative layer was formed. In the same manner as in Example 5, a front panel in which a decorative layer had been formed was prepared and evaluated, and the results were written in the following Table 2. Thereafter, in the same manner as in Example 5, a front panel 51 as a capacitive input device of Comparative Example 1, in which the decorative layer, the mask layer, the first transparent electrode patterns, the insulating layer pattern, the second transparent electrode patterns, the conductive element different from the first and second transparent electrode patterns, and the transparent protective layer had been formed, and an image display device 51 including the capacitive input device as a constituent were prepared.

In the front panel 51, the opening portion and back surface were contaminated unlike the front panel 5, hence the front panel 51 had to be washed. Moreover, the yield thereof greatly decreased, and the brightness thereof was also insufficient.

Furthermore, the mask layer was free of pinholes and exhibited excellent light shielding properties.

In addition, each of the first transparent electrode patterns, the second transparent electrode patterns, and the conductive element different from those patterns had no problem with conductivity. Moreover, the first transparent electrode patterns were insulated from the second transparent electrode patterns.

Moreover, the transparent protective layer had no defect such as air bubbles, and an image display device excellent in display characteristics was obtained.

Comparative Example 2

In Comparative Example 1, coating of the coating solution for colored layer L5 obtained in Example 5 was repeated 7 times, thereby obtaining a white decorative layer L52 in which 7 layers each of which had a film thickness of 5.0 μm had been formed on the toughened glass (liquid resist process). In the same manner as in Example 5, a front panel in which a decorative layer had been formed was prepared and evaluated, and the results were written in the following Table 2. Thereafter, in the same manner as in Comparative Example 1, a front panel 52 as a capacitive input device of Comparative Example 2, in which the decorative layer, the mask layer, the first transparent electrode patterns, the insulating layer pattern, the second transparent electrode patterns, the conductive element different from the first and second transparent electrode patterns, and the transparent protective layer had been formed, and an image display device 52 including the capacitive input device as a constituent were prepared.

In the front panel 52, the opening portion and back surface were contaminated unlike the front panel 5, hence the front panel 52 had to be washed. Moreover, the yield thereof greatly decreased, and the brightness thereof was also insufficient. Unevenness in this front panel was more serious than in the front panel 52, and the yield was reduced. However, it was practical level.

Furthermore, the mask layer was free of pinholes and exhibited excellent light shielding properties.

In addition, each of the first transparent electrode patterns, the second transparent electrode patterns, and the conductive element different from those patterns had no problem with conductivity. Moreover, the first transparent electrode patterns were insulated from the second transparent electrode patterns.

Moreover, the transparent protective layer had no defect such as air bubbles, and an image display device excellent in display characteristics was obtained.

Comparative Example 3

A piece of toughened glass (300 mm×400 mm×0.7 mm), in which an opening portion (15 mmφ) had been formed, was washed with a rotary brush having nylon bristles in a state where a liquid glass washer regulated to 25° C. was being sprayed to the glass for 20 seconds by shower, and then the glass was washed with pure water by shower. Thereafter, a silane coupling solution (an aqueous 0.3% by mass N-(3 (aminoethyl)γ-aminopropyltrimethoxyxilane) solution, trade name: KBM603, manufactured by Shin-Etsu Chemical Co., Ltd) was sprayed to the substrate for 20 seconds by shower, and then the substrate was washed with pure water by shower. After being heated for 10 minutes at 110° C. in a preheating device for substrate, the substrate was left cool to room temperature. On the obtained glass substrate having undergone silane coupling treatment, the white ink for screen printing S1 was screen-printed by a screen printer (manufactured by MISHIMA CO., LTD.; UDF-5L, mesh size: 250 μm), and the resultant was dried for 10 minutes at 100° C. for creating a tack-free state. The thickness of the ink was 6 μm. Furthermore, as final baking, the substrate was dried for 30 minutes at 150° C., thereby obtaining a white decorative layer L53. Herein, the primary particle size of the used fine titanium oxide particles was 0.20 μm.

Subsequently, in the same manner as in Example 5, a front panel in which a decorative layer had been formed was prepared and evaluated, and the results were written in the following Table 2. Thereafter, in the same manner as in Comparative Example 1, a front panel 53 as a capacitive input device of Comparative Example 3, in which the decorative layer, the mask layer, the first transparent electrode patterns, the insulating layer pattern, the second transparent electrode patterns, the conductive element different from the first and second transparent electrode patterns, and the transparent protective layer had been formed, and an image display device 53 including the capacitive input device as a constituent were prepared.

The brightness and missing of the opening portion were poorer in the front panel 53 than in the front panel 1, and the yield of the front panel 53 decreased.

Furthermore, the mask layer was free of pinholes and exhibited excellent light shielding properties.

In addition, each of the first transparent electrode patterns, the second transparent electrode patterns, and the conductive element different from those patterns had no problem with conductivity. Moreover, the first transparent electrode patterns were insulated from the second transparent electrode patterns.

Moreover, the transparent protective layer had no defect such as air bubbles, and an image display device excellent in display characteristics was obtained.

Comparative Example 4

In Comparative Example 3, screen printing and prebaking were repeated 6 times, and then final baking was performed, thereby obtaining a white decorative layer L54 in which six layers each of which had a film thickness of 6.0 μm had been formed on the toughened glass. In the same manner as in Example 5, a front panel in which a decorative layer had been formed was prepared and evaluated, and the results were written in the following Table 2. Thereafter, in the same manner as in Comparative Example 1, a front panel 54 as a capacitive input device of Comparative Example 4, in which the decorative layer, the mask layer, the first transparent electrode patterns, the insulating layer pattern, the second transparent electrode patterns, the conductive element different from the first and second transparent electrode patterns, and the transparent protective layer had been formed, and an image display device 54 including the capacitive input device as a constituent were prepared.

The brightness, reticulation, unevenness, adhesiveness of the decorative layer, missing of the opening portion, and contamination of the opening portion were poorer in the front panel 54 than in the front panel 5, and the yield of the front panel 54 decreased.

Furthermore, the mask layer was free of pinholes and exhibited excellent light shielding properties.

The opening portion and the back surface were not contaminated, and the front panel 54 was easily washed. Moreover, other members had no problem of contamination.

Besides, the mask layer was free of pinholes and exhibited excellent light shielding properties.

In addition, each of the first transparent electrode patterns, the second transparent electrode patterns, and the conductive element different from those patterns had no problem with conductivity. Moreover, the first transparent electrode patterns were insulated from the second transparent electrode patterns.

Moreover, the transparent protective layer had no defect such as air bubbles, and an image display device excellent in display characteristics was obtained.

Comparative Example 5

In the formula L1 for the coating solution for colored layer of Example 1, instead of the silicone resin KR-311, the following polyamic acid was used in the same solid content, thereby obtaining a formula L55 for a coating solution for colored layer.

(Polymerization of Polyamic Acid as Polyimide Precursor)

210 parts by mass of 4,4'-methylenebis(cyclohexylamine) was put into a reaction vessel and dissolved in 2,860 parts by mass of N-methyl-2-pyrrolidone. Thereafter, 218 parts by mass of pyromellitic dianhydride powder was slowly added thereto while being stirred in a nitrogen stream, and the resultant was allowed to react for 8 hours at 35° C., thereby obtaining a transparent and viscous polyamic acid solution.

By using the formula L55 for coating solution for colored layer, a transfer film L55 for forming a decorative layer was prepared in the same manner as in Example 1. The transfer film L55 was taken as a transfer film of Comparative Example 5. Due to poor precutting suitability, the transfer film required repair of the decorative layer and washing of the blade after baking. Moreover, a front panel 55, in which a decorative layer had been formed on the toughened glass, was formed in the same manner as in Example 1, except that the transfer film for forming a decorative layer L55 was used. After being baked, the front panel 55 was heated to 350° C. for about 20 seconds and then subjected to thermal treatment for 7 minutes at 350° C., thereby completing imidization of polyamic acid.

Subsequently, in the same manner as in Example 1, a front panel 55 as a capacitive input device of Comparative Example 5, in which the decorative layer, the mask layer, the first transparent electrode patterns, the insulating layer pattern, the second transparent electrode patterns, the conductive element different from the first and second transparent electrode patterns, and the transparent protective layer had been formed, and an image display device 55 including the capacitive input device as a constituent were prepared and evaluated. The results were written in the following Table 2.

The precutting suitability, whiteness, adhesiveness of the decorative layer, missing of the opening portion, and yield were greatly poorer in the front panel 55 than in the front panel 5, and it was an NG level. The front panel 55 had no problem of contamination of the opening portion and the back surface and was easily washed. Moreover, other members had no problems of contamination.

Furthermore, in the front panel 55, the mask layer was free of pinholes and exhibited excellent light shielding properties.

Moreover, each of the first transparent electrode patterns, the second transparent electrode patterns, and the conductive element different from those patterns had no problem with conductivity, and the first transparent electrode patterns were insulated from the second transparent electrode patterns.

In addition, the transparent protective layer had no defect such as air bubbles, and an image display device excellent in display characteristics was obtained.

TABLE 1

| | Transfer film for forming decorative layer | | | | | | | | | Front panel in which decorative layer has been formed | | |
|---|---|---|---|---|---|---|---|---|---|---|---|---|
| | Composition of decorative layer | | | | | | | | | Whole decorative layer | | White inorganic pigment in whole layer/total solid content [% by mass] |
| | White inorganic pigment | | | | | | | | | | | |
| | Type | Surface treatment | Primary particle size | White inorganic pigment/total solid content [% by mass] | Type of binder | Catalyst | Antioxidant | Thickness of colored layer | Evaluation Transferability | Preparation method | Film thickness of whole layer | |
| Example 1 | ISHIHARA CR97 | Al/Zr treatment | 0.25μ | 44 | Silicone resin KR311 | — | Sumilizer GP | 35μ | A | Transfer | 35μ | 44 |
| Example 2 | | | | | Using photosensitive film of Example 1 | | | | A | Transfer | 35μ | 44 |
| Example 3 | ISHIHARA CR97 | Al/Zr treatment | 0.25μ | 44 | Silicone resin KR300 | — | Sumilizer GP | 35μ | B | Transfer | 35μ | 44 |
| Example 4 | ISHIHARA CR97 | Al/Zr treatment | 0.25μ | 44 | Silicone resin KR282 | — | Sumilizer GP | 35μ | A | Transfer | 35μ | 44 |
| Example 5 | ISHIHARA CR97 | Al/Zr treatment | 0.25μ | 44 | Silicone resin KR300/ KR282 = 1/1 | — | Sumilizer GP | 35μ | A | Transfer | 35μ | 44 |
| Example 6 | ISHIHARA CR97 | Al/Zr treatment | 0.25μ | 44 | Silicone resin KR271 | — | Sumilizer GP | 35μ | C | Transfer | 35μ | 44 |
| Example 7 | ISHIHARA CR97 | Al/Zr treatment | 0.25μ | 44 | Silicone resin KR255 | — | Sumilizer GP | 35μ | D | Transfer | 35μ | 44 |
| Example 8 | ISHIHARA CR97 | Al/Zr treatment | 0.25μ | 44 | Silicone resin KR212 | — | Sumilizer GP | 35μ | C | Transfer | 35μ | 44 |
| Example 9 | ISHIHARA CR97 | Al/Zr treatment | 0.25μ | 44 | Silicone resin KR9706 | — | Sumilizer GP | 35μ | A | Transfer | 35μ | 44 |
| Example 10 | ISHIHARA CR97 | Al/Zr treatment | 0.25μ | 44 | Silicone resin KR5230 | — | Sumilizer GP | 35μ | B | Transfer | 35μ | 44 |
| Example 11 | ISHIHARA CR60 | Al/Zr treatment | 0.25μ | 44 | Silicone resin KR300/ KR282 = 1/1 | — | Sumilizer GP | 35μ | A | Transfer | 35μ | 44 |
| Example 12 | ISHIHARA CR50 | Al/Zr treatment | 0.25μ | 44 | Silicone resin KR300/ KR282 = 1/1 | — | Sumilizer GP | 35μ | A | Transfer | 35μ | 44 |
| Example 13 | ISHIHARA CR58 | Al/Zr treatment | 0.28μ | 44 | Silicone resin KR300/ KR282 = 1/1 | — | Sumilizer GP | 35μ | A | Transfer | 35μ | 44 |
| Example 14 | ISHIHARA CR97 | Al/Zr treatment | 0.25μ | 20 | Silicone resin KR300/ KR282 = 1/1 | — | Sumilizer GP | 35μ | A | Transfer | 35μ | 20 |
| Example 15 | ISHIHARA CR97 | Al/Zr treatment | 0.25μ | 26 | Silicone resin KR300/ KR282 = 1/1 | — | Sumilizer GP | 35μ | A | Transfer | 35μ | 26 |
| Example 16 | ISHIHARA CR97 | Al/Zr treatment | 0.25μ | 32 | Silicone resin KR300/ KR282 = 1/1 | — | Sumilizer GP | 35μ | A | Transfer | 35μ | 32 |

TABLE 1-continued

| | | | | | | | | | | | |
|---|---|---|---|---|---|---|---|---|---|---|---|
| Example 17 | ISHIHARA CR97 | Al/Zr treatment | 0.25μ | 38 | Silicone resin KR300/KR282 = 1/1 | — | Sumilizer GP | 35μ | A | Transfer | 38 |
| Example 18 | ISHIHARA CR97 | Al/Zr treatment | 0.25μ | 60 | Silicone resin KR300/KR282 = 1/1 | — | Sumilizer GP | 35μ | B | Transfer | 60 |
| Example 19 | ISHIHARA CR97 | Al/Zr treatment | 0.25μ | 75 | Silicone resin KR300/KR282 = 1/1 | — | Sumilizer GP | 35μ | C | Transfer | 75 |

Front panel in which decorative layer has been formed

Evaluation

| | Brightness | Whiteness | Reticulation | Yield | Adhesiveness of decorative layer | Half-cutting suitability | Die-cutting suitability | Contamination of opening portion | Missing of opening portion | process Amount of benzene generated |
|---|---|---|---|---|---|---|---|---|---|---|
| Example 1 | B | B | C | B | B | B | — | B | A | B (19.1 mg) |
| Example 2 | B | B | C | B | B | B | — | B | A | B |
| Example 3 | A | A | A | C | C | C | — | A | C | B |
| Example 4 | A | B | B | A | A | A | — | A | A | B |
| Example 5 | A | B | B | B | B | B | — | A | B | B |
| Example 6 | B | B | C | C | B | C | — | C | A | B |
| Example 7 | B | B | C | B | B | B | — | A | B | C |
| Example 8 | B | C | A | B | A | C | — | C | A | B |
| Example 9 | B | C | B | C | B | A | — | A | B | AA |
| Example 10 | C | C | A | B | B | B | — | B | B | AA |
| Example 11 | A | B | B | B | B | B | — | A | B | B |
| Example 12 | A | B | B | B | B | B | — | A | B | B |
| Example 13 | A | C | C | B | A | A | — | A | A | C |
| Example 14 | C | C | C | B | A | A | — | C | A | C |
| Example 15 | B | B | B | B | B | A | — | C | B | C |
| Example 16 | B | B | B | B | B | B | — | B | B | C |
| Example 17 | A | A | A | B | B | B | — | A | B | B |
| Example 18 | A | A | A | C | B | B | — | A | B | B |
| Example 19 | B | A | A | C | C | C | — | A | C | B |

TABLE 2

| | Transfer film for forming decorative layer | | | | | | | | Front panel in which decorative layer has been formed | | |
|---|---|---|---|---|---|---|---|---|---|---|---|
| | Composition of colored layer | | | | | | | | | Whole decorative layer | White inorganic pigment in whole layer/total solid content [% by mass] |
| | White inorganic pigment | | | | | | | | | | |
| | Type | Surface treatment | Primary particle size | White inorganic pigment/total solid content [% by mass] | Type of binder | Catalyst | Antioxidant | Thickness of colored layer | Evaluation Transferability | Preparation method | Film thickness of whole layer | |
| Example 20 | ISHIHARA CR97 | Al/Zr treatment | 0.25μ | 44 | Silicone resin KR300/KR282—1/1 | — | IRGAF OS168 | 35μ | A | Transfer | 35μ | 44 |
| Example 21 | ISHIHARA CR97 | Al/Zr treatment | 0.25μ | 44 | Silicone resin KR300/KR282 = 1/1 | — | IRGAF OS38 | 35μ | A | Transfer | 35μ | 44 |
| Example 22 | ISHIHARA CR97 | Al/Zr treatment | 0.25μ | 44 | Silicone resin KR300/KR282 = 1/1 | — | IRGA OD295 | 35μ | A | Transfer | 35μ | 44 |
| Example 23 | ISHIHARA CR97 | Al/Zr treatment | 0.25μ | 44 | Silicone resin KR300/KR282 = 1/1 | — | Sumilizer GP | 17.5μ | A | Transfer | 17.5μ | 44 |
| Example 24 | ISHIHARA CR97 | Al/Zr treatment | 0.25μ | 44 | Silicone resin KR300/KR282 = 1/1 | — | Sumilizer GP | 17.5μ | A | Transfer, twice | 17.5μ × 2 layers | 44 |
| Example 25 | ISHIHARA CR97 | Al/Zr treatment | 0.25μ | 44 | Silicone resin KR300/KR282 = 1/1 | — | Sumilizer GP | 6μ | A | Transfer + screen printing | Transfer 6μ – printing 6μ × 4 layers | 44 |
| Example 26 | ISHIHARA CR97 | Al/Zr treatment | 0.25μ | 44 | Silicone resin KR300/KR282 = 1/1 | — | Sumilizer GP | 2μ | A | Transfer + screen printing | Transfer 2μ – printing 6μ × 5 layers | 44 |
| Comparative Example 1 | | | | N/A | | | | | — | Slit coating | 5μ | 44 |
| Comparative Example 2 | | | | N/A | | | | | — | Slit coating | 5μ × 7 layers | 44 |
| Comparative Example 3 | | | | N/A | | | | | — | Screen printing | 6μ | 44 |
| Comparative Example 4 | | | | N/A | | | | | — | Screen printing | 6μ – 6 layers | 44 |
| Example 27 | ISHIHARA CR97 | Al/Zr treatment | 0.25μ | 44 | Silicone resin KR300/KR282—1/1 | — | Sumilizer GP | 42μ | C | Transfer | 42μ | 44 |
| Comparative Example 5 | ISHIHARA CR97 | Al/Zr treatment | 0.25μ | 44 | Polyimide | — | Sumilizer GP | 35μ | A | transfer | 35μ | 44 |

TABLE 2-continued

| | Front panel in which decorative layer has been formed | | | | | | | | Process |
|---|---|---|---|---|---|---|---|---|---|
| | | | | evaluation | | | | | |
| | Brightness | whiteness | Reticulation | yield | Adhesiveness of decorative layer | Precutting suitability | Die-cutting suitability | Contamination of opening portion | Missing of opening portion | Amount of benzene generated |
| Example 20 | A | A | B | B | B | B | — | A | B | B |
| Example 21 | A | A | B | B | B | B | — | A | B | B |
| Example 22 | A | B | B | B | B | B | — | A | B | B |
| Example 23 | C | B | A | B | B | B | — | A | A | A |
| Example 24 | A | B | B | B | B | B | — | A | C | B |
| Example 25 | B | B | B | C | C | B | — | C | B | A |
| Example 26 | B | B | C | C | C | B | — | C | C | A |
| Comparative Example 1 | E | B | B | D | B | — | — | E | A | B |
| Comparative Example 2 | C | C | D | E | C | — | — | E | A | B |
| Comparative Example 3 | E | A | D | C | B | — | — | B | C | B |
| Comparative Example 4 | B | B | D | D | C | D | — | D | D | B |
| Comparative Example 5 | A | C | B | B | C | D | — | B | C | B |
| Comparative Example 5 | D | D | B | E | D | D | — | A | D | B |

TABLE 3

| | Transfer film for forming decorative layer | | | | | | | | | Front panel in which decorative layer has been formed | |
|---|---|---|---|---|---|---|---|---|---|---|---|
| | Composition of colored layer | | | | | | | | | Whole decorative layer | |
| | White inorganic pigment | | | White inorganic pigment/total solid content [% by mass] | Type of binder | Catalyst | antioxidant | Thickness of colored layer | Evaluation Transferability | Preparation method | Film thickness of whole layer | White inorganic pigment in whole layer/total solid content [% by mass] |
| | Type | Surface treatment | Primary particle size | | | | | | | | | |
| Example 28 | ISHIHARA CR97 | Al/Zr treatment | 0.25μ | 44 | Silicone resin KR300/KR311 = 1/1 | — | IRGAF OS168 | 35μ | A | Transfer | 35μ | 44 |
| Example 29 | ISHIHARA CR97 | Al/Zr treatment | 0.25μ | 44 | Silicone resin KR300/KR311 = 1/1 | D-15 | IRGAF OS168 | 35μ | A | Transfer | 35μ | 44 |
| Example 30 | ISHIHARA CR97 | Al/Zr treatment | 0.25μ | 44 | Silicone resin KR300/KR311 = 3/7 | D-15 | IRGAF OS168 | 35μ | A | Transfer | 35μ | 44 |
| Example 31 | ISHIHARA CR97 | Al/Zr treatment | 0.25μ | 44 | Silicone resin KR300/KR311 = 7/3 | D-15 | IRGAF OS168 | 35μ | B | Transfer | 35μ | 44 |
| Example 32 | ISHIHARA CR97 | Al/Zr treatment | 0.25μ | 44 | Silicone resin KR400 | D-15 | IRGAF OS168 | 35μ | A | Transfer | 35μ | 44 |
| Example 33 | ISHIHARA CR97 | Al/Zr treatment | 0.25μ | 44 | Silicone resin KR500 | D-15 | IRGAF OS168 | 35μ | A | Transfer | 35μ | 44 |
| Example 34 | ISHIHARA CR97 | Al/Zr treatment | 0.25μ | 44 | Silicone resin KR400/KR500 = 1/1 | D-15 | IRGAF OS168 | 35μ | A | Transfer | 35μ | 44 |
| Example 35 | ISHIHARA CR97 | Al/Zr treatment | 0.25μ | 44 | Silicone resin KR400/KR500 = 7/3 | D-15 | IRGAF OS168 | 35μ | A | Transfer | 35μ | 44 |
| Example 36 | ISHIHARA CR97 | Al/Zr treatment | 0.25μ | 44 | Silicone resin KR400/KR500/X-40-9225 = 70/30/2.5 | D-15 | IRGAF OS168 | 35μ | A | Transfer | 35μ | 44 |
| Example 37 | ISHIHARA CR97 | Al/Zr treatment | 0.25μ | 44 | Synthesis example 1 | D-15 | IRGAF OS168 | 35μ | A | Transfer | 35μ | 44 |
| Example 38 | ISHIHARA CR97 | Al/Zr treatment | 0.25μ | 44 | Synthesis example 2 | D-15 | IRGAF OS168 | 35μ | A | Transfer | 35μ | 44 |
| Example 39 | ISHIHARA CR97 | Al/Zr treatment | 0.25μ | 44 | Synthesis example 3 | D-15 | IRGAF OS168 | 35μ | A | Transfer | 35μ | 44 |
| Example 40 | ISHIHARA CR97 | Al/Zr treatment | 0.25μ | 44 | Synthesis example 4 | D-15 | IRGAF OS168 | 35μ | B | Transfer | 35μ | 44 |
| Example 41 | ISHIHARA CR97 | Al/Zr treatment | 0.25μ | 44 | Synthesis example 5 | D-15 | IRGAF OS168 | 35μ | B | Transfer | 35μ | 44 |
| Example 42 | ISHIHARA CR97 | Al/Zr treatment | 0.25μ | 44 | Synthesis example 6 | D-15 | IRGAF OS168 | 35μ | B | Transfer | 35μ | 44 |

TABLE 3-continued

| | | | | | | | | | |
|---|---|---|---|---|---|---|---|---|---|
| Example 43 | ISHIHARA CR97 | Al/Zr treatment | 0.25μ | 44 | Silicone resin KR251 | — | 35μ | Transfer | 44 |
| Example 44 | ISHIHARA CR97 | Al/Zr treatment | 0.25μ | 44 | Silicone resin KR251/ X40-9246 = 9/1 | — | 35μ | Transfer | 44 |
| Example 45 | ISHIHARA CR97 | Al/Zr treatment | 0.25μ | 44 | Silicone resin KR251/ X40-9246 = 9/1 | — | 35μ | Transfer | 44 |

Front panel in which decorative layer has been formed

| | Brightness | Whiteness | Reticulation | Yield | Adhesiveness of decorative layer | Precutting suitability | Die-cutting suitability | Contamination of opening portion | Missing of opening portion | Amount of benzene generated |
|---|---|---|---|---|---|---|---|---|---|---|
| Example 28 | A | A | B | B | C | B | — | A | B | B |
| Example 29 | A | A | B | B | B | B | — | A | B | B |
| Example 30 | B | B | C | B | B | B | — | B | A | B (18.4 mg) |
| Example 31 | A | A | A | C | C | C | — | A | C | B |
| Example 32 | AA | A | C | B | B | A | — | B | A | AA (only a trace of benzene) |
| Example 33 | AA | A | B | B | C | B | — | A | B | AA (only a trace of benzene) |
| Example 34 | AA | A | B | B | B | B | — | B | B | AA (only a trace of benzene) |
| Example 35 | AA | A | B | B | B | A | — | A | D | AA (only a trace of benzene) |
| Example 36 | AA | A | C | B | B | A | — | A | B | AA (only a trace of benzene) |
| Example 37 | A | A | A | B | B | B | — | B | B | AA |
| Example 38 | A | B | B | B | A | A | — | B | A | A |
| Example 39 | B | B | B | B | B | B | — | B | B | A |
| Example 40 | B | B | B | B | B | B | — | B | A | AA |
| Example 41 | B | B | C | B | A | B | — | B | A | AA |
| Example 42 | AA | A | B | B | C | B | — | C | A | AA |

TABLE 3-continued

| | | | | | | | |
|---|---|---|---|---|---|---|---|
| Example 43 | AA | A | A | B | B | C | — | A | C | AA (only a trace of benzene) |
| Example 44 | AA | A | B | B | B | B | — | B | B | AA (only a trace of benzene) |
| Example 45 | AA | A | B | B | B | — | B | B | B | AA |

From the Tables 1 to 3, it was understood that if the transfer film of the present invention is used, a white decorative layer, which is excellent in brightness, whiteness, reticulation, and adhesiveness after transfer, can be obtained with a high yield.

Moreover, as described above, according to the manufacturing method of a capacitive input device of the present invention that uses the transfer film of the present invention, a high-quality capacitive input device having an advantage of being able to be made into a thin-layer/lightweight capacitive input device could be manufactured by simple steps. It was understood that for this reason, a capacitive input device manufactured by the manufacturing method of the present invention and an image display device using the capacitive input device are high-quality.

Furthermore, it was understood that according to a more preferable embodiment of the manufacturing method of a capacitive input device of the present invention, even if a substrate having an opening portion is used, the leakage of resist or contamination of the back of the substrate occurs to a small extent.

What is claimed is:

1. A manufacturing method of a capacitive input device which includes a front panel and at least the following elements (1) and (3) to (5) at one side of the front panel,
the method comprising a step of forming at least the (1) decorative layer by transferring a colored layer of a transfer film to the one side of the front panel,
where the transfer film comprises:
a temporary support; and
the colored layer,
wherein the colored layer contains at least (A) a white inorganic pigment and (B) a silicone-based resin
(1) a decorative layer,
(3) a plurality of first transparent electrode patterns composed of a plurality of pad portions being so connected to one another through connection portions as to extend in a first direction,
(4) a plurality of second electrode patterns electrically insulated from the first transparent electrode patterns and composed of a plurality of pad portions being so connected to one another as to extend in a direction crossing the first direction, and
(5) an insulating layer that electrically insulates the first transparent electrode patterns from the second electrode patterns.

2. The method of claim 1,
wherein the colored layer of the transfer film further contains (C) an antioxidant.

3. The method of claim 1,
wherein the silicone-based resin of the transfer film includes either a modified silicone resin or a straight silicone resin, and
the straight silicone resin contains at least a siloxane structure represented by the following Formula (1) in a molecule, Formula (1)

[Chem. 1]

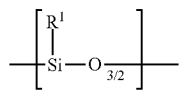

wherein $R^1$ independently represents a hydrogen atom, a halogen atom, a linear, branched, or cyclic alkoxy group having 1 to 20 carbon atoms, a linear, branched, or cyclic alkyl group having 1 to 20 carbon atoms, a linear, branched, or cyclic substituted alkyl group having 1 to 20 carbon atoms, a linear, branched, or cyclic alkenyl group having 2 to 20 carbon atoms, an aryl group having 6 to 20 carbon atoms, or an aralkyl group having 7 to 20 carbon atoms.

4. The method of claim 3,
wherein in the Formula (1), $R^1$ independently represents a hydrogen atom, a linear, branched, or cyclic alkyl group having 1 to 20 carbon atoms, a linear, branched, or cyclic substituted alkyl group having 1 to 6 carbon atoms, or an aryl group having 6 to 9 carbon atoms.

5. The method of claim 3,
wherein in the Formula (1), $R^1$ independently represents a hydrogen atom, a methyl group, or a tolyl group.

6. The method of claim 1,
wherein the thickness of the colored layer of the transfer film is 1 μm to 40 μm.

7. The method of claim 1,
wherein a content of the white inorganic pigment with respect to the total solid content of the colored layer of the transfer film is 20% by mass to 75% by mass.

8. The method of claim 1,
wherein the white inorganic pigment is a rutile-type titanium oxide of which the surface has been treated with an inorganic substance.

9. The method of claim 8,
wherein the rutile-type titanium oxide is a rutile-type titanium oxide of which the surface has been treated with at least either alumina or zirconia.

10. The method of claim 1, further comprising a thermoplastic resin layer between the temporary support and the colored layer.

11. The manufacturing method of a capacitive input device according to claim 1,
wherein the capacitive input device further includes (6) a conductive element which is electrically connected to at least either the first transparent electrode patterns or the second electrode patterns and is different from the first transparent electrode patterns and the second electrode patterns.

12. The manufacturing method of a capacitive input device according to claim 1,
wherein the second electrode patterns are transparent electrode patterns.

13. The manufacturing method of a capacitive input device according to claim 1,
wherein the (1) decorative layer is formed by heating the colored layer of the transfer film at 180° C. to 300° C. in an environment of 0.08 atm to 1.2 atm.

14. The manufacturing method of a capacitive input device according to claim 13,
wherein the colored layer is heated in an air environment.

15. The manufacturing method of a capacitive input device according to claim 1, further comprising:
making cuts, which penetrate the colored layer but do not penetrate the temporary support, in a portion of the transfer film;
removing the colored layer in at least a portion of the area surrounded by the cuts; and
forming the (1) decorative layer by using the transfer film from which the colored layer in a portion of the area has been removed.

16. The manufacturing method of a capacitive input device according to claim 1,
wherein (2) a mask layer is further disposed on the surface of the (1) decorative layer opposite to the front panel side.

17. The manufacturing method of a capacitive input device according to claim 16,
    wherein at least either the first transparent electrode patterns or the second electrode patterns are disposed over the areas of both the one side surface of the front panel and the surface of the mask layer opposite to the front panel side.

18. The manufacturing method of a capacitive input device according to claim 16,
    wherein the capacitive input device further includes (6) a conductive element which is electrically connected to at least either the first transparent electrode patterns or the second electrode patterns and is different from the first transparent electrode patterns and the second electrode patterns, and
    the (6) conductive element is disposed on at least the surface of the mask layer opposite to the front panel side.

19. The manufacturing method of a capacitive input device according to claim 1,
    wherein a transparent protective layer is further disposed so as to cover all or a portion of the elements (1) and (3) to (5).

20. The manufacturing method of a capacitive input device according to claim 19,
    wherein the transparent protective layer is formed by using a transfer film having a temporary support and a curable resin layer in this order.

21. The manufacturing method of a capacitive input device according to claim 1,
    wherein the capacitive input device further includes (6) a conductive element which is electrically connected to at least either the first transparent electrode patterns or the second electrode patterns and is different from the first transparent electrode patterns and the second electrode patterns,
    the second electrode patterns are transparent electrode patterns, and
    at least one of the (3) first transparent electrode patterns, the (4) second electrode patterns, and the (6) conductive element is formed by performing etching treatment on a transparent conductive material by using an etching pattern formed by using the transfer film having a temporary support and a curable resin layer in this order.

22. The manufacturing method of a capacitive input device according to claim 1,
    wherein the capacitive input device further includes (6) a conductive element which is electrically connected to at least either the first transparent electrode patterns or the second electrode patterns and is different from the first transparent electrode patterns and the second electrode patterns,
    the second electrode patterns are transparent electrode patterns, and
    at least one of the (3) first transparent electrode patterns, the (4) second electrode patterns, and the (6) conductive element is formed by transferring a conductive curable resin layer of a transfer film having a temporary support and the conductive curable resin layer in this order.

23. The manufacturing method of a capacitive input device according to claim 1,
    wherein the one side surface of the front panel is subjected to surface treatment, and the transfer film is disposed on the one side surface of the front panel having undergone the surface treatment.

24. The manufacturing method of a capacitive input device according to claim 23,
    wherein a silane compound is used for the surface treatment of the front panel.

25. The manufacturing method of a capacitive input device according to claim 1,
    wherein the front panel has an opening portion in at least a portion thereof.

26. A capacitive input device manufactured by the manufacturing method of a capacitive input device according to claim 1.

27. An image display device comprising the capacitive input device according to claim 26 as a constituent.

* * * * *